(12) United States Patent
Shin et al.

(10) Patent No.: US 10,109,644 B2
(45) Date of Patent: Oct. 23, 2018

(54) MEMORY DEVICE

(71) Applicants: Yoo Cheol Shin, Hwaseong-si (KR); Tae Hun Kim, Gwacheon-si (KR)

(72) Inventors: Yoo Cheol Shin, Hwaseong-si (KR); Tae Hun Kim, Gwacheon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 15/385,152

(22) Filed: Dec. 20, 2016

(65) Prior Publication Data

US 2017/0352680 A1   Dec. 7, 2017

(30) Foreign Application Priority Data

Jun. 2, 2016   (KR) .................. 10-2016-0068821

(51) Int. Cl.
| | |
|---|---|
| *H01L 27/11582* | (2017.01) |
| *H01L 23/535* | (2006.01) |
| *H01L 29/36* | (2006.01) |
| *H01L 29/423* | (2006.01) |
| *H01L 27/11565* | (2017.01) |
| *H01L 27/1157* | (2017.01) |
| *H01L 27/11573* | (2017.01) |
| *H01L 27/11575* | (2017.01) |

(52) U.S. Cl.
CPC ...... *H01L 27/11582* (2013.01); *H01L 23/535* (2013.01); *H01L 27/1157* (2013.01); *H01L 27/11565* (2013.01); *H01L 27/11573* (2013.01); *H01L 27/11575* (2013.01); *H01L 29/36* (2013.01); *H01L 29/4234* (2013.01)

(58) Field of Classification Search
CPC ... H01L 27/11582; H01L 23/535; H01L 29/36
See application file for complete search history.

(56) References Cited

U.S. PATENT DOCUMENTS

| | | | |
|---|---|---|---|
| 6,078,522 A | 6/2000 | Park et al. | |
| 7,310,280 B2 | 12/2007 | Park et al. | |
| 8,358,544 B2 | 1/2013 | Kang | |
| 8,488,378 B2 | 7/2013 | Maeda | |
| 9,000,508 B2 | 4/2015 | Lee et al. | |
| 9,064,598 B1 | 6/2015 | Hirai et al. | |
| 9,190,490 B2 | 11/2015 | Koval et al. | |

(Continued)

*Primary Examiner* — Walter H Swanson
(74) *Attorney, Agent, or Firm* — Harness, Dickey & Pierce, P.L.C.

(57) ABSTRACT

In one embodiment, the semiconductor device includes a substrate having an impurity region, and the substrate and the impurity region have a different impurity characteristic. The semiconductor device further includes a stack of alternating first interlayer insulating layers and gate electrode layers on the substrate; at least one second interlayer insulating layer formed on the stack; a plurality of bit lines formed on the second interlayer insulating layer; and a first plurality of channel structures formed through the stack on the substrate. The first plurality of channel structures are electrically connected to respective ones of the plurality of bit lines. A second plurality of channel structures are formed through the stack on the impurity region, and the second plurality of channel structures are electrically insulated from the plurality of bit lines.

20 Claims, 60 Drawing Sheets

(56) References Cited

U.S. PATENT DOCUMENTS

| | | | |
|---|---|---|---|
| 2009/0121271 A1* | 5/2009 | Son | H01L 21/8221 257/315 |
| 2010/0133599 A1* | 6/2010 | Chae | H01L 27/11578 257/315 |
| 2010/0155818 A1* | 6/2010 | Cho | H01L 27/11578 257/324 |
| 2014/0151774 A1 | 6/2014 | Rhie | |
| 2015/0187789 A1* | 7/2015 | Lee | H01L 27/11582 257/326 |
| 2015/0380097 A1 | 12/2015 | Sato et al. | |
| 2016/0005745 A1* | 1/2016 | Kim | H01L 27/115 438/591 |
| 2016/0027504 A1 | 1/2016 | Etemad et al. | |
| 2016/0043100 A1* | 2/2016 | Lee | H01L 27/11565 257/324 |
| 2016/0227509 A1 | 8/2016 | Krenz | |

* cited by examiner

IV-IV'

XVI – XVI'

XIII–XIII'

XVI-XVI'

XVI-XVI'

MEMORY DEVICE

CROSS-REFERENCE TO RELATED APPLICATION

This application claims benefit of priority to Korean Patent Application No. 10-2016-0068821 filed on Jun. 2, 2016 in the Korean Intellectual Property Office, the disclosure of which is incorporated herein by reference in its entirety.

BACKGROUND

1. Field

The inventive concepts relates to a memory device.

2. Description of Related Art

Recently, electronic products have been required to be reduced in volume while being able to process high-capacity data. Accordingly, it would be beneficial to increase a degree of integration of semiconductor memory devices used in electronic products. As a method of improving a degree of integration of such semiconductor memory devices, a vertical-type memory device has been proposed, instead of a planar transistor structure according to the related art.

SUMMARY

At least one embodiment relates to a semiconductor device.

In one embodiment, the semiconductor device includes a substrate having an impurity region, and the substrate and the impurity region have a different impurity characteristic. The semiconductor device further includes a stack of alternating first interlayer insulating layers and gate electrode layers on the substrate; at least one second interlayer insulating layer formed on the stack; a plurality of bit lines formed on the second interlayer insulating layer; and a first plurality of channel structures formed through the stack on the substrate. The first plurality of channel structures are electrically connected to respective ones of the plurality of bit lines. A second plurality of channel structures are formed through the stack on the impurity region, and the second plurality of channel structures are electrically insulated from the plurality of bit lines.

In another embodiment, the semiconductor device includes a substrate having an impurity region; a stack of alternating first interlayer insulating layers and gate electrode layers on the substrate; at least one second interlayer insulating layer formed on the stack; a plurality of bit lines formed on the second interlayer insulating layer; and a plurality of vertical channel structures penetrating through the stack and into the substrate. The plurality of vertical channel structures each includes an epitaxial layer in contact with the substrate, and the impurity region has a different impurity characteristic from the epitaxial layers.

At least one embodiment relates to a method of manufacturing a semiconductor device.

In one embodiment, the method includes forming a gate structure for a peripheral transistor on a peripheral region of a substrate; and simultaneously forming (i) an impurity region in a contact region of the substrate and (ii) source and drain regions of the peripheral transistor. The method further includes forming a stack of alternating first and second layers over a cell array region of the substrate and over the contact region of the substrate. Each of the second layers extends in a first direction less than a previous one of the second layers to define a landing portion of the previous one of the second layers, and the landing portions are over the contact region of the substrate. A plurality of vertical channel structures are formed penetrating through the stack and into the substrate.

In another embodiment, the method includes forming an impurity region in a substrate. The impurity region and the substrate have a different impurity characteristic. The method further includes forming a stack of alternating first and second layers on the substrate; and forming a plurality of vertical channel structures penetrating through the stack and into the substrate. A first number of the plurality of vertical channel structures are formed on the impurity region and a second number of the plurality of vertical channel structures are formed on a portion of the substrate other than the impurity region. The method still further includes forming an third layer over the substrate; forming contact structures electrically connected to only the second number of the vertical channel structures; and forming bit lines over the third layer and electrically connected to the contact structures.

BRIEF DESCRIPTION OF DRAWINGS

The above and other aspects, features and other advantages of the present inventive concept will be more clearly understood from the following detailed description taken in conjunction with the accompanying drawings, in which.

DETAILED DESCRIPTION

Some embodiments of the inventive concepts will now be described in detail with reference to the accompanying drawings.

Figure 1:
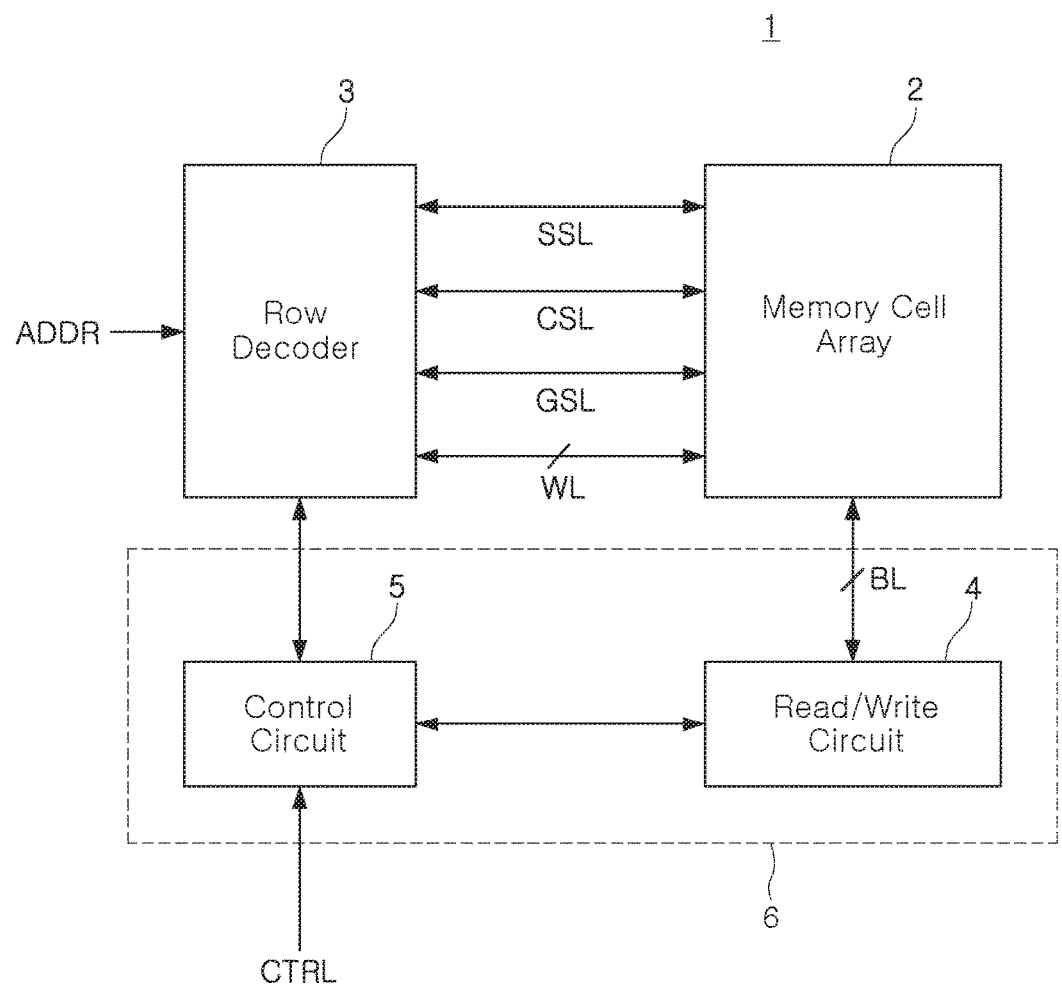
FIG. 1 is a schematic block diagram of a memory device according to an example embodiment of the inventive concepts.

With reference to FIG. 1, a semiconductor device 1 according to an example embodiment of the inventive concepts may include a memory cell array 2, a row decoder 3, and a core logic circuit 6. The core logic circuit 6 may include a read/write circuit 4, and a control circuit 5.

The memory cell array 2 may include a plurality of memory cells arranged in a plurality of rows and columns. The plurality of memory cells included in the memory cell array 2 may be connected to the row decoder 3 through word lines WL, a common source line CSL, a string select line SSL, a ground select line GSL, and the like, and may be connected to the read/write circuit 4 through a bit line BL. In an example embodiment, a plurality of memory cells arranged in a single row may be connected to a single word line WL, and a plurality of memory cells arranged in a single column may be connected to a single bit line BL.

The plurality of memory cells included in the memory cell array 2 may be divided into a plurality of memory blocks. Each memory block may include a plurality of word lines WL, a plurality of string select lines SSL, a plurality of ground select lines GSL, a plurality of bit lines BL, and at least one common source line CSL.

The row decoder 3 may receive address information ADDR provided from an external source, and may decode the received address information ADDR to determine a voltage to supply to at least a portion of the word lines WL, the common source line CSL, the string select line SSL, and the ground select line GSL connected to the memory cell array 2.

The read/write circuit 4 may select at least a portion of the bit lines BL connected to the memory cell array 2 according to a command received from the control circuit 5. The read/write circuit 4 may read data stored in a memory cell connected to the selected portion of the bit lines BL, or may write data to a memory cell connected to the selected portion of the bit lines BL. To this end, the read/write circuit 4 may include a circuit such as a page buffer, an input/output buffer, a data latch, and the like.

The control circuit 5 may respond to a control signal CTRL transmitted from an external source to control operations of the row decoder 3 and the read/write circuit 4. When data stored in the memory cell array 2 is read, the control circuit 5 may control operations of the row decoder 3 to supply a voltage for reading operations to a word line WL in which data to be read is stored. When the voltage for reading operations is supplied to a specific word line WL, the control circuit 5 may control the read/write circuit 4 to read data stored in a memory cell connected to the word line WL to which the voltage for reading operations is supplied.

Meanwhile, for example, when data is written to the memory cell array 2, the control circuit 5 may control operations of the row decoder 3 to supply a voltage for writing operations to a word line WL to which the data is to be written. When a voltage for writing operations is supplied to a specific word line WL, the control circuit 5 may control the read/write circuit 4 to write data to a memory cell connected to the word line WL to which the voltage for writing operations is supplied.

Figure 2:
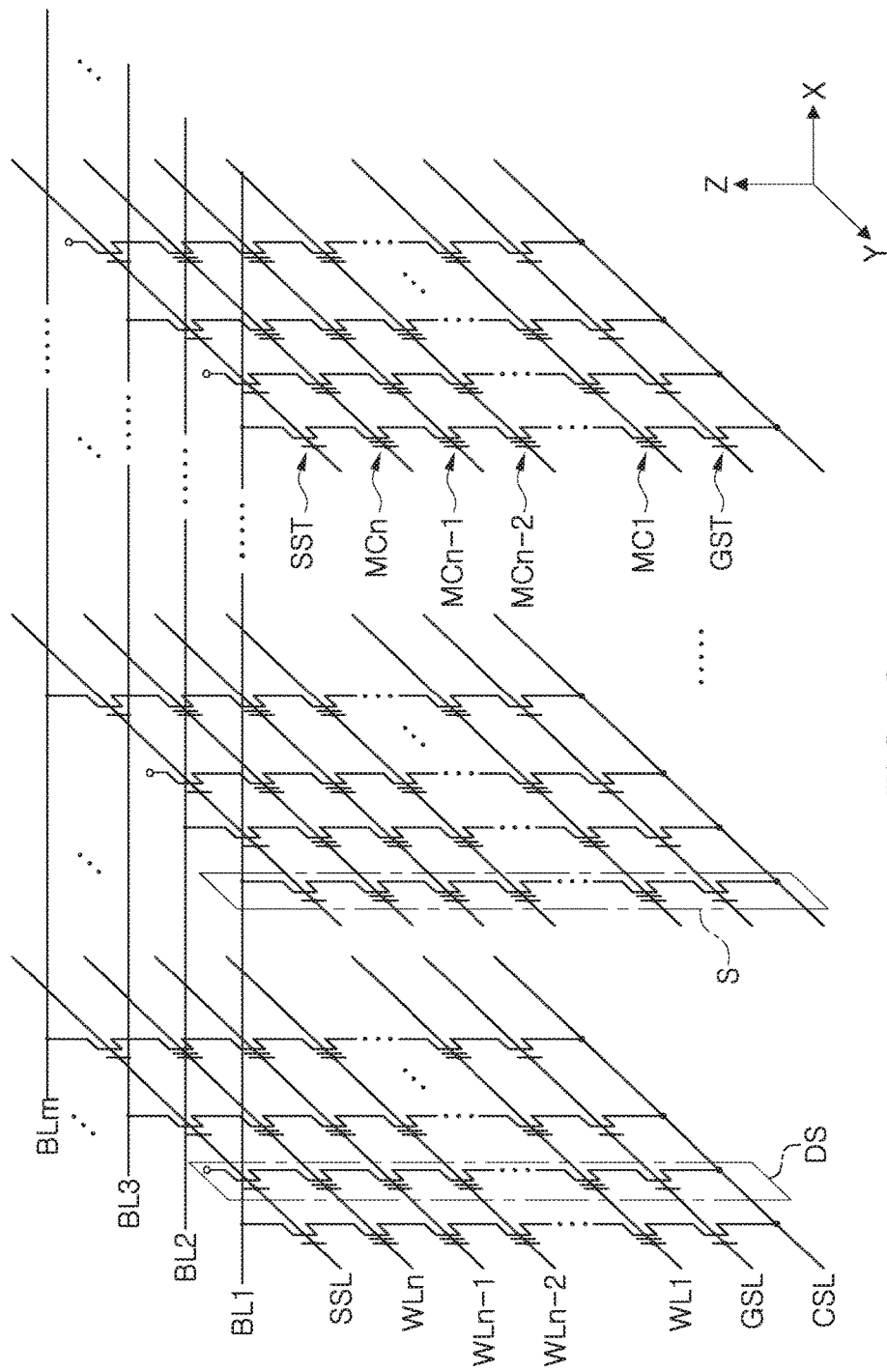
FIG. 2 is a circuit diagram illustrating a memory cell array of a memory device according to an example embodiment of the inventive concepts.

FIG. 2 is an equivalent circuit diagram illustrating a memory cell array of a memory device according to an example embodiment of the inventive concepts. A semiconductor device according to an example embodiment of the inventive concepts may be a vertical NAND (negative-AND) flash device.

With reference to FIG. 2, the memory cell array may include a plurality of memory cells strings S including N number of memory cells MC1 to MCn connected to each other in series, a ground selection transistor GST and a string selection transistor SST connected to respective ends of the memory cells MC1 to MCn in series. The N number of memory cells MC1 to MCn connected to each other in series may be connected to N number of word lines WL1 to WLn for selecting the memory cells MC1 to MCn, respectively. While not shown, a dummy cell may be further disposed between the ground selection transistor GST and a first memory cell MC1 and between the string selection transistor SST and an Nth memory cell MCn.

Gate terminals of the ground selection transistors GST may be connected to the ground select line GSL, and source terminals thereof may be connected to the common source line CSL. Gate terminals of the string selection transistors SST may be connected to the string select line SSL, and source terminals thereof may be connected to drain terminals of the memory cells MCn, respectively. Although FIG. 2 illustrates a structure in which one ground selection transistor GST and one string selection transistor SST are connected to the N number of memory cells MC1 to MCn, connected to each other in series, a plurality of ground selection transistors GST or a plurality of string selection transistors SST may be connected to the N number of memory cells MC1 to MCn.

Drain terminals of the string selection transistors SST may be connected to a plurality of bit lines BL1 to BLm. For example, when a signal is applied to the gate terminals of the string selection transistors SST through the string select line SSL, a signal applied through the bit lines BL1 to BLm is transmitted to the N number of memory cells MC1 to MCn connected to each other in series to execute data reading or writing operations. In addition, when a desired (or, alternatively a predetermined) erase voltage is applied through a well region formed on a substrate, erasing operations of erasing data written to the memory cells MC1 to MCn may be executed.

With reference to FIG. 2, the memory device according to an example embodiment of the inventive concepts may include at least one dummy string DS. The dummy string DS may be a string including a dummy channel electrically separated from the bit lines BL1 to BLm.

When writing operations of writing data to specific memory cells MC1 to MCn and erasing operations of erasing data therefrom are executed, a voltage supplied to the string select line SSL, the common source line CSL, the gate select line GSL, the word lines WL1 to WLn, and the bit lines BL1 to BLm is described in Table 1.

TABLE 1

|  | Writing operations | Erasing operations |
| --- | --- | --- |
| Selected WL | VPGM | 0 V |
| Unselected WL | VPASS |  |
| Selected SSL | VCC | FLOATING |
| Unselected SSL | GND |  |
| Selected BL | GND | FLOATING |
| Unselected BL | VCC |  |
| GSL | GND | FLOATING |
| CSL | VCC | FLOATING |
| Substrate (PPW) | GND | VERA |

As described in Table 1, to write data to desired memory cells MC1 to MCn, a ground voltage GND is applied to a portion of bit lines BL1 to BLm connected to the desired memory cells MC1 to MCn, and a power supply voltage VCC may be supplied to a remainder of the bit lines BL1 to BLm not connected to the desired memory cells MC1 to MCn. Thus, writing operations may not be performed in a dummy string DS because the dummy string DS is not connected to any of the bit lines BL1 to BLm.

On the other hand, erasing operations of erasing data written in the memory cells MC1 to MCn are executed as a memory block unit, and may be performed using a method of removing an electric charge accumulated in the memory cells MC1 to MCn by applying an erase voltage VERA to a well region of the substrate. The dummy string DS may be connected to a well region of the substrate through the ground selection transistor GST in a manner similar to the memory cell string S. Thus, while the memory device is operated, only erasing operations are repeatedly performed in the dummy string DS, and holes may be accumulated in the memory cells MC1 to MCn included in the dummy string DS, thereby causing overall characteristics degradation of a memory device. In an example embodiment, a memory device of solving the problem described above is proposed.

Figure 3:
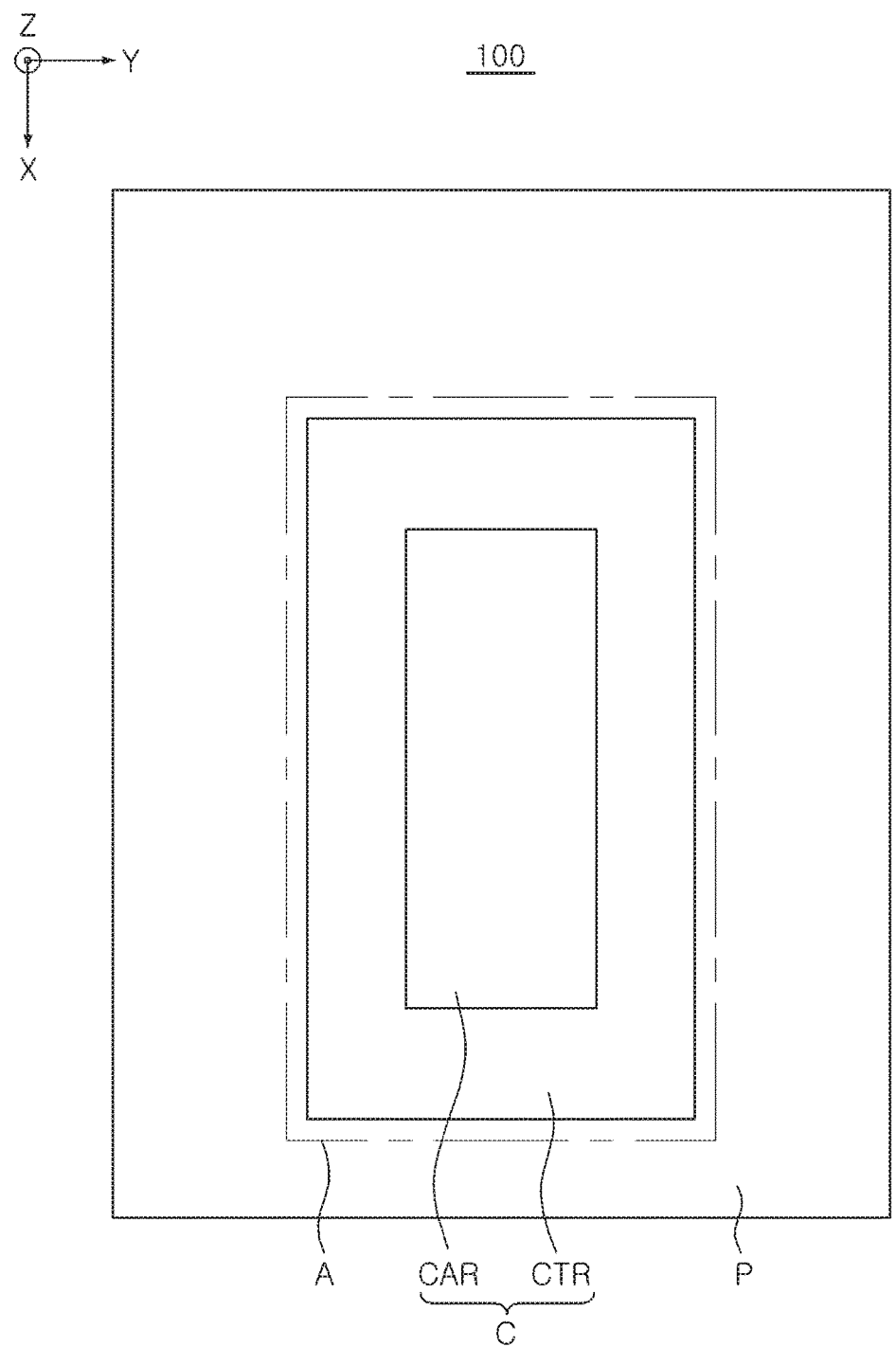
FIG. 3 is a plan view schematically illustrating a memory device according to an example embodiment of the inventive concepts.
Figure 4:
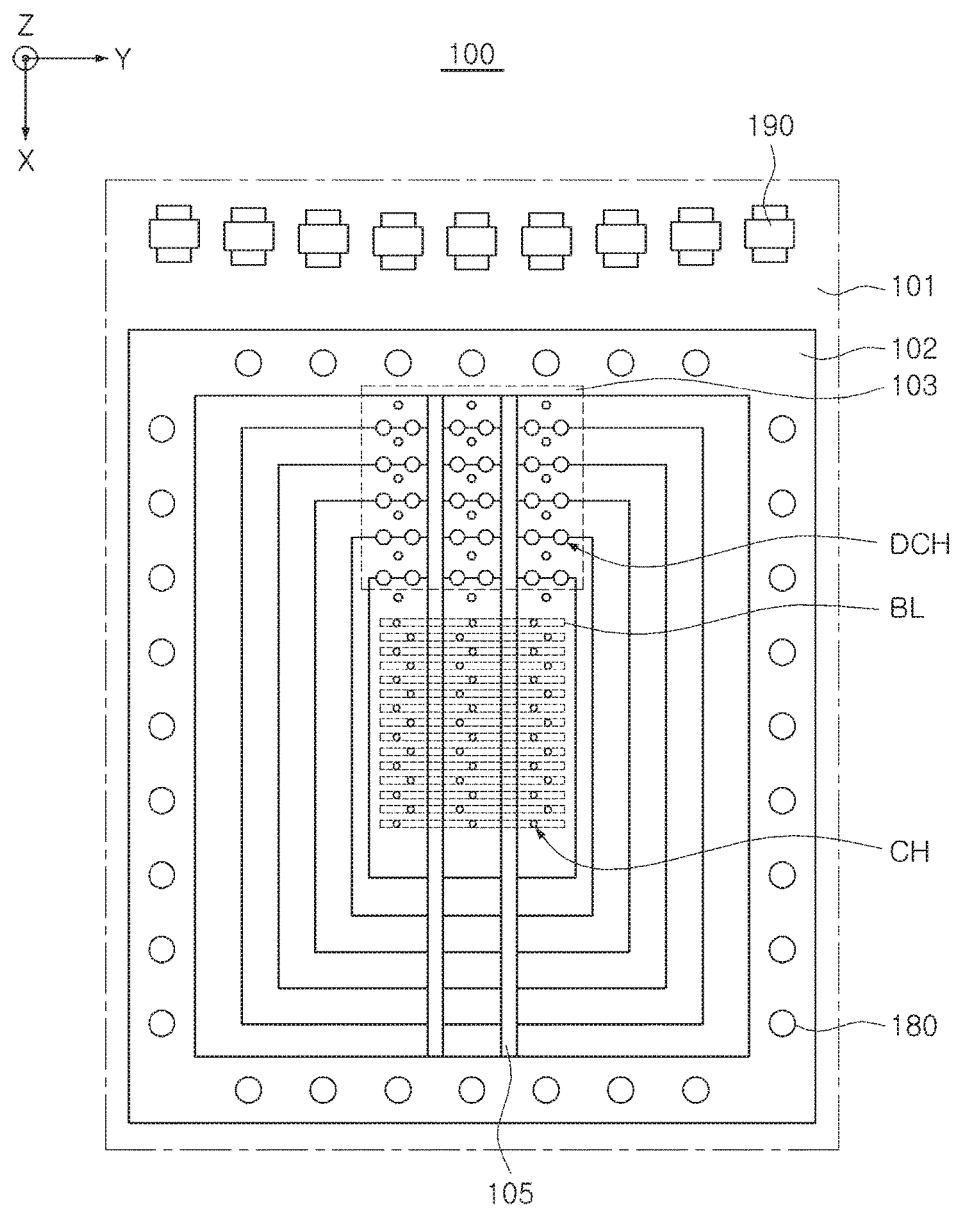
FIG. 4 is an enlarged view illustrating portion A in FIG. 3.

FIGS. 3 and 4 are plan views schematically illustrating a memory device according to an example embodiment of the inventive concepts.

With reference to FIG. 3, a memory device 100 according to an example embodiment of the inventive concepts may include a peripheral circuit region P and a cell region C. The peripheral circuit region P may be disposed around the cell region C, and the cell region C may include a cell array region CAR and a contact region CTR. As described in FIG. 3, the cell array region CAR is surrounded by the contact region CTR and the cell region C is surrounded by the peripheral circuit region P, however, an arrangement of the cell array region CAR, the contact region CTR, and the peripheral circuit region P may be variously changed.

FIG. 4 is an enlarged plan view illustrating portion A in FIG. 3. With reference to FIG. 4, the memory device 100 according to an example embodiment may include a peripheral circuit device 190 disposed on the peripheral circuit region P, a first channel structure and a second channel structure included in the cell region C, and the like. In an example embodiment, a channel structure CH may be connected to a bit line BL extending in a first direction (Y-direction in FIG. 4). Each of the first channel structure and the second channel structure may be provided as the channel structure CH and a dummy channel structure DCH.

The peripheral circuit device 190, the channel structure CH, the dummy channel structure DCH, and the like may be formed on a substrate 101. The substrate 101 may include a semiconductor material such as silicon, or the like, and may include a first region 102 and a second region 103, having different impurity characteristics from each other. Different impurity characteristics means one or more of different impurity concentration, different impurity type or different impurity material. Additionally, the second region 103 and the substrate 101 may have the different impurity characteristics. The second region 103 may be a region disposed below the dummy channel structure DCH, and may be located inside the first region 102. In an example embodiment, the channel structure CH has a lower portion in contact with the first region 102, and the dummy channel structure DCH has a lower portion in contact with the second region 103.

In an example embodiment, the first region 102 may be provided as a pocket P-well region including a P-type impurity. In another embodiment, the first region 102 may be eliminated. A plurality of well contacts 180 connected to the first region 102 may be disposed outside of the cell region C. When erasing operations of erasing data written to the memory cell included in the memory device 100 are performed, an erase voltage is applied to the first region 102 through the well contact 180 to remove an electric charge accumulated in the memory cell. In a case in which the second region 103 is not formed and the dummy channel structure DCH is electrically connected to the first region 102, only erasing operations may be repeatedly executed in the dummy channel structure DCH separated from the bit line BL without writing operations. Thus, holes may be repeatedly accumulated in the memory cell provided by the dummy channel structure DCH, thereby causing characteristics degradation of the memory device.

With reference to FIG. 4, in an example embodiment, the dummy channel structure DCH is disposed not on the first region 102 but on the second region 103 to be electrically connected to the second region 103. An impurity characteristic of the second region 103 may be different from that of the first region 102. As an example embodiment, at least one of concentrations of impurities included in the first region 102 and the second region 103, and conductivity types of the impurities therein may be different from each other. Thus, when a voltage for erasing operations is applied through the well contact 180, accumulation of the holes may be significantly reduced through the dummy channel structure DCH. In an example embodiment, the second region 103 may include an N-type impurity having a conductivity type different from the P-type impurity included in the first region 102, or may include a P-type impurity in a concentration lower than that of the first region 102.

Figure 5:
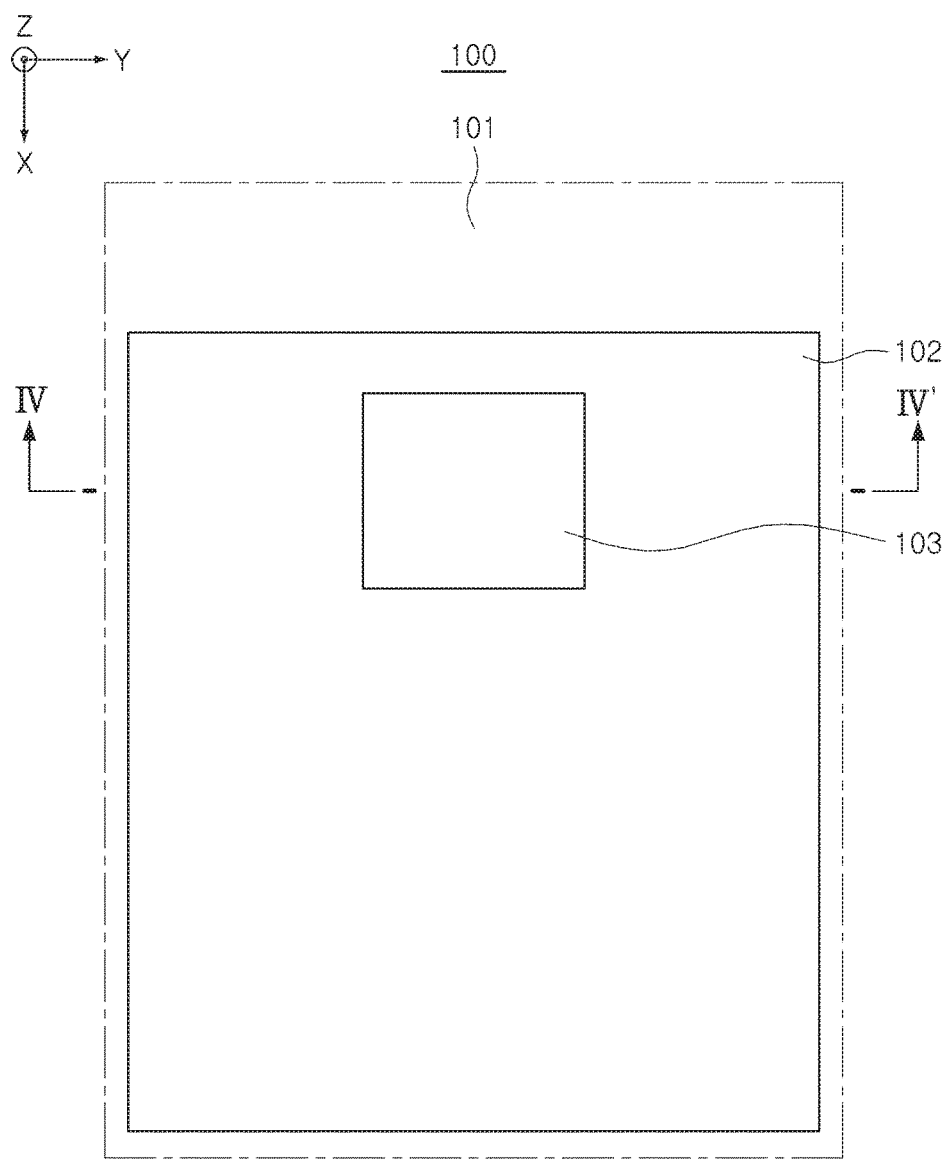
FIG. 5 is a plan view illustrating a partial region of a substrate included in a memory device according to an example embodiment of the inventive concepts.
Figure 6:
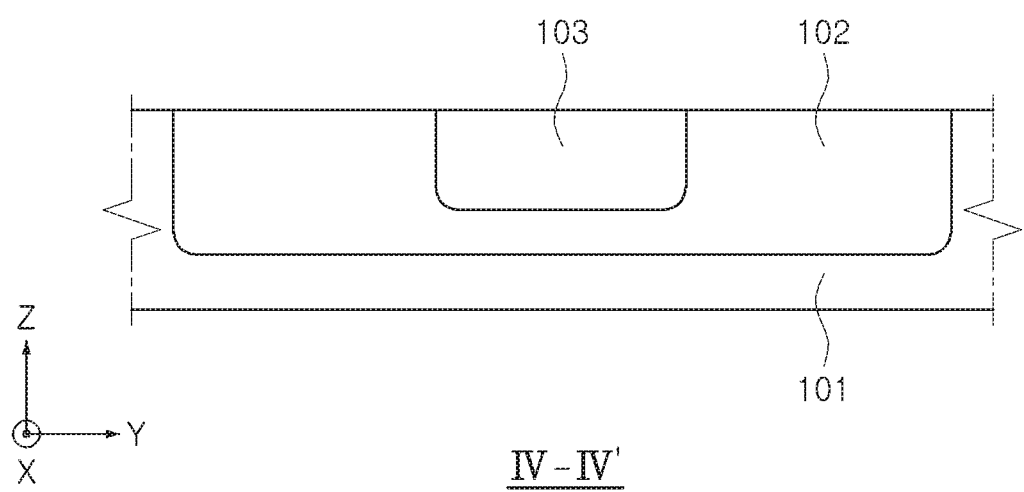
FIG. 6 is a cross-sectional view illustrating a cross section taken along line IV-IV' in FIG. 5.

FIG. 5 is a plan view illustrating a partial region of a substrate included in a memory device according to an example embodiment, and FIG. 6 is a cross-sectional view illustrating a cross section taken along line IV-IV' of the substrate illustrated in FIG. 5.

As an example embodiment, a region of the substrate 101 illustrated in FIGS. 5 and 6, may be a region corresponding to portion A of the memory device 100 illustrated in FIG. 3. With reference to FIGS. 5 and 6, the substrate 101 may include the first region 102 including a first impurity and the second region 103 having an impurity characteristic different from the first region 102. In an example embodiment, the second region 103 may include the first impurity the same as the first region 102, or may include a second impurity having a conductivity type different from the first impurity included in the first region 102.

When the first region 102 and the second region 103 include the first impurities, an impurity concentration of the second region 103 may be smaller than an impurity concentration of the first region 102. In other words, the second region 103 may be doped in a concentration lower than the first region 102. To form the second region 103 in an impurity concentration lower than the first region 102, first impurities may be injected into the first region 102 and the second region 103. A mask allowing only the second region 103 to be exposed is formed, and a second impurity having a conductivity type different from the first impurity is injected into the second region 103 to reduce an impurity concentration of the second region 103 to be lower than the first region 102. In an example embodiment, the first impurity included in the first region 102 and the second region 103 may be a P-type impurity, and the first region 102 may be provided as the pocket P-well PPW region.

The first region 102 and the second region 103 may include a first impurity and a second impurity, having conductivity types different from each other, respectively. After a first impurity is injected into the first region 102 and the second region 103, a mask allowing only the second region 103 to be exposed is formed, and a second impurity is injected only into the second region 103. In this case, a concentration of the second impurity injected into the second region 103 may be greater than concentrations of the first impurities injected into the first region 102 and the second region 103 before the mask is formed. Thus, the first region 102 may be doped with the first impurity, and the second region 103 may be doped with the second impurity.

As illustrated in FIGS. 5 and 6, the second region 103 may be located inside the first region 102. A thickness of the second region 103 may be smaller than a thickness of the first region 102, and the second region 103 may be surrounded by the first region 102. Upper surfaces of the first region 102 and the second region 103 may be co-planar with an upper surface of the substrate 101.

Figure 7:
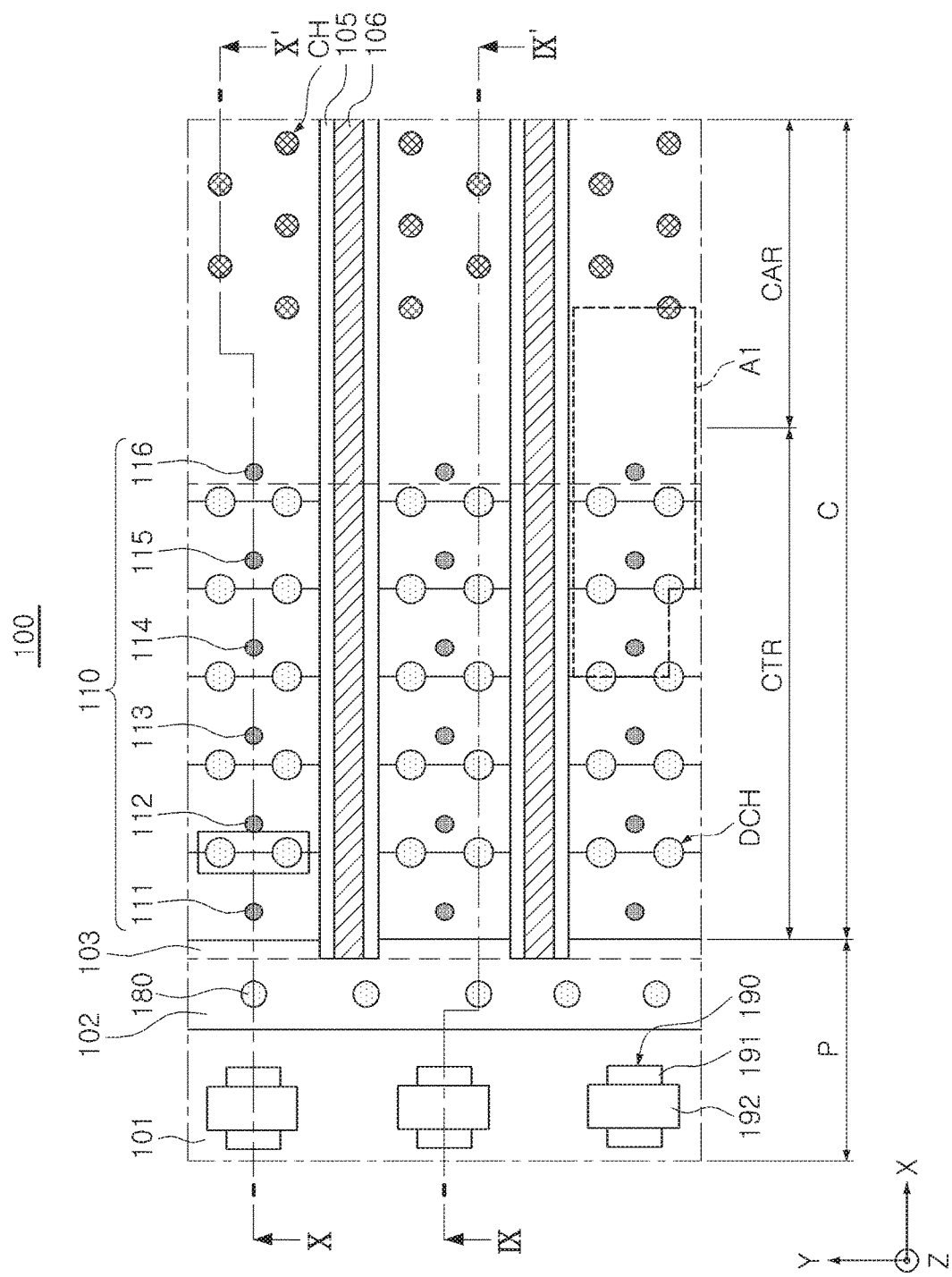
FIG. 7 is a plan view illustrating a memory device according to an example embodiment of the inventive concepts.

FIG. 7 is a plan view illustrating a memory device according to an example embodiment.

With reference to FIG. 7, the memory device 100 according to an example embodiment may include the cell region C and the peripheral circuit region P. The cell region C may include the plurality of memory cells arranged as the plurality of memory cells strings having a ground selection transistor, a string selection transistor, and the like. The peripheral circuit region P may include a plurality of peripheral circuit devices 190. Each of the plurality of peripheral circuit devices 190 may include an active region 191, a horizontal gate electrode layer 192, and the like.

The cell region C may include a first channel structure, a second channel structure, and a plurality of contacts 110 (e.g., contacts 111 to 116) connected to a plurality of gate electrode layers stacked on the substrate 101 adjacent to the first channel structure. The first channel structure and the second channel structure may be provided as the channel structure CH and the dummy channel structure DCH, respectively. In an example embodiment illustrated in FIG. 7, the channel structure CH, the dummy channel structure DCH, the plurality of contacts 110, and the like may be extended in a z-direction, and an upper surface of the substrate may correspond to an X-Y plane.

In an example embodiment in FIG. 7, a diameter of a cross section of the dummy channel structure DCH is illustrated as being larger than a diameter of a cross section of the channel structure CH, but is not limited thereto. The cross section of the dummy channel structure DCH may be smaller than or the same as the cross section of the channel structure CH. Meanwhile, the plurality of gate electrode layers connected to the plurality of contacts 110 may be stacked and disposed in a Z-direction on the upper surface of the substrate, corresponding to the X-Y plane.

Channel structures CH may be disposed to be spaced apart from each other in a first direction (X-direction) and a second direction (Y-direction). A number and an arrangement of the channel structures CH may be variously changed according to an example embodiment. For example, the channel structures CH may be disposed in a zig-zag shape as illustrated in FIG. 7. In addition, an arrangement of the channel structures CH adjacent to each other with a separation insulating layer 105 interposed there between may be symmetrical, as illustrated in FIG. 7, but is not limited thereto.

The plurality of gate electrode layers, the channel structures CH, and the like may be divided into a plurality of regions by the separation insulating layer 105. Each of the plurality of regions defined by the separation insulating layer 105 may be provided as a unit cell of the memory device 100. A vertical conductive layer 106 may be formed inside of the separation insulating layer 105, and the vertical conductive layer 106 may be connected to a source region in the substrate 101.

The memory device 100 includes the substrate 101, and the substrate 101 may include the first region 102 and the second region 103. The first region 102 and the second region 103 may have impurity characteristics different from each other. The second region 103 and the substrate 101 may have different impurity characteristics (e.g., lower P-type concentration than the substrate or different impurity type (N-type) than the substrate). In addition, the first region 102 may be located below the channel structure CH, and the second region 103 may be located below the dummy channel structure DCH. At least one of concentrations and conductivity types of impurities included in the first region 102 and the second region 103 may be different from each other.

In an example embodiment, the first region 102 may include a first impurity, and the second region 103 may include a second impurity. Alternatively, the first region 102 may include a first impurity in a first impurity concentration, and the second region 103 may include the first impurity in a second impurity concentration, different from the first impurity concentration. In this case, the first impurity concentration may be greater than the second impurity concentration.

In an example embodiment, the first region 102 may be a well region electrically connected to the channel structure CH, in detail, the pocket P-well PPW region including a P-type impurity, and the first region 102 may be connected to the plurality of well contacts 180. The second region 103 may be electrically connected to the dummy channel structures DCH. In an example embodiment, the second region 103 is formed below the dummy channel structures DCH, thereby preventing a decrease of a breakdown voltage, which may be generated in the memory device 100 due to repetitive erasing operations, and preventing characteristics from being degraded.

As described above, during writing operations of writing data to the memory cell, a ground voltage GND may be applied to at least a portion of bit lines, and a power supply voltage VCC may be applied to a remaining portion thereof. In a manner different from the channel structure CH connected to the bit line, as the dummy channel structure DCH is separated from the bit line, during writing operations, an electric charge may not be accumulated in the dummy string DS provided by the dummy channel structure DCH.

Meanwhile, erasing operations of erasing data written to the memory cell may be performed using a method of removing an electric charge accumulated in the memory cell by supplying a desired (or, alternatively a predetermined) voltage to the first region 102 and the source region of the substrate 101. In a case in which the second region 103 does not exist, in other words, the first region 102 is located below the dummy channel structure DCH, the dummy channel structure DCH are electrically connected to the first region 102 and the source region. Thus, due to repetitive writing and erasing operations, only holes may be accumulated in the dummy string DS, which may cause a reduction in a breakdown voltage and degradation of cell characteristics.

In an example embodiment, the second region 103 is located below the dummy channel structure DCH to solve a problem described above. As described previously, the second region 103 may have an impurity characteristic different from the first region 102. When the second region 103 includes an impurity (for example, an N-type impurity) having a conductivity type different from the first region 102, holes may not be accumulated or may be significantly less accumulated in the dummy string DS during erasing operations. Alternatively, when the second region 103 includes an impurity (for example, P-type impurity) having a conductivity type the same as the first region 102 in an impurity concentration lower than that of the first region 102, an amount of holes accumulated in the dummy string DS is significantly reduced during erasing operations to prevent a breakdown voltage from being reduced, cell characteristics from being degraded, and the like.

Figure 8:
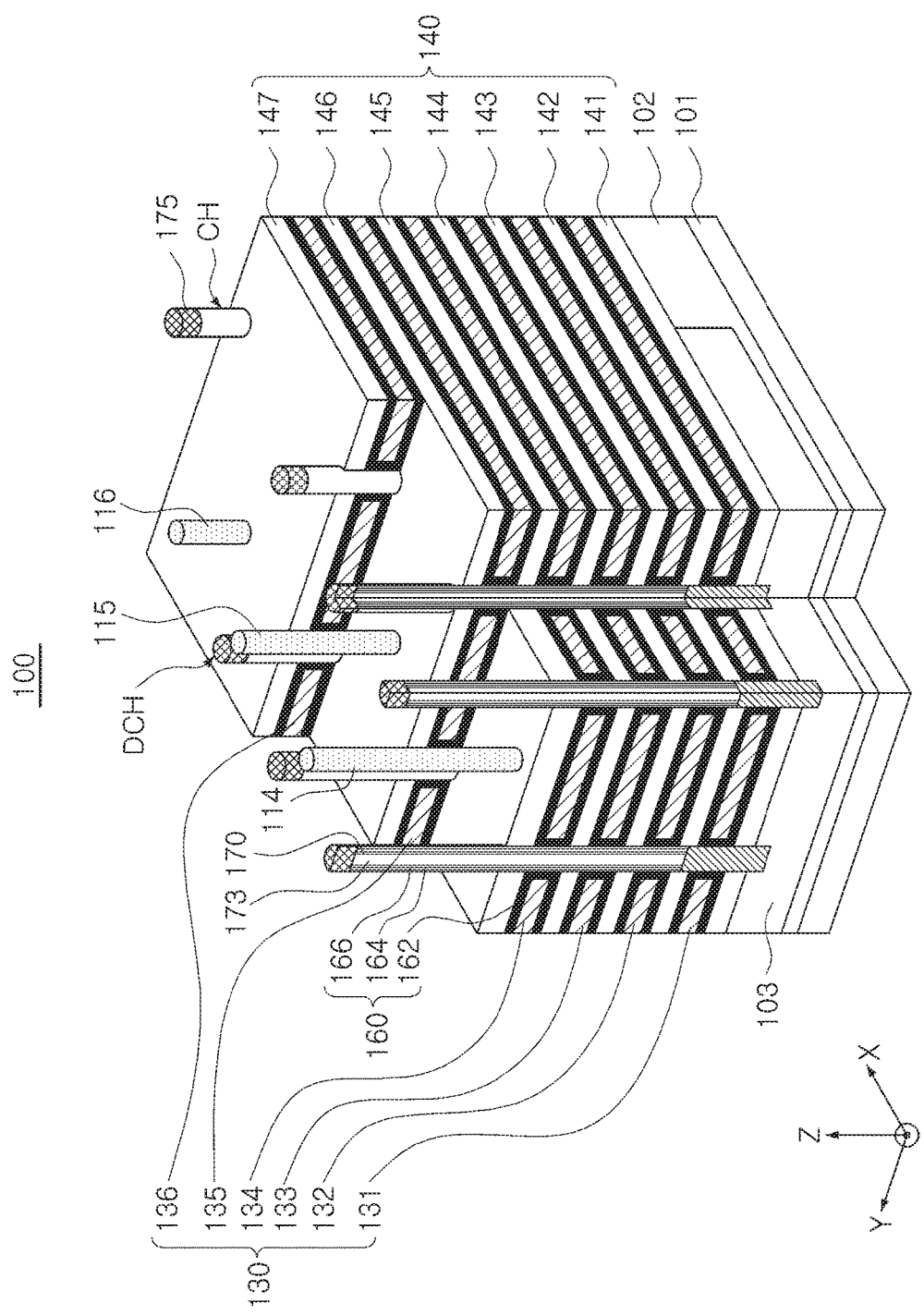
FIG. 8 is a perspective view partially illustrating portion A1 in FIG. 7.
Figure 9:
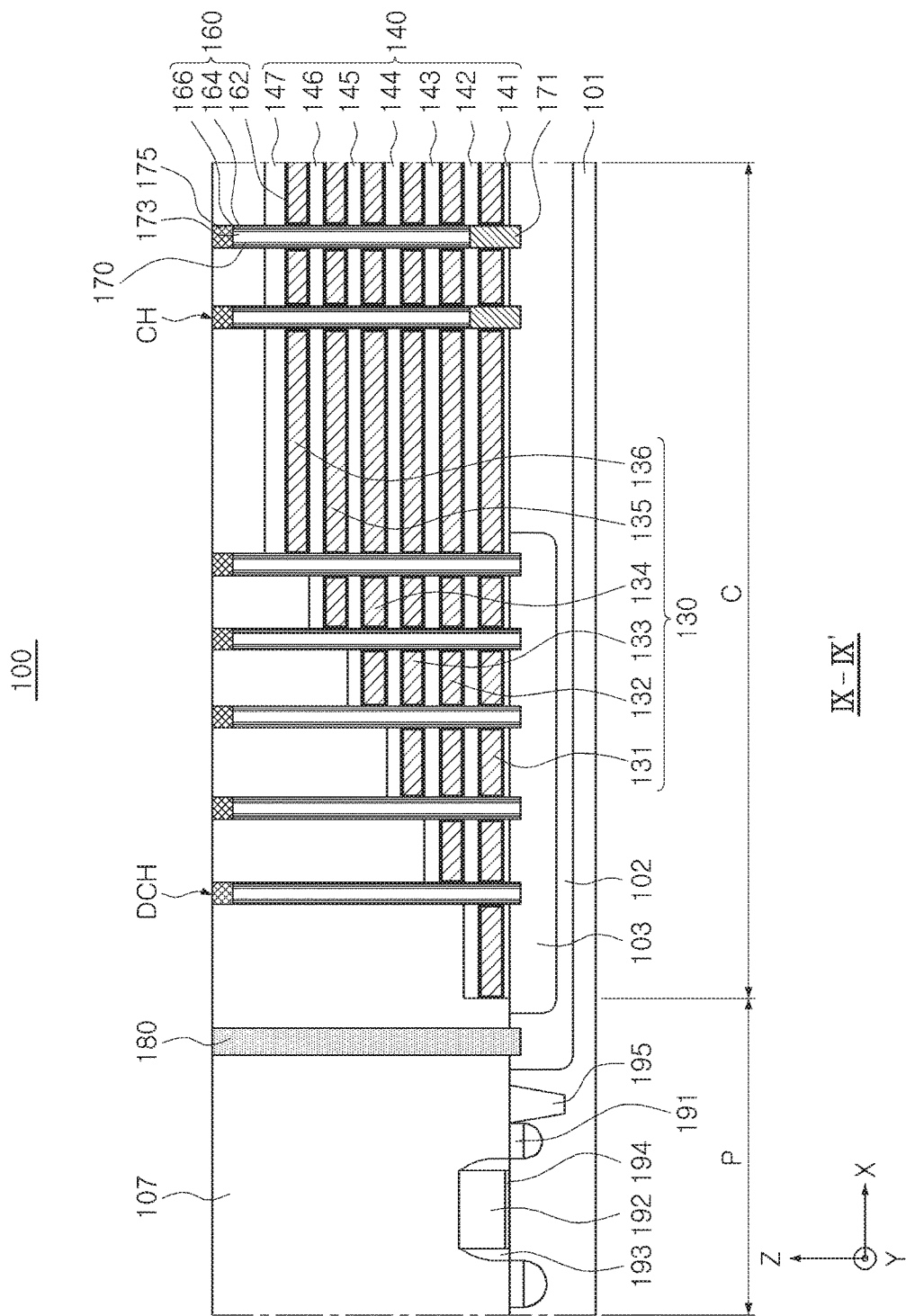
FIG. 9 is a cross-sectional view illustrating a cross section taken along line IX-IX' in FIG. 7.
Figure 10:
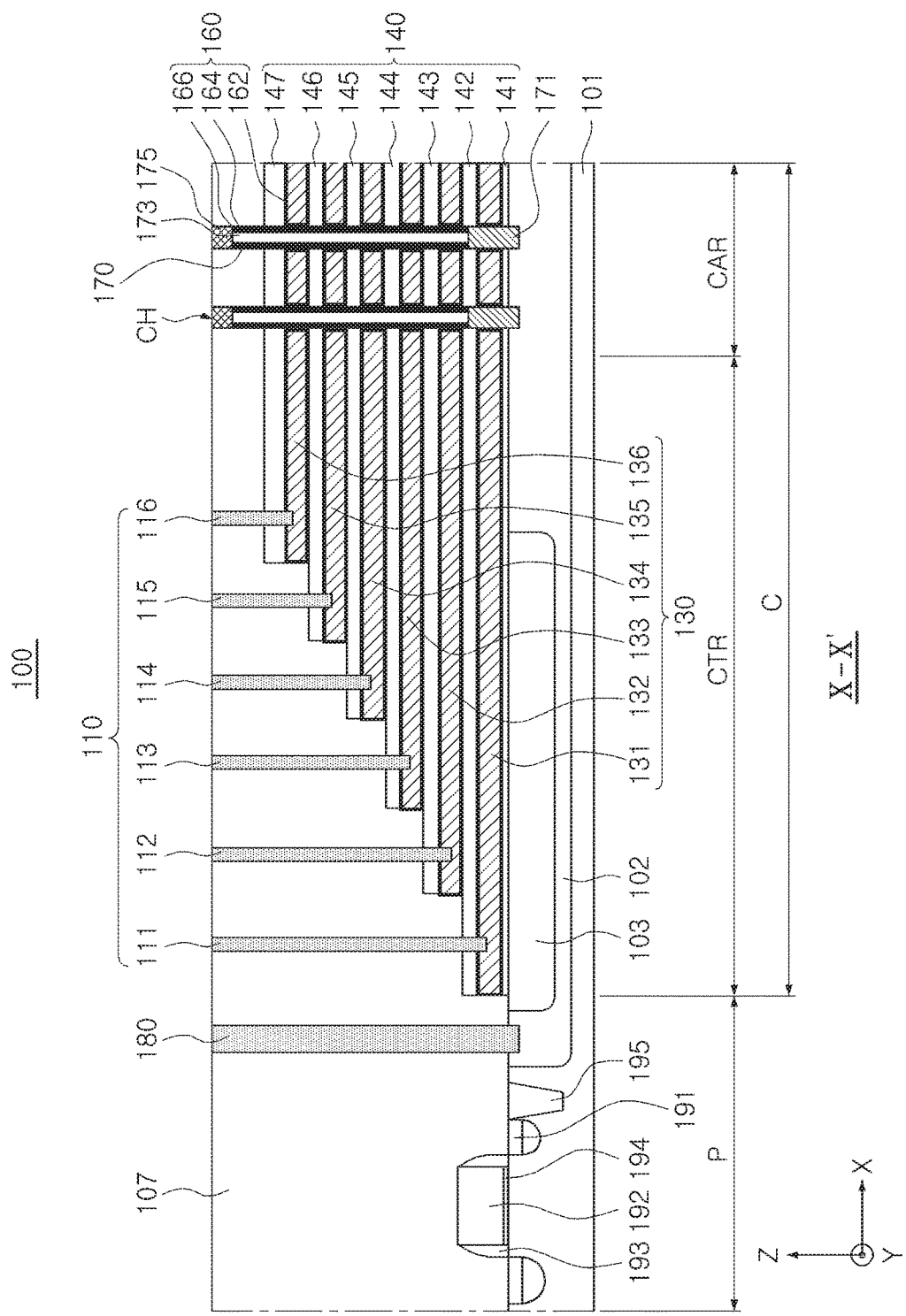
FIG. 10 is a cross-sectional view illustrating a cross section taken along line X-X' in FIG. 7.

With reference to FIGS. 8 to 10, the memory device 100 according to an example embodiment will be described.

FIG. 8 is a perspective view illustrating portion A1 of the memory device illustrated in FIG. 7, and FIG. 9 is a cross-sectional view illustrating a cross section taken along line IX-IX' of the memory device illustrated in FIG. 7. In addition, FIG. 10 is a cross-sectional view illustrating a cross section taken along line X-X' of the memory device illustrated in FIG. 7.

With reference to FIGS. 8 to 10, the memory device 100 may include the cell region C and the peripheral circuit region P. The memory device 100 may include the substrate 101, and the substrate 101 may be a single crystal silicon substrate. The first region 102 and the second region 103 may be formed in the substrate 101, and the first region 102 and the second region 103 may have impurity characteristics different from each other. In an example embodiment, the first region 102 may be the pocket P-well PPW region including a P-type impurity in a first impurity concentration. Meanwhile, the second region 103 may include an N-type impurity, or may include a P-type impurity in a second impurity concentration lower than the first impurity concentration.

The first region 102 may be disposed below the channel structure CH, and the second region 103 may be disposed below the dummy channel structure DCH. As the second region 103 has an impurity characteristic different from the first region 102 and the substrate, during erasing operations in which a voltage is applied to the first region 102 provided as a PPW region, the source region, and the like, injection of holes through the dummy channel structure DCH may be suppressed. Thus, while the memory device 100 repeatedly performs reading, writing, and erasing operations, a reduction in a breakdown voltage, cell characteristics degradation, and the like, which may occur as erasing operations are performed in the dummy channel structure DCH, may be prevented.

With reference to FIGS. 9 and 10, the peripheral circuit region P may be disposed around the cell region C. The channel structure CH and the dummy channel structure DCH may be extended in a direction perpendicular to an upper surface of the substrate 101, and a plurality of gate electrode layers 130 (e.g., gate electrode layers 131 to 136) may be stacked on the upper surface of the substrate 101 to be adjacent to the channel structure CH. A plurality of insulating layers 140 (e.g., insulating layers 141 to 147) may be disposed between the gate electrode layers 130, and the gate electrode layers 130 and the insulating layers 140 extend by different lengths in a first direction (X-direction) to form a stepped structure in a contact region CTR of the substrate 101.

In the region in which the stepped structure is formed, the plurality of gate electrode layers 130 may be connected to the plurality of contacts 110, respectively. An interlayer insulating layer 107 may be formed on the plurality of gate electrode layers 130, and the plurality of contacts 110 may pass through the interlayer insulating layer 107 to be connected to the plurality of gate electrode layers 130. The interlayer insulating layer 107 may include silicon oxide, and may include a High Density Plasma (HDP) oxide film or a Tetra-Ethyl-Ortho-Silicate (TEOS) oxide film. Below the plurality of gate electrode layers 130, the first region 102 of the substrate 101 may be connected to the channel structure CH, and the second region 103 may be connected to the dummy channel structure DCH.

The peripheral circuit region P defined around the cell region C may include the plurality of peripheral circuit devices 190. In an example embodiment, the peripheral circuit device 190 may include a horizontal transistor (a planar transistor). With reference to FIGS. 9 and 10, the peripheral circuit device 190 may include the active region 191 provided as a source/drain region, the horizontal gate electrode 192, the horizontal gate spacer layer 193, a horizontal gate insulating layer 194, and the like. The device isolation layer 195 may be formed outside of the active region 191. The source/drain regions 191 may be formed concurrently with the second region 103, and have a same depth as the second region 103.

The channel structure CH may include a channel layer 170, a gate insulating layer 160 disposed between the channel layer 170 and the gate electrode layers 130, an embedded insulating layer 173 formed inside the channel layer 170, a drain region 175 disposed on the channel layer 170, an epitaxial layer 171, and the like. The embedded insulating layer 173 may fill a space inside the channel layer 170, which is a hollow cylinder. In an example embodiment, the channel layer 170 may not be formed to be hollow but columnar, such as a circular column or a polygonal column, without the embedded insulating layer 173. The channel structure CH may have inclined lateral surfaces of which a width is narrower toward the upper surface of the substrate 101 according to an aspect ratio. Meanwhile, the drain region 175 may include doped polysilicon.

The channel layer 170 may be electrically connected to the substrate 101 through the epitaxial layer 171 there below. The epitaxial layer 171 may have different impurity characteristics from the second region 103. For example, in one embodiment the epitaxial layers 171 are P-type and the second region 103 is P-type, but with a lower concentration of P-type impurities. In another embodiment, the epitaxial layers 171 are P-type and the second region 103 is N-type. Additionally, and optionally, the epitaxial layers 171 may be doped with carbon, while the second region 103 is not. The channel layer 170 may include a semiconductor material such as polysilicon or single crystal silicon, and the semiconductor material included in the channel layer 170 may be a material not doped, or may include a p-type impurity or an n-type impurity. The epitaxial layer 171 may be a layer grown by selective epitaxial growth (SEG).

In an example embodiment, the dummy channel structure DCH may be disposed to be adjacent to one end of the plurality of gate electrode layers 130. With reference to FIGS. 8 and 9, the dummy channel structure DCH may be disposed to be adjacent to one end of the plurality of gate electrode layers 130 in a first direction (X-direction). In a case in which a number of the plurality of gate electrode layers 130 is increased, the plurality of gate electrode layers 130 may not be structurally supported in a region distant from the channel structure CH to be bent or broken. In an example embodiment, as the dummy channel structure DCH is disposed to be adjacent to one end of the plurality of gate electrode layers 130 spaced apart from the channel structure CH, the dummy channel structure DCH may support the gate electrode layer 130 to solve a problem in which the gate electrode layer 130 is structurally bent or broken. However, as illustrated in FIGS. 8 and 9, it is not limited to being disposed to allow the dummy channel structure DCH to be in contact with one end of the gate electrode layer 130.

The plurality of gate electrode layers 130 may be alternately stacked with the plurality of insulating layers 140 in a z-direction. Each of the gate electrode layers 130 may be disposed to be adjacent to one or more of the channel layers 170, may allow a gate electrode of the ground selection transistor GST, the plurality of memory cells MC1 to MCn, and the string selection transistor SST to be provided. The gate electrode layers 130 may be connected to the word lines WL1 to WLn through the plurality of contacts 110, and may be commonly connected to adjacent memory cell strings in a unit arranged in a first direction (X-direction) and a second direction (Y-direction). In an example embodiment, a total number of the gate electrode layers 130 forming the memory cells MC1 to MCn may be 2N (where N is a natural number).

A gate electrode layer 131 of the ground selection transistor GST may be connected to the ground select line GSL. In FIGS. 8 to 10, each gate electrode layer 136 of the string selection transistor SST and the gate electrode layer 131 of the ground selection transistor GST is illustrated as one, but a number thereof is not limited thereto. Meanwhile, the gate electrode layer 131 of the ground selection transistor GST and the gate electrode layer 136 of the string selection transistor SST may have a structure different from gate electrodes 132 to 135 of the memory cells MC1 to MCn.

The plurality of gate electrode layers 130 may include polysilicon or a metal silicide material. The metal silicide material, for example, may be a silicide material of a metal selected from cobalt (Co), nickel (Ni), hafnium (Hf), platinum (Pt), tungsten (W), and titanium (Ti). According to an example embodiment, the plurality of gate electrode layers 130 may include a metallic material, for example, tungsten (W). In addition, although not illustrated, the plurality of gate electrode layers 130 may further include a diffusion barrier. For example, the diffusion barrier may include at least one of tungsten nitride (WN), tantalum nitride (TaN), and titanium nitride (TiN).

The plurality of gate electrode layers 130 and the plurality of insulating layers 140 may be alternately stacked. The plurality of insulating layers 140 may be separated from each other by the separation insulating layer 105 in a Y-direction in a manner similar to the plurality of gate electrode layers 130, and may be extended by different lengths in an X-direction to form the stepped structure. The plurality of insulating layers 140 may include an insulating material such as silicon oxide or silicon nitride.

The gate insulating layer 160 may be disposed between the plurality of gate electrode layers 130 and the channel layer 170. The gate insulating layer 160 may include a blocking layer 162, a charge storage layer 164, and a tunneling layer 166, sequentially stacked between the channel layer 170 and each of the plurality of gate electrode layers 130. The blocking layer 162 may include a high dielectric constant (high-k) dielectric substance. Here, the high dielectric constant dielectric substance is a dielectric material having a dielectric constant higher than a dielectric constant of a silicon oxide film. The tunneling layer 166 may allow an electric charge to tunnel to the charge storage layer 164 in an F-N tunneling method. The tunneling layer 166, for example, may include silicon oxide. The charge storage layer 164 may be a charge trapping layer or a floating gate conductive layer. For example, the charge storage layer 164 may include a dielectric material, a quantum dot, or a nanocrystal. Here, the quantum dot or the nanocrystal may be formed of a conductive material, for example, of a fine particle of a metal or a semiconductor.

Erasing operations of erasing data written to the memory device 100 may be executed by removing an electric charge trapped in the charge storage layer 164. When the erasing operations are executed, a bias voltage, as described in Table 1, is supplied to the memory device 100. In detail, the electric charge trapped in the charge storage layer 164 may be removed by a voltage of about 20V, supplied to the first region 102 of the substrate through the plurality of well contacts 180.

As described in Table 1, the writing operations may be executed only in a memory cell including the channel structure CH connected to the bit line BL, and the erasing operations may be executed even in a memory cell including the dummy channel structure DCH not connected to the bit line BL. Absent the second region 103, while the memory device 100 repeatedly performs writing and erasing operations, only erasing operations are executed in the dummy channel structure DCH, and thus, only holes may be continuously trapped in the charge storage layer 164 located between the channel layer 170 and the gate electrode layer 130 of the dummy channel structure DCH. Thus, characteristics degradation of the dummy channel structure DCH may be caused, and a breakdown voltage may be changed, leading to malfunctioning of the memory device 100.

In an example embodiment, the second region 103 having an impurity characteristic different from the first region 102 provided as the pocket P-well region is disposed below the dummy channel structure DCH to solve a problem described above. In an example embodiment, the second region 103 may include a P-type impurity in an impurity concentration lower than that of the first region 102. Thus, while the erasing operations are executed, an amount of holes trapped in the charge storage layer 164 between the channel layer 170 and the gate electrode layer 130 of the dummy channel structure DCH may be reduced, and characteristics degradation of the dummy channel structure DCH may be significantly reduced.

In another example embodiment, the second region 103 may include an impurity having conductivity different from the first region 102, in other words, an N-type impurity. In this case, while the erasing operations are executed, holes may be prevented from being trapped in the charge storage layer 164 between the channel layer 170 and the gate electrode layer 130 of the dummy channel structure DCH. Thus, characteristics degradation of the dummy channel structure DCH may be significantly reduced.

Figure 11:
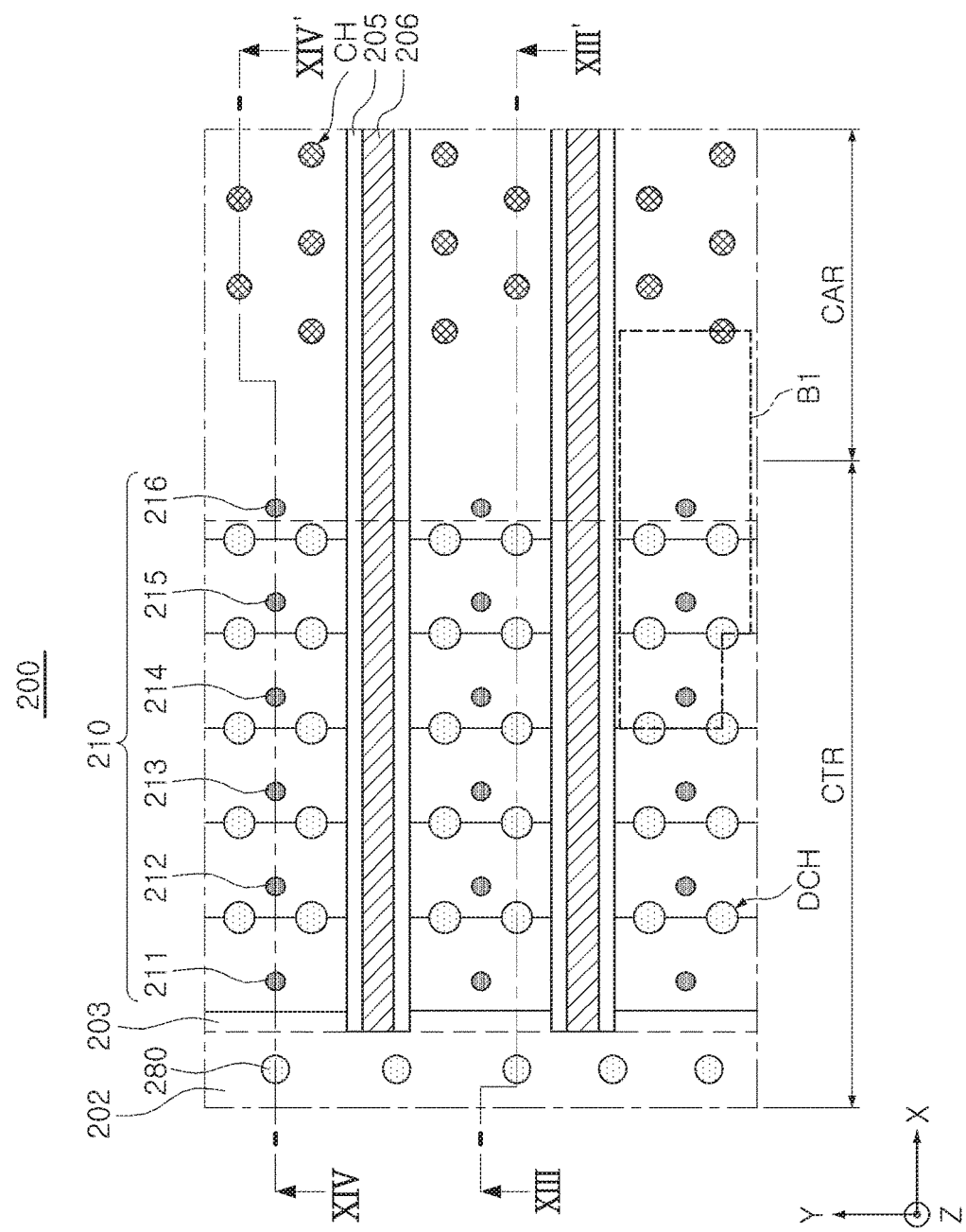
FIG. 11 is a plan view illustrating a memory device according to an example embodiment of the inventive concepts.
Figure 12:
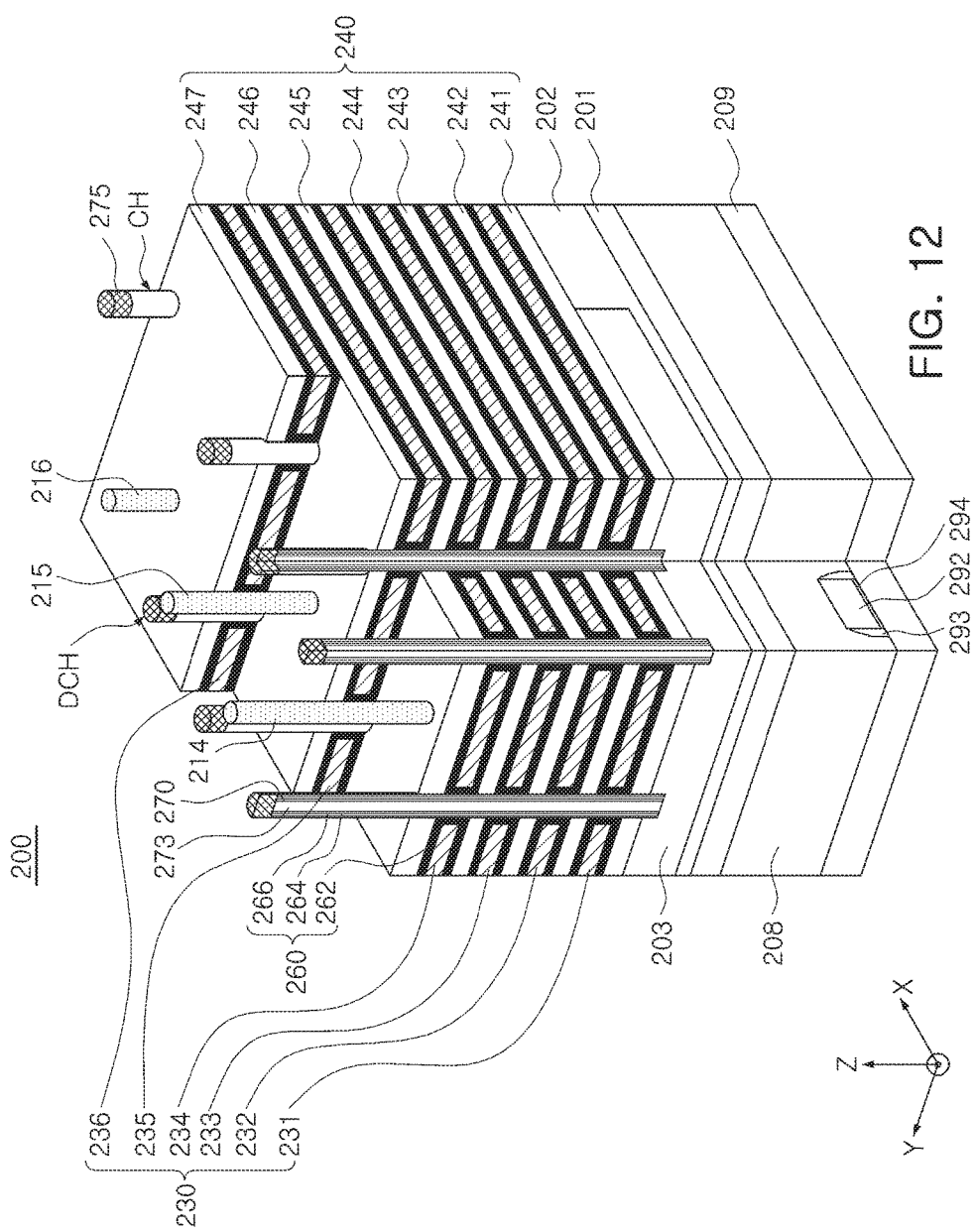
FIG. 12 is a perspective view partially illustrating portion B1 in FIG. 11.
Figure 13:
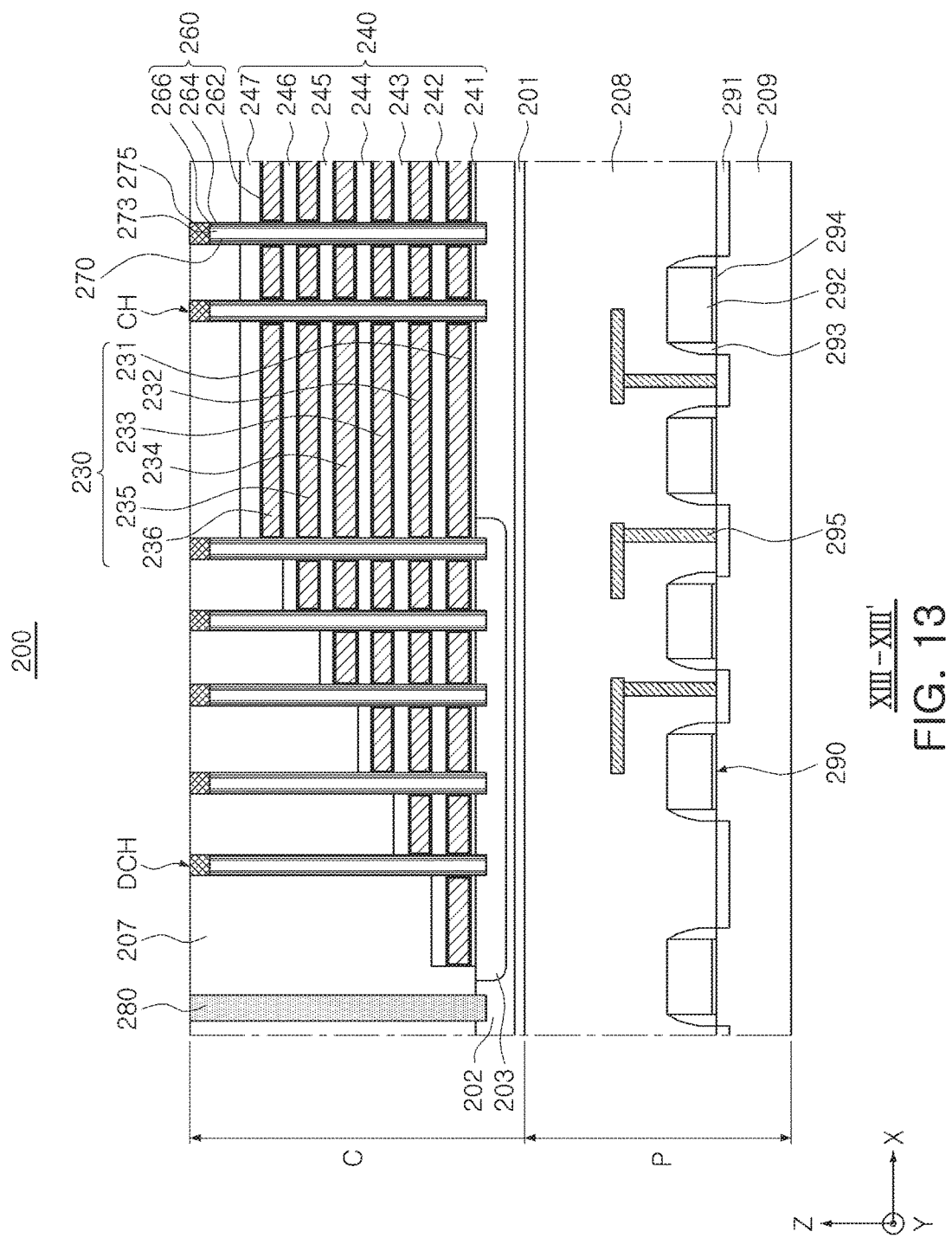
FIG. 13 is a cross-sectional view illustrating a cross section taken along line XIII-XIII' in FIG. 11.

FIG. 11 is a plan view illustrating a memory device according to an example embodiment. FIG. 12 is a perspective view partially illustrating portion B1 of the memory device illustrated in FIG. 11, and FIG. 13 is a cross-sectional view illustrating a cross section taken along line XIII-XIII' of the memory device illustrated in FIG. 11. Meanwhile, FIG. 14 is a cross-sectional view illustrating a cross section taken along line XIV-XIV' of the memory device illustrated in FIG. 11.

With reference to FIGS. 11 to 14, a memory device 200 according to an example embodiment may include a cell region C and a peripheral circuit region P, and the cell region C may be disposed above the peripheral circuit region P in a Z-direction. In other words, the memory device 200 according to an example embodiment illustrated in FIGS. 11 to 14 may have a Cell-On-Peripheral (COP) structure. In another example embodiment, the memory device 200 may have a Peripheral-On-Cell (POC) structure in which the peripheral circuit region P is disposed above the cell region C.

The channel structure CH, the dummy channel structure DCH, a separation insulating layer 205, a plurality of contacts 210 (e.g., contacts 211 to 216), and the like may be disposed in the cell region C. The channel structure CH and the dummy channel structure DCH may be provided by the first channel structure and the second channel structure, respectively. A plurality of gate electrode layers may be divided into a plurality of unit cell regions by the separation insulating layer 205. A vertical conductive layer 206 disposed inside the separation insulating layer 205 may be connected to a common source line extended in a Z-direction to be formed in a substrate.

Figure 14:
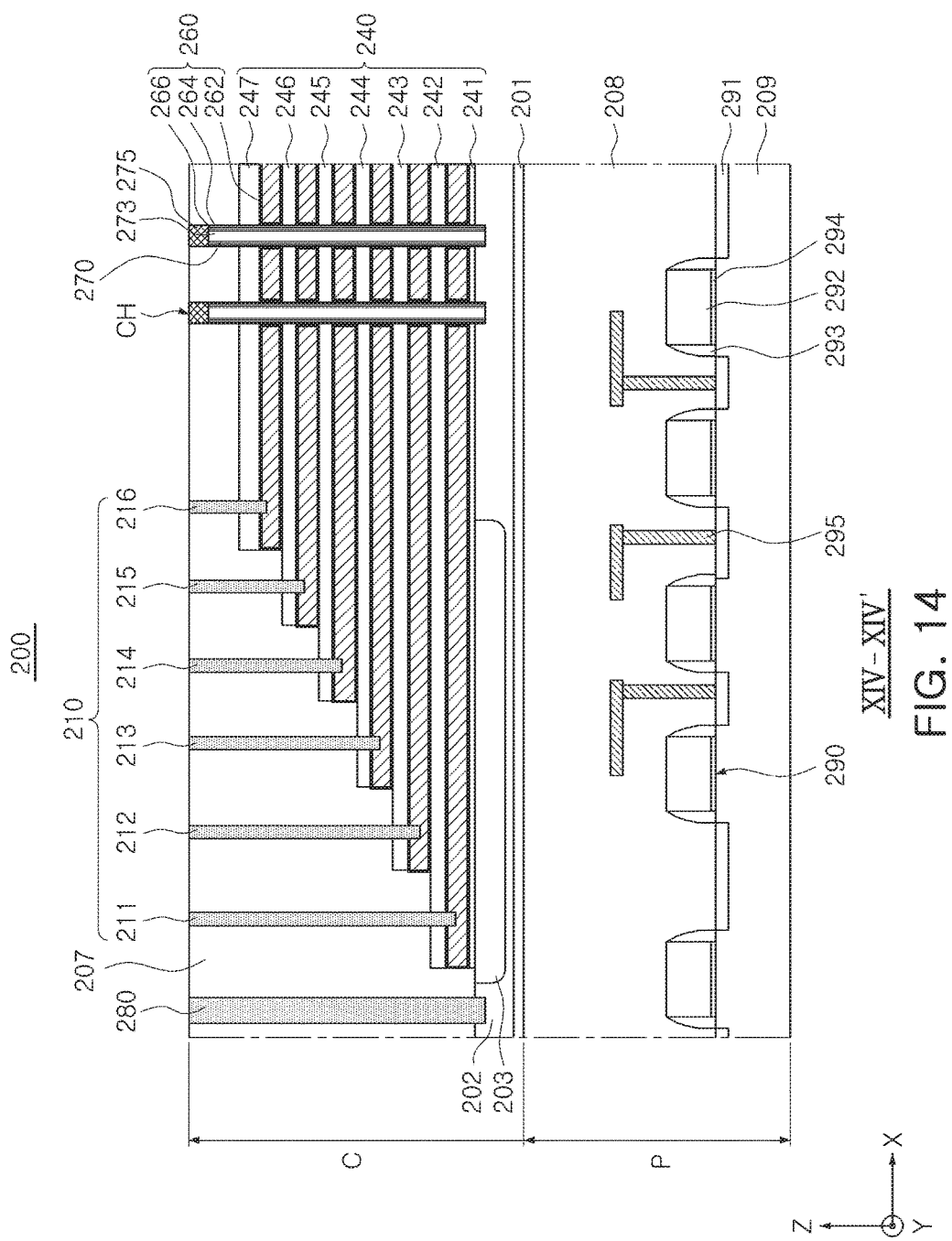
FIG. 14 is a cross-sectional view illustrating a cross section taken along line XIV-XIV' in FIG. 11.

With reference to FIGS. 12 to 14, the peripheral circuit region P may include a second substrate 209, and a plurality of peripheral circuit devices 290 formed on the second substrate 209. The plurality of peripheral circuit devices 290 may be a horizontal transistor, and may have a structure the same as or similar to the peripheral circuit device 190 according to the example embodiment described previously.

Each of an active region 291 and a horizontal gate electrode layer 292 may be connected to a wiring pattern 295. The wiring pattern 295 may be formed of a conductive material, for example, a metallic material, and may be embedded inside a peripheral interlayer insulating layer 208 formed on the second substrate 209. The peripheral interlayer insulating layer 208 may include an insulating material, such as silicon oxide, or the like, and the cell region C may be formed on the peripheral interlayer insulating layer 208.

The cell region C may have a structure the same as or similar to the cell region C of the memory device 100 according to the example embodiment described with reference to FIGS. 7 to 10. Meanwhile, in a manner different from the memory device 100 according to the example embodiment described with reference to FIGS. 7 to 10, a channel layer 270 may be directly connected to a first substrate 201 without an epitaxial layer disposed there between.

The first substrate 201 included in the cell region C may include a first region 202 and a second region 203. The second region 203 may have a thickness thinner than the first region 202, and may be embedded inside the first region 202. The second region 203 may be connected to the dummy channel structure DCH below the dummy channel structure DCH, and the first region 202 may be connected to the channel structure CH below the channel structure CH. The first region 202 and the second region 203 may have impurity characteristics different from each other, as the example embodiment described with reference to FIGS. 7 to 10. In an example embodiment, the first region 202 may include a P-type impurity, and the second region 203 may include an N-type impurity or may include a P-type impurity in a concentration lower than the first region 202.

Figure 15:
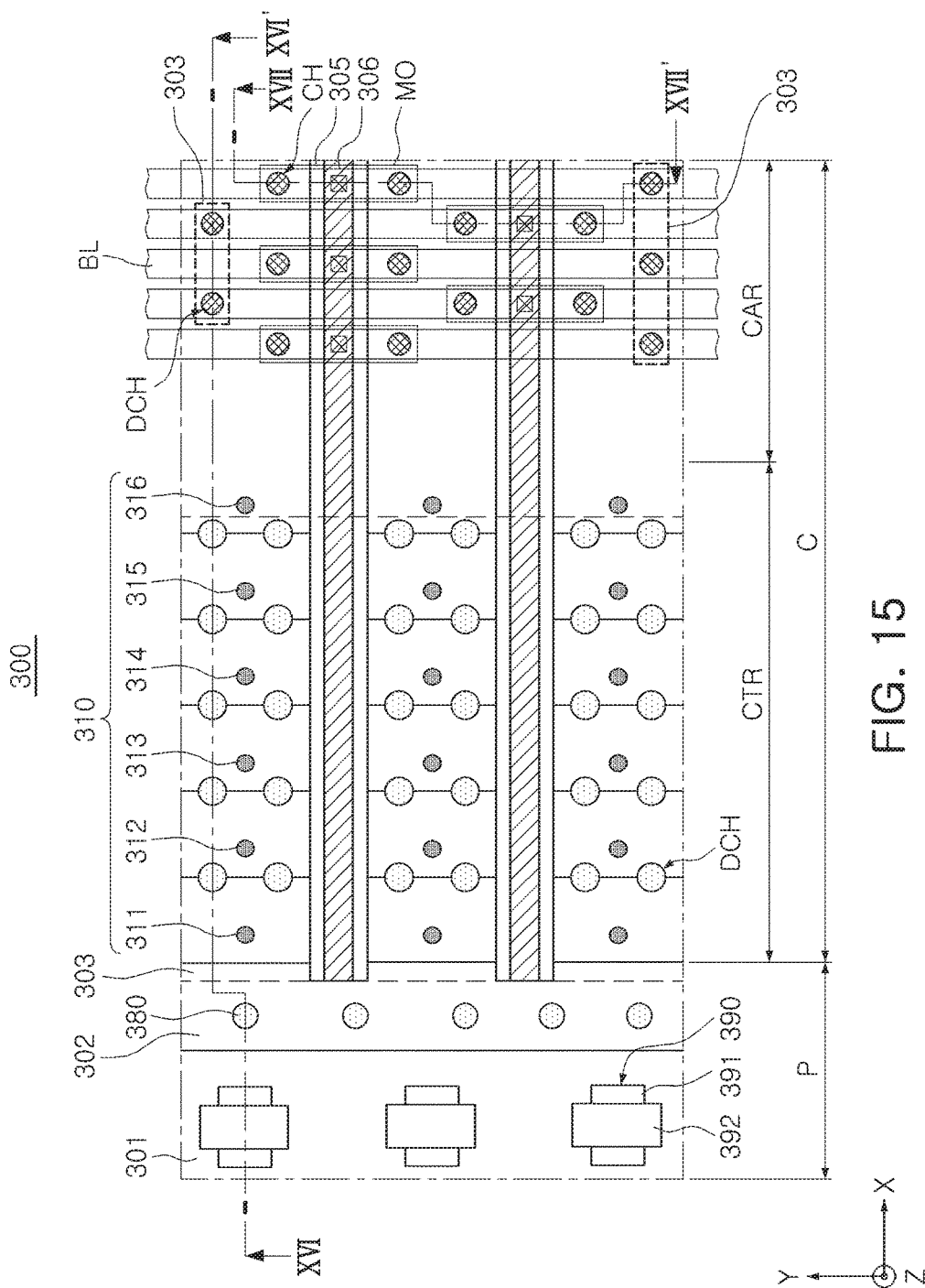
FIG. 15 is a plan view illustrating a memory device according to an example embodiment of the inventive concepts.
Figure 16:
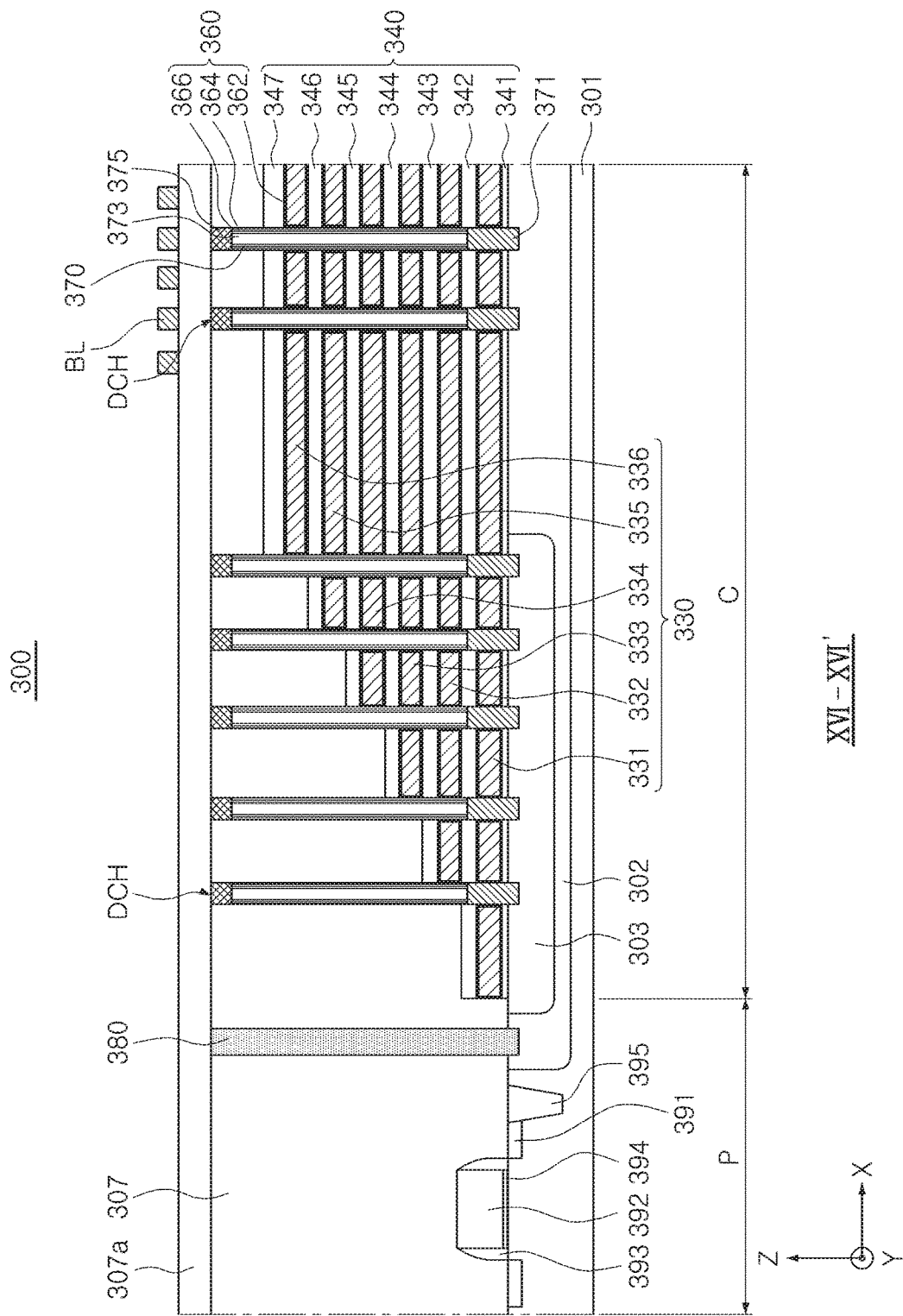
FIG. 16 is a cross-sectional view illustrating a cross section taken along line XVI-XVI' in FIG. 15.

FIG. 15 is a plan view illustrating a memory device according to an example embodiment. FIG. 16 is a cross-sectional view illustrating a cross section taken along line XVI-XVI' of the memory device illustrated in FIG. 15, and FIG. 17 is a cross-sectional view illustrating a cross section taken along line XVII-XVII' of the memory device illustrated in FIG. 15.

Figure 17:
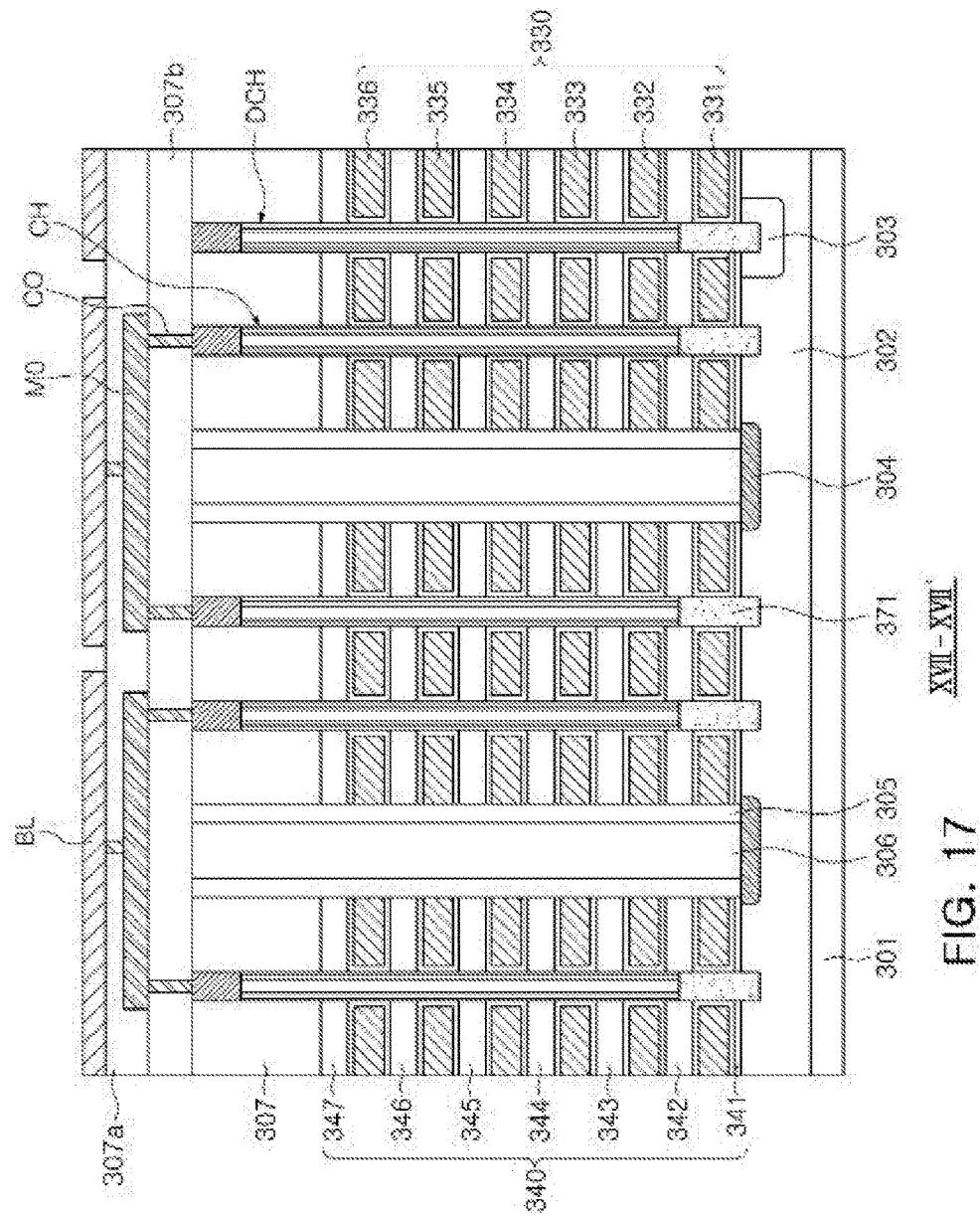
FIG. 17 is a cross-sectional view illustrating a cross section taken along line XVII-XVII' in FIG. 15.

With reference to FIGS. 15 to 17, a memory device 300 according to an example embodiment may include a cell region C and a peripheral circuit region P. An arrangement and a structure and the like of the cell region C and the peripheral circuit region P may be the same as or similar to the memory device 100 according to the example embodiment illustrated with reference to FIGS. 7 to 10. However, in the memory device 300 according to an example embodiment illustrated in FIGS. 15 to 17, the dummy channel structure DCH may be disposed not only in the contact region CTR, but also in the cell array region CAR. The channel structure CH and the dummy channel structure DCH may be provided by a first channel structure and a second channel structure different from each other, respectively.

In an example embodiment, a substrate 301 may include a first region 302 and a second region 303. The first region 302 and the second region 303 may have impurity characteristics different from each other. In addition, the first region 302 may be disposed below the channel structure CH, and the second region 303 may be disposed below the dummy channel structure DCH. The dummy channel structure DCH may be located in the cell array region CAR and the contact region CTR, and thus the second region 303 may include a plurality of regions separated from each other.

As illustrated in FIGS. 16 and 17, an upper insulating layer 307a may be further formed on an interlayer insulating layer 307 covering a plurality of gate electrode layers 330, and a channel layer 370 of the channel structure CH may be electrically connected to a conductive line MO and the bit line BL by a contact C0 passing through the upper insulating layer 307a. However, a channel layer 370 of the dummy channel structure DCH may not be connected to the bit line BL.

In an example embodiment illustrated in FIGS. 15 to 17, the dummy channel structure DCH may be located inside the cell array region CAR. Thus, the second region 303 may include a plurality of regions separated from each other and disposed inside the contact region CTR and the cell array region CAR. The second region 303 may have a thickness less than that of the first region 302, and may be disposed in a structure of being embedded inside the first region 302.

Figure 18:
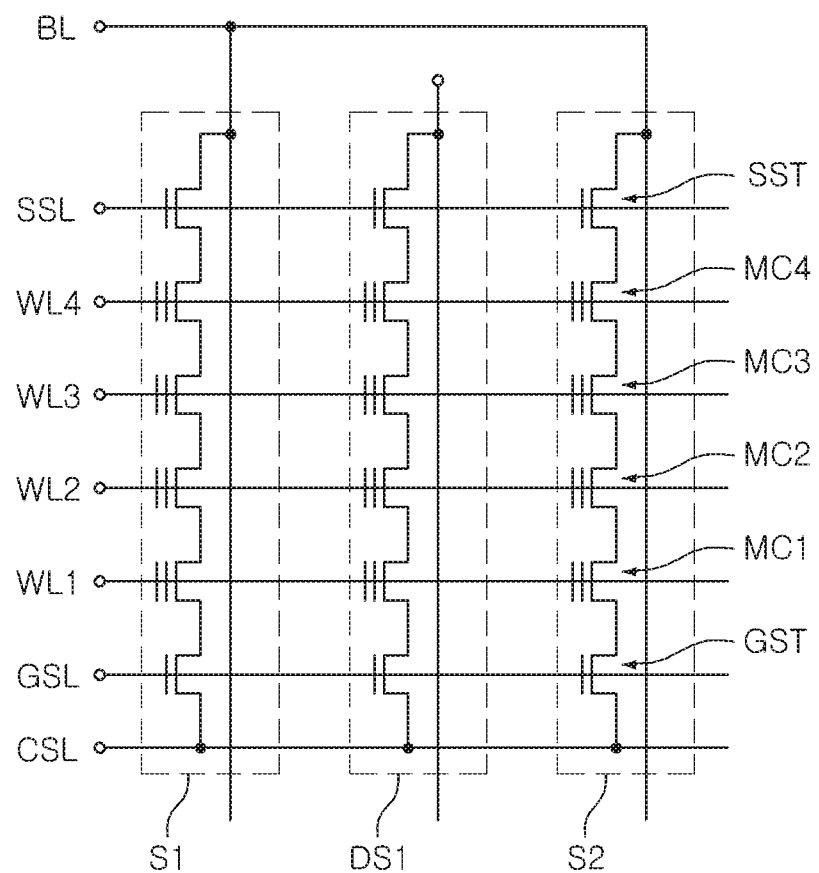
FIG. 18 is a circuit diagram provided to illustrate operations of a memory device according to an example embodiment of the inventive concepts.

FIG. 18 is a circuit diagram provided to illustrate operations of a memory device according to an example embodiment. The operations according to an example embodiment described with reference to FIG. 18, may be applied to the various memory devices 100, 200, and 300 described previously.

With reference to FIG. 18, two memory cell strings S1 and S2 and one dummy string DS1 are described. The two memory cell strings S1 and S2 may be commonly connected to one bit line BL through respective string selection transistors SST. The two memory cell strings S1 and S2 and the one dummy string DS1 may be commonly connected to one common source line CSL through respective ground selection transistors GST. In FIG. 18, each of strings S1, S2, and DS1 is illustrated as including one ground selection transistor GST, one string selection transistor SST, and four memory cells MC1 to MC4, but a number of the ground selection transistors, the string selection transistors, and the memory cells may be variously changed. In addition, a dummy cell may be additionally connected between the ground selection transistor GST and a first memory cell MC1 and between a fourth memory cell MC4 and the string selection transistor SST.

When data is written to a second memory cell MC2 and a third memory cell MC3 of a second memory cell string S2, bias conditions of a voltage are described in Table 2. By the voltage conditions described in Table 2, an electric charge may be trapped in the charge storage layers 164, 264, and 364 included in the second memory cell MC2 and the third memory cell MC3. Under conditions described in Table 2, a program voltage VPGM may be greater than a pass voltage VPASS. In an example embodiment, the program voltage VPGM may be about 18V to 24V, and the pass voltage VPASS may be about 10 V.

TABLE 2

| Line | BL | SSL | WL4 | WL3 | WL2 | WL1 | GSL | CSL |
|---|---|---|---|---|---|---|---|---|
| Voltage | GND | VCC | VPASS | VPGM | VPGM | VPASS | GND | VCC |

With reference to Table 2, the ground voltage GND may be supplied to a bit line BL connected to memory cells MC2 and MC3 to which data will be written. Thus, data may not be written to memory cells MC1 to MC4 included in the dummy string DS1 not connected to the bit line BL.

TABLE 3

| Line | BL | SSL | WL4 | WL3 | WL2 | WL1 | GSL | CSL |
|---|---|---|---|---|---|---|---|---|
| Voltage | FLOATING | FLOATING | GND | GND | GND | GND | FLOATING | FLOATING |

Meanwhile, when data written to the memory cell strings S1 and S2 is removed, bias conditions are described in Table 3. When data is erased, in addition to voltage conditions described in Table 3, an erase voltage VERA may be applied to the substrates 101, 201, and 301, in detail, first regions 102, 202, and 302 connected to the channel structure CH to be provided as the pocket P-well region.

As described previously, the dummy string DS1 provided by the dummy channel structure DCH may be separated from a bit line BL1, and may be connected to the substrates 101, 201, and 301. If the dummy channel structure DCH was directly connected to the first regions 102, 202, and 302, during erasing operations, by the erase voltage VERA applied to the first regions 102, 202, and 302, holes may be trapped in the charge storage layers 164, 264, and 364 of the memory cells MC1 to MC4 included in the dummy string DS1.

In an example embodiment, program operations of a single pulse are executed in the strings S1, S2, and DS1 to solve a problem of degradation of the dummy channel structure DCH caused by repetitive erasing operations, and the like. Bias conditions for the program operations of a single pulse are described in Table 4. Under voltage conditions described in Table 4, a voltage lower than the ground voltage or the power supply voltage VCC may be applied to the first regions 102, 202, and 302 of the substrates 101, 201, and 301.

TABLE 4

| Line | BL | SSL | WL4 | WL3 | WL2 | WL1 | GSL | CSL |
|---|---|---|---|---|---|---|---|---|
| Voltage | GND | GND | VPGM | VPGM | VPGM | VPGM | VCC | GND |

When a voltage is applied under conditions described in Table 4, an electric charge may be trapped in the memory cells MC1 to MC4 included in the strings S1, S2, and DS1 regardless of connection of the bit line BL. In other words, as an electric charge is trapped in the memory cells MC1 to MC4 included in the dummy string DS1, an equivalent effect may be obtained, as writing operations may be executed, even in the dummy string DS1. Thus, as the program operations of a single pulse to be executed under conditions described Table 4, are executed for each constant period, or whenever a number of executing erasing operations reaches a desired, (or, alternatively a predetermined) threshold level, an amount of holes trapped in the charge storage layers 164, 264, and 364 included in the dummy string DS1 may be reduced, and characteristics degradation generated in the dummy channel structure DCH, and the like may be reduced or prevented. The program operations of a single pulse described above, may be applied, regardless of whether the second regions 103, 203, and 303 exist below the dummy channel structure DCH. In other words, the program operations of a single pulse described above, may be applied to a conventional memory device different from the memory devices according to an example embodiment of the present inventive concept, in order to prevent characteristics degradation or improve reliability.

FIGS. 19 to 35 are views provided to illustrate main processes of a method of manufacturing the memory device illustrated in FIGS. 7 to 10.

Figure 19:
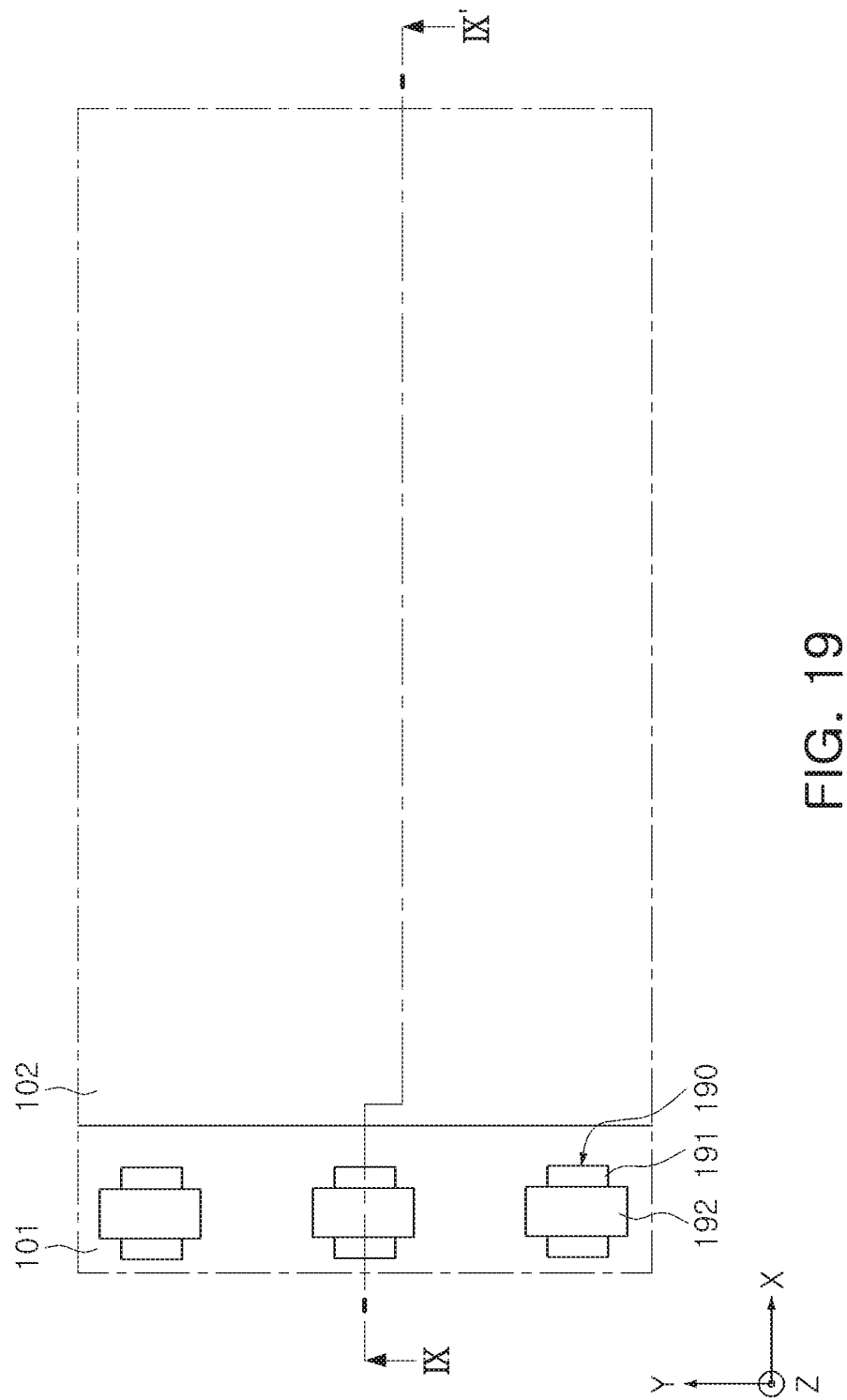
FIGS. 19 to 35 are views provided to illustrate main processes of a method of manufacturing a memory device illustrated in FIGS. 7 to 10.
Figure 20:
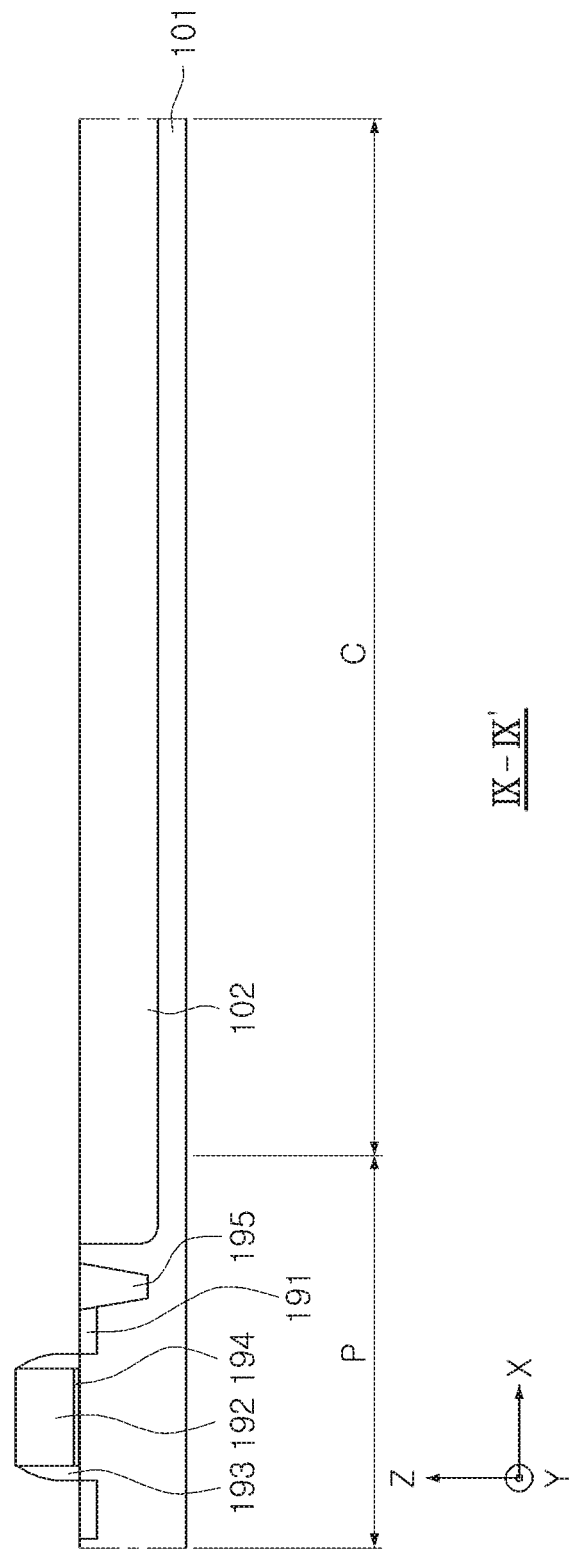

First, with reference to FIGS. 19 and 20, the plurality of peripheral circuit devices 190 may be disposed in the peripheral circuit region P defined on the substrate 101. FIG. 20 is a cross-sectional view taken along line IX-IX' of the plan view illustrated in FIG. 19. Line IX-IX' is the same as in FIG. 7. The plurality of peripheral circuit devices 190 may be a horizontal transistor, and may include a source/drain region 191, the horizontal gate electrode layer 192, the horizontal gate spacer layer 193, the horizontal gate insulating layer 194, and the like. The device isolation layer 195 may be formed at a boundary of the peripheral circuit device 190.

The substrate 101 may be a silicon substrate, and may include the first region 102 doped with an impurity having a first conductivity. The first region 102 may be formed through a mask, allowing only the first region 102 to be exposed, being formed on the substrate 101, and an impurity having a first conductivity is injected into an exposed area of the first region using an ion implantation process. In an example embodiment, the first region 102 may be doped with a P-type impurity, and may be provided as the pocket P-well region for operations of a memory cell to be formed on the substrate 101 in a subsequent process. The first region 102 is illustrated as being formed over the cell region C and the peripheral circuit region P, but an area of the first region 102 may be variously changed.

Figure 21:
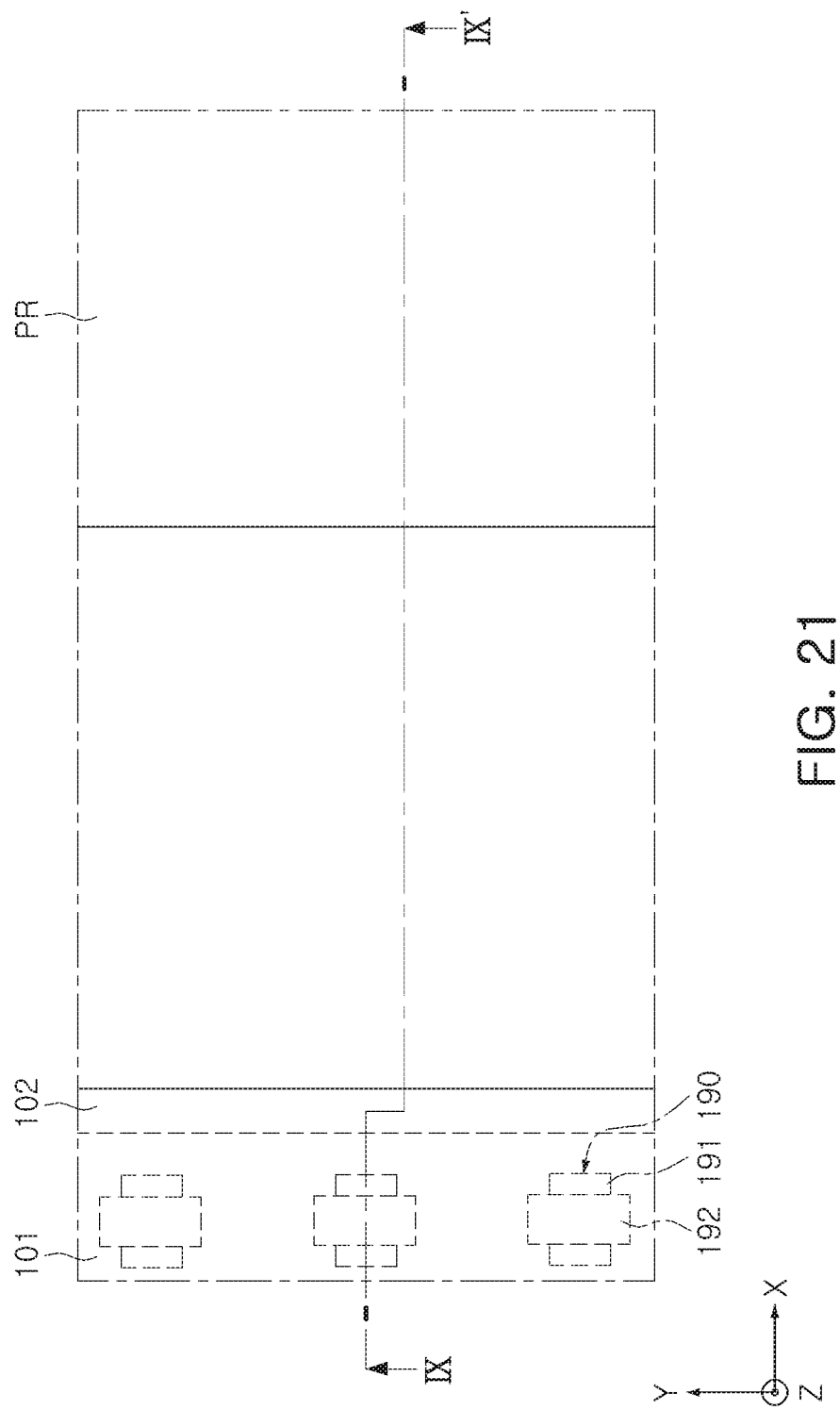
Figure 22:
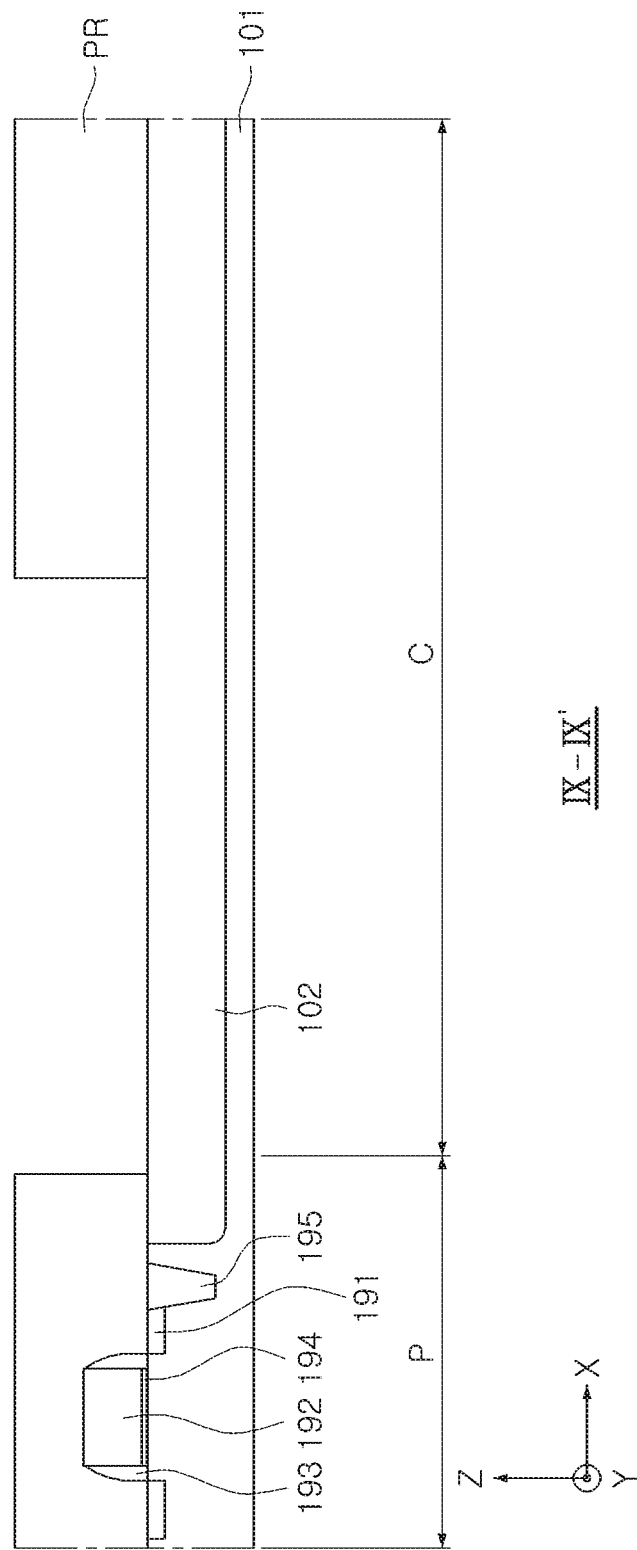
Figure 23:
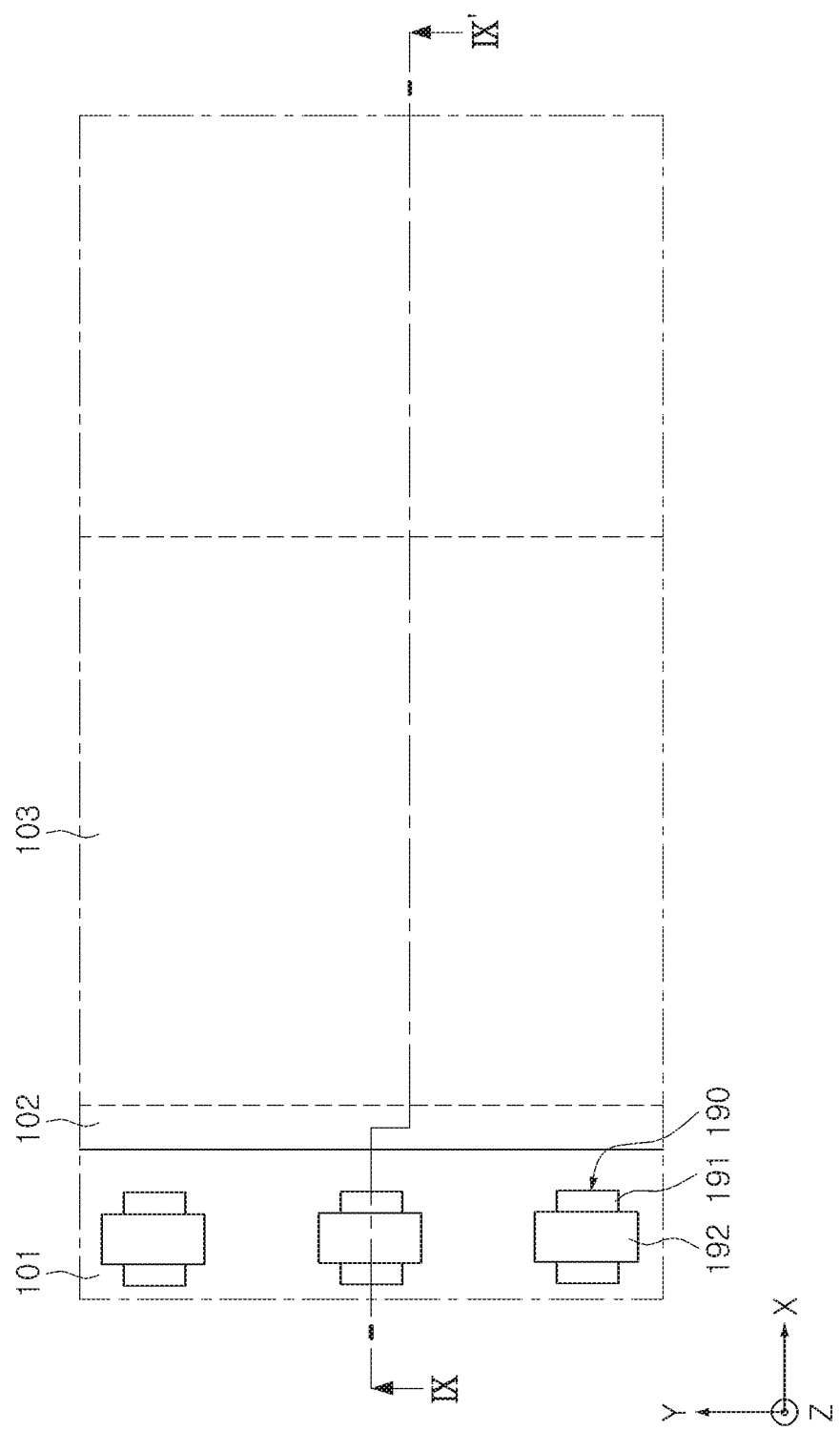
Figure 24:
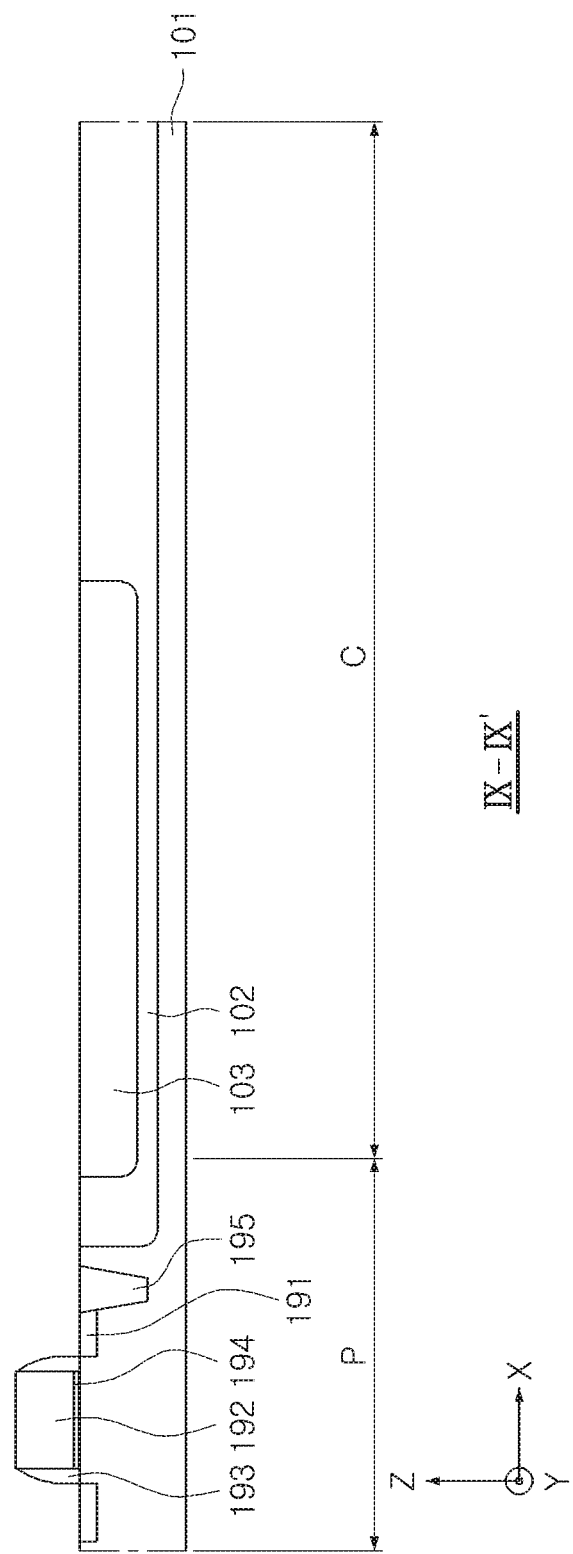

Next, with reference to FIGS. 21 and 22, a mask PR allowing a portion of the first region 102 to be exposed may be formed on the substrate 101. A partial area of the first region 102, exposed by the mask PR may correspond to a region in which the dummy channel structure DCH is to be formed hereinafter. With reference to FIGS. 23 and 24, the area exposed by the mask PR, is doped with an impurity having a conductivity different from the impurity included in the first region 102 to form the second region 103. Instead of forming the source/drain region 191 earlier in the process, the source/drain regions 191 may be formed along with the second region 103 through the same doping operation. As such the source/drain regions 191 may have a same depth as the second region 103. This applies to other embodiment discussed subsequently as well.

The impurity added for formation of the second region 103 may be an N-type impurity. Thus, when the first region 102 includes a P-type impurity, due to a concentration of the N-type impurity being injected in the process according to the example embodiment illustrated in FIGS. 21 to 24, the second region 103 may be doped with a P-type impurity in a low concentration, or doped with an N-type impurity. As an example, when a concentration of the N-type impurity injected into the second region 103 is greater than a concentration of the P-type impurity injected into the first region 102, the second region 103 may be doped with the N-type impurity. As another example, when a concentration of the N-type impurity injected into the second region 103 is smaller than a concentration of the P-type impurity injected into the first region 102, the second region 103 may include the P-type impurity in a concentration lower than the first region 102. Thus, the second region 103 may have an impurity characteristic different from the first region 102.

With reference to FIG. 24, a thickness of the second region 103 may be smaller than a thickness of the first region 102. Thus, the second region 103 may be embedded in the first region 102, and an upper surface of the first region 102 may be coplanar with an upper surface of the second region 103.

Figure 25:
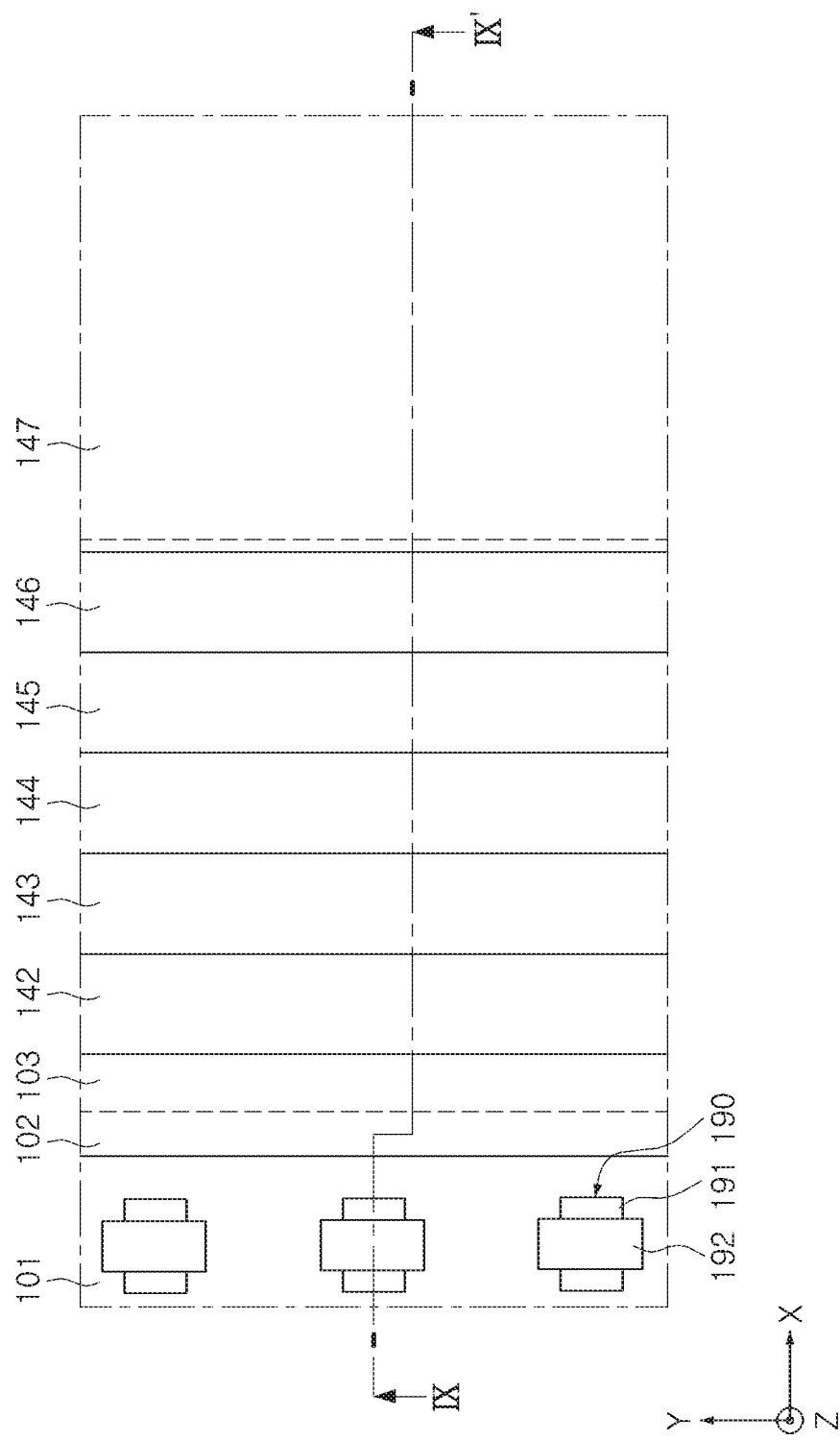
Figure 26:
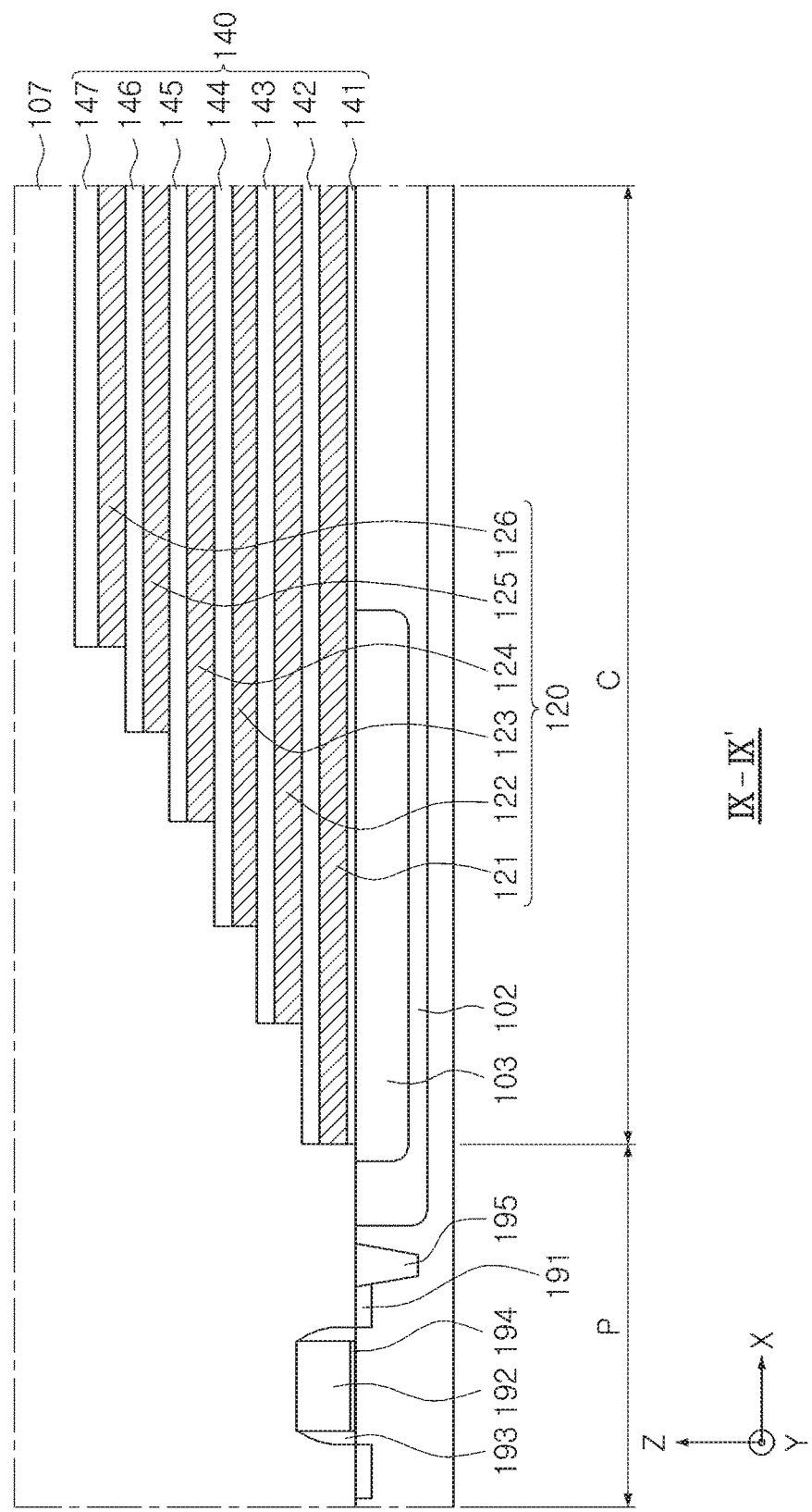

With reference to FIGS. 25 and 26, a plurality of sacrificial layers 120 (e.g., sacrificial layers 121 to 126) and a plurality of insulating layers 140 (e.g., insulating layers 141 to 147) may be alternately stacked above the substrate 101. A number and a thickness of the plurality of sacrificial layers 120 and the plurality of insulating layers 140 may be variously changed according to an example embodiment. In an example embodiment illustrated in FIG. 26, a thickness of an insulating layer 141 located in a lowermost layer is illustrated as being smaller than thicknesses of other insulating layers 142 to 147, but all of insulating layers 141 to 147 may have substantially the same thickness as each other.

The plurality of sacrificial layers 120 and the plurality of insulating layers 140 may be extended by different lengths in a first direction (X-direction of FIGS. 25 and 26) to form a stepped structure having stepped portions. The stepped structure may be formed on a region adjacent to the peripheral circuit region P. In an example embodiment, the stepped structure may be formed on the second region 103 of the substrate 101. After the stepped structure is formed, the interlayer insulating layer 107 may be formed above the plurality of sacrificial layers 120 and the plurality of insulating layers 140. The interlayer insulating layer 107 includes an insulating material such as silicon oxide, or the like, and may include a High Density Plasma (HDP) oxide film, a Tetra-Ethyl-Ortho-Silicate (TEOS) oxide film, or the like.

Figure 27:
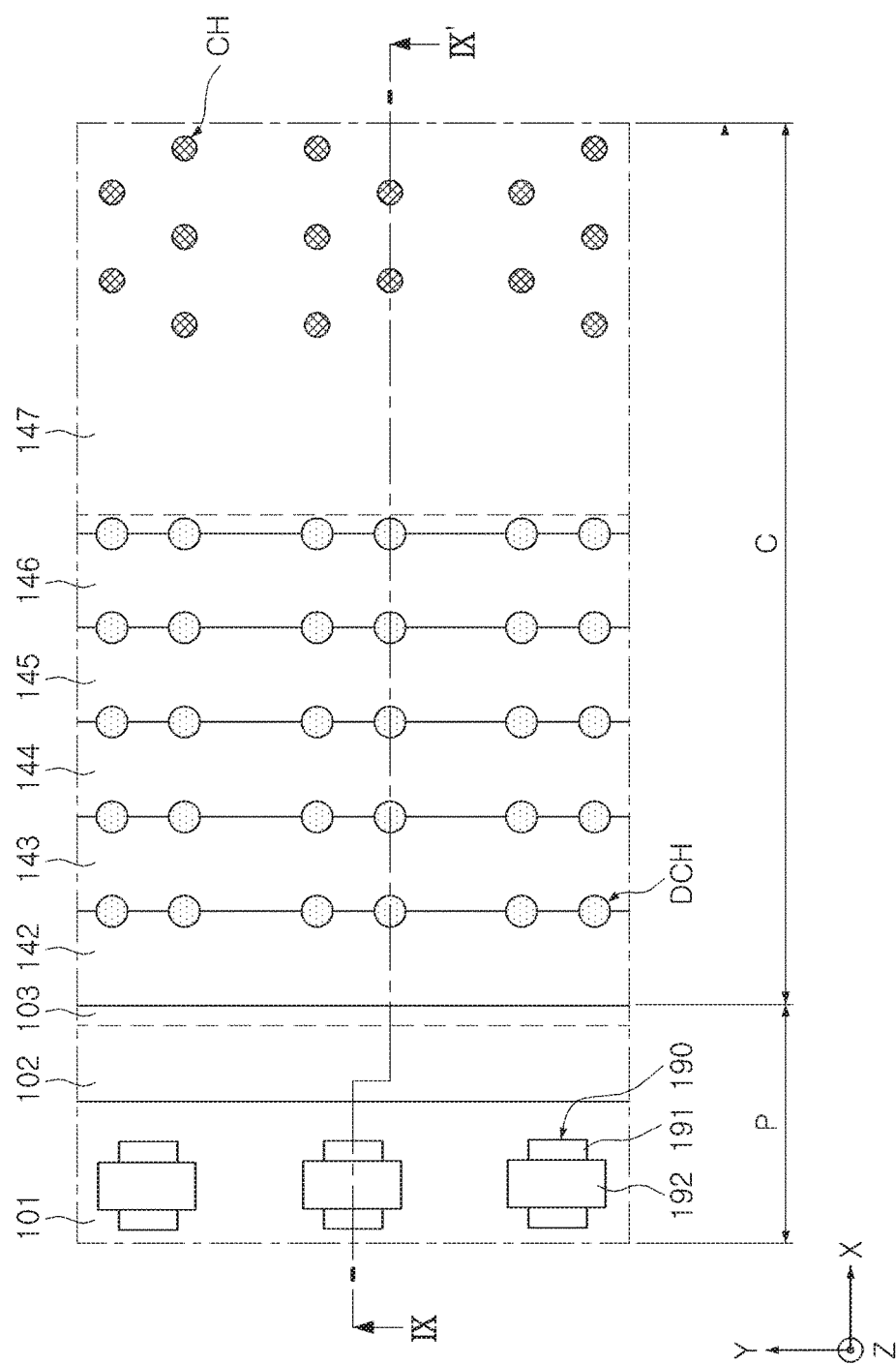
Figure 28:
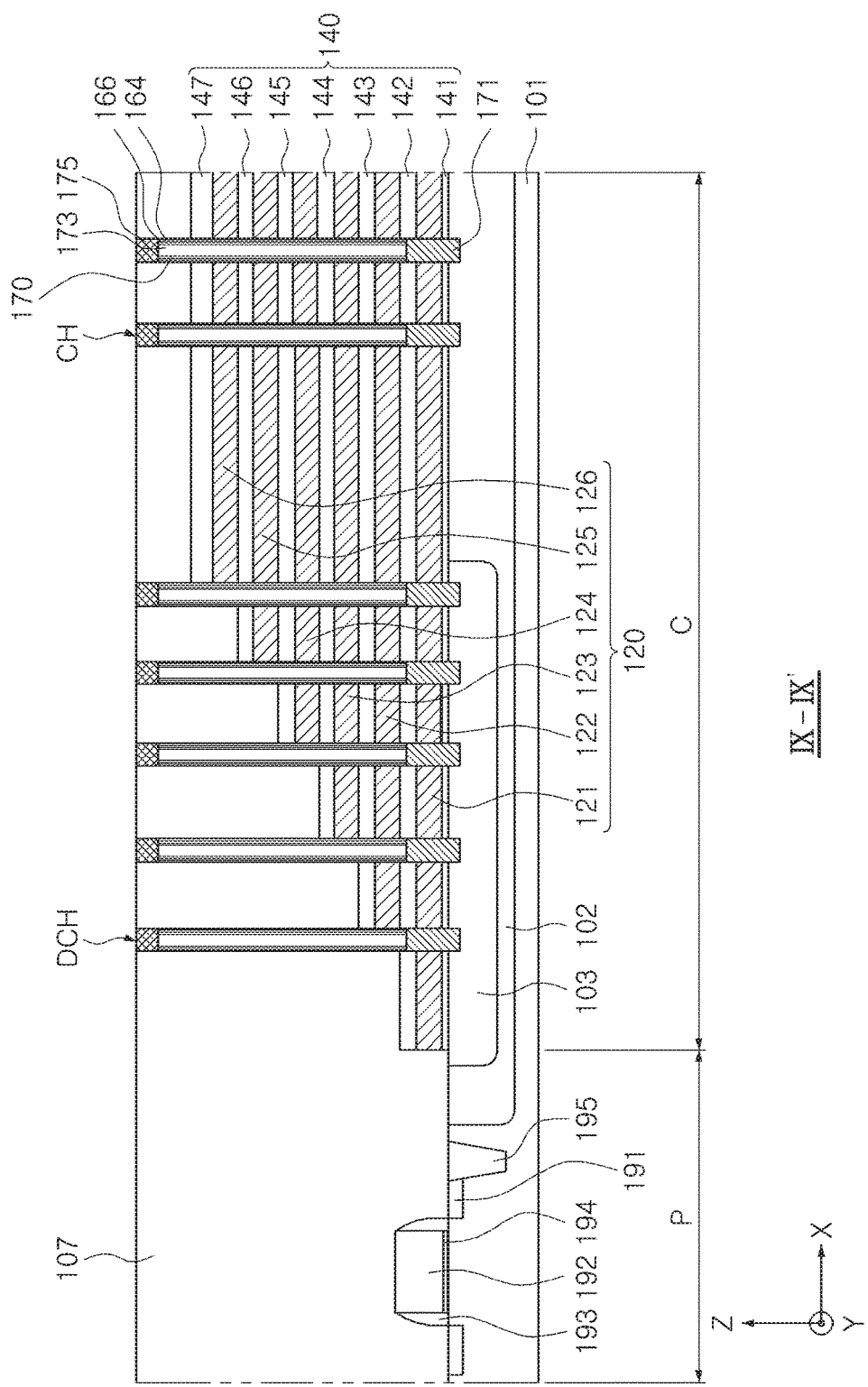

Next, with reference to FIGS. 27 and 28, the channel structure CH and the dummy channel structure DCH passing through the plurality of sacrificial layers 120, the plurality of insulating layers 140, and the interlayer insulating layer 107 may be formed. With reference to FIG. 27, the dummy channel structure DCH may be disposed to be adjacent to one end of the plurality of sacrificial layers 120 and the plurality of insulating layers 140. As the dummy channel structure DCH is disposed to be adjacent to one end of the plurality of sacrificial layers 120 and the plurality of insulating layers 140, the plurality of insulating layers 140 are prevented from collapsing in a process of removing the plurality of sacrificial layers 120 thereafter. A number and a position of the dummy channel structure DCH and the channel structure CH are not limited to that illustrated in FIG. 27, and may be variously changed.

With reference to FIG. 28, the dummy channel structure DCH and the channel structure CH may have structures the same as or similar to each other. The channel structure CH may include the channel layer 170, the embedded insulating layer 173, the drain region 175, the epitaxial layer 171, and the like, and the dummy channel structure DCH may have a structure the same as or similar thereto. The tunneling layer 166 and the charge storage layer 164 may be disposed outside of the channel layer 170.

To form the dummy channel structure DCH and the channel structure CH, channel holes passing through the interlayer insulating layer 107, the plurality of sacrificial layers 120, and the plurality of insulating layers 140 may be formed in advance. The channel hole may be formed to allow the substrate 101 to be etched to a desired (or, alternatively a predetermined) depth. Thus, the partial area of the substrate 101 may be exposed to a lower portion of the channel hole. The epitaxial layer 171 may be formed using a selective epitaxy process in which the exposed partial area of the substrate 101 is used as a seed layer, on the lower portion of the channel hole. The epitaxial layer 171 may be doped P-type or formed P-type insitu. The epitaxial layer 171 may also be doped with carbon.

After the epitaxial layer 171 is formed in the channel hole, the charge storage layer 164 and the tunneling layer 166 may be formed in order inside the channel hole using an atomic layer deposition (ALD) process and a chemical vapor deposition (CVD) process, and the channel layer 170 may be formed inside the tunneling layer 166. The channel layer 170 may have a thickness of about $\frac{1}{50}$ to $\frac{1}{5}$ of a diameter of the channel hole, and may be formed using the ALD process, the CVD process, or the like.

The channel layer 170 may be formed to be a hollow cylinder, and the embedded insulating layer 173 may be formed inside the channel layer 170. Selectively, before the embedded insulating layer 173 is formed, a hydrogen annealing process of heat treating a structure in which the channel layer 170 is formed under a gas atmosphere containing hydrogen or deuterium, may be further performed. Through the hydrogen annealing process, many crystal defects located inside the channel layer 170 may be remedied. Next, the drain region 175 may be formed using a conductive material such as polysilicon, or the like, above the channel layer 170.

Figure 29:
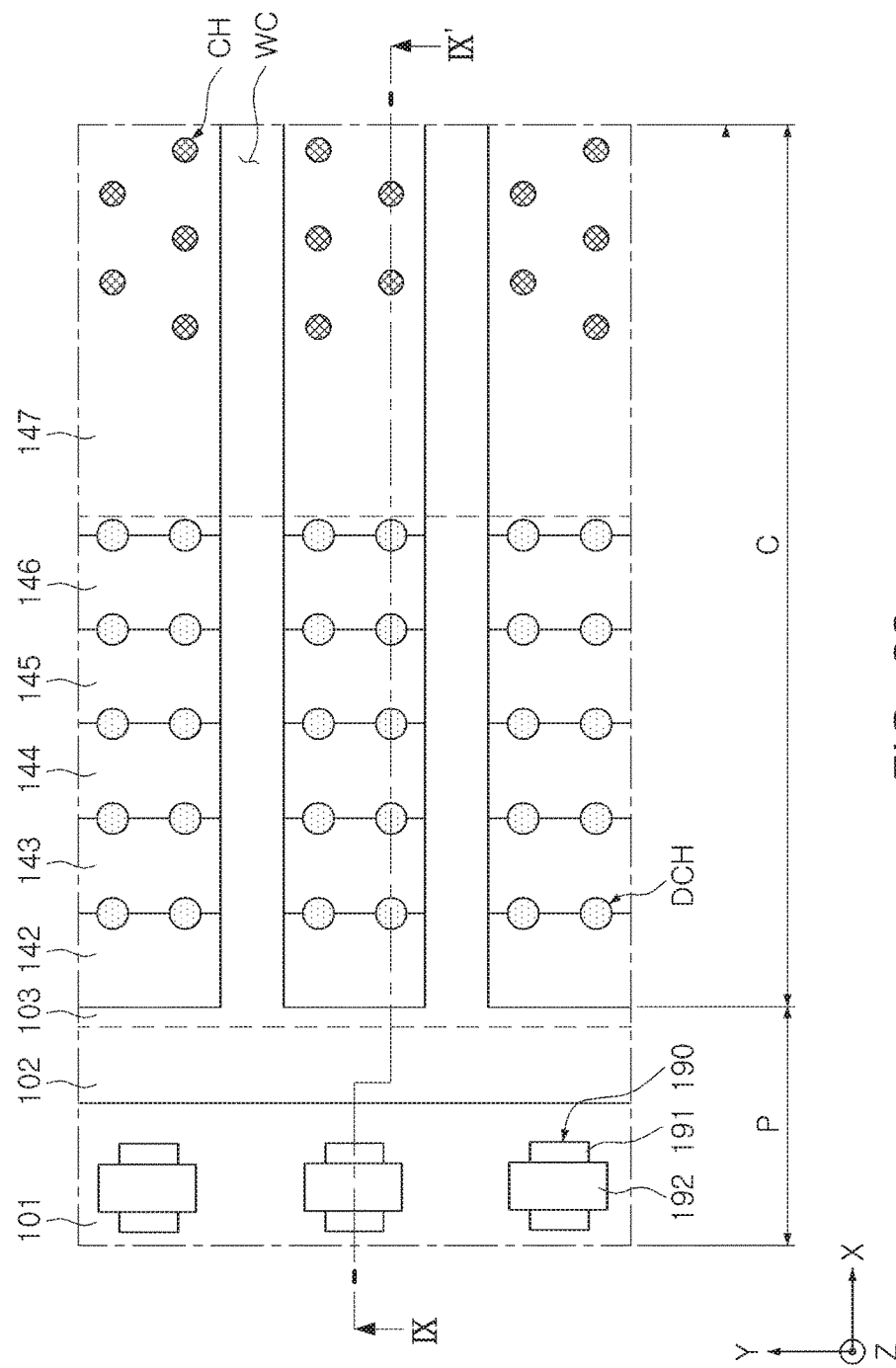
Figure 30:
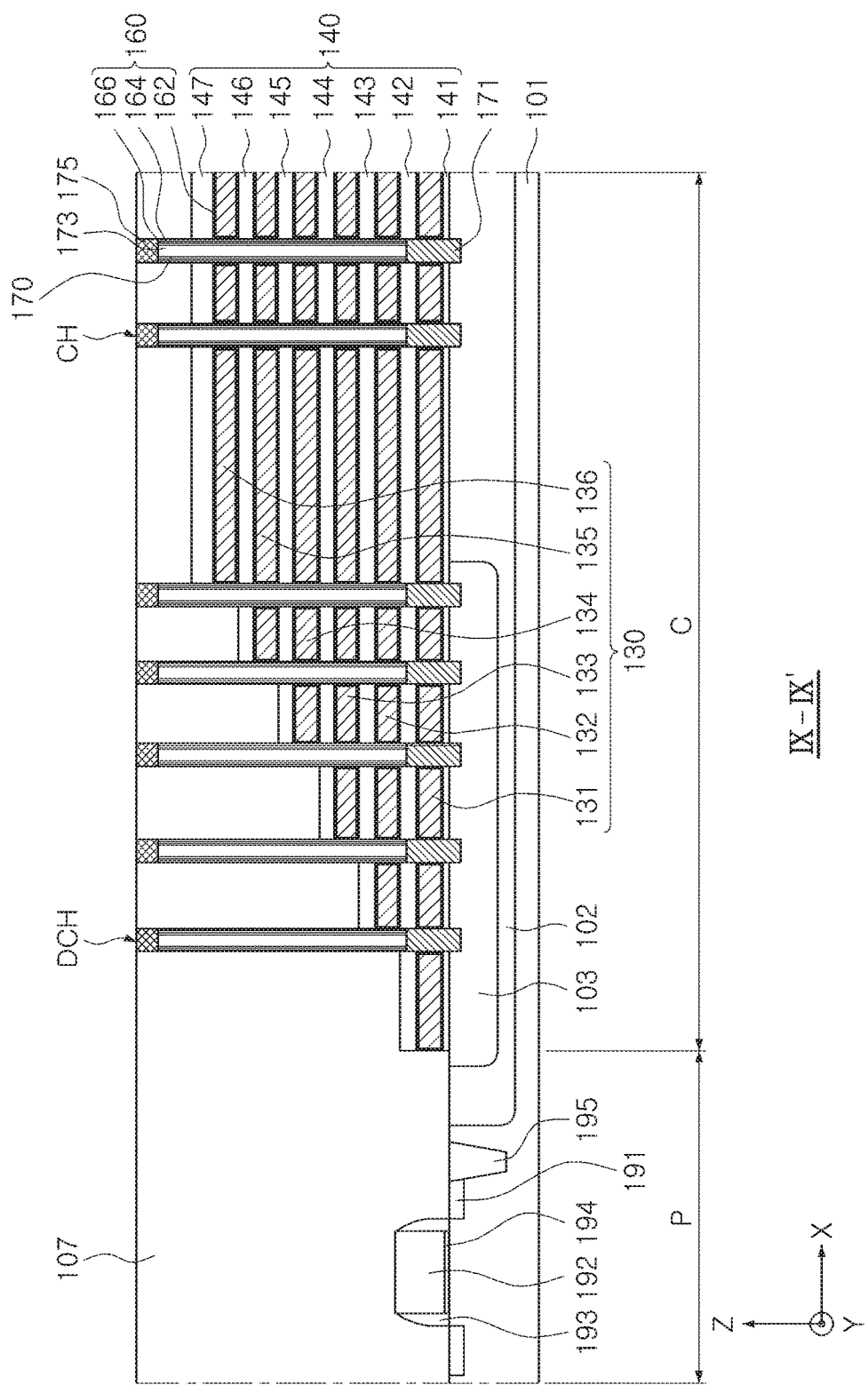

Next, with reference to FIGS. 29 and 30, a word line cut WC is formed, the plurality of sacrificial layers 120 may be replaced with a plurality of gate electrode layers 130 (e.g., gate electrode layers 131 to 136) through the word line cut WC. The plurality of gate electrode layers 130 and the plurality of sacrificial layers 120 may allow a gate structure to be provided. The channel structure CH may be connected to the first region 102 below the gate structure, and the dummy channel structure DCH may be connected to the second region 103 below the gate structure.

By an etching process performed through the word line cut WC, only the plurality of sacrificial layers 120 are removed and the plurality of insulating layers 140 may remain (e.g., a selective wet etching process). The blocking layer 162 and the gate electrode layer 130 may be formed in order in an area from which the plurality of sacrificial layers 120 are removed. The blocking layer 162 may include a high dielectric constant (high-k) dielectric substance, and may include two or more layers. Here, the high dielectric constant dielectric substance means a dielectric material having a dielectric constant higher than a silicon oxide film.

Figure 31:
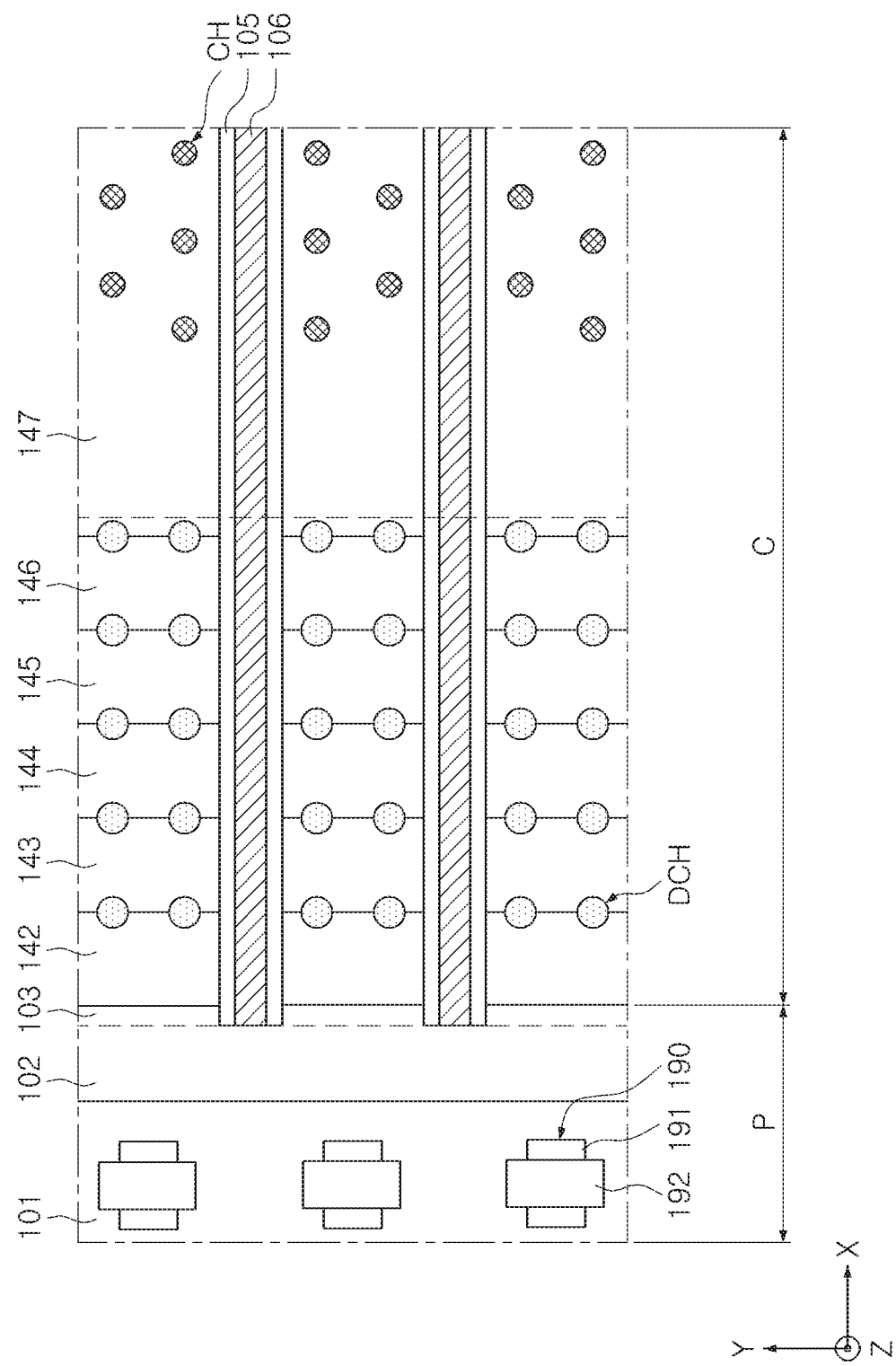

With reference to FIG. 31, the separation insulating layer 105 and the vertical conductive layer 106 may be formed within the word line cut WC. Before the separation insulating layer 105 and the vertical conductive layer 106 are formed, an impurity is injected into a partial area of the substrate 101, exposed by the word line cut WC to form the common source line CSL. For example, the common source line CSL may be formed by injecting an N-type impurity into a partial area of the substrate 101, exposed by the word line cut WC. The vertical conductive layer 106 and the common source line may be electrically connected to each other.

Figure 32:
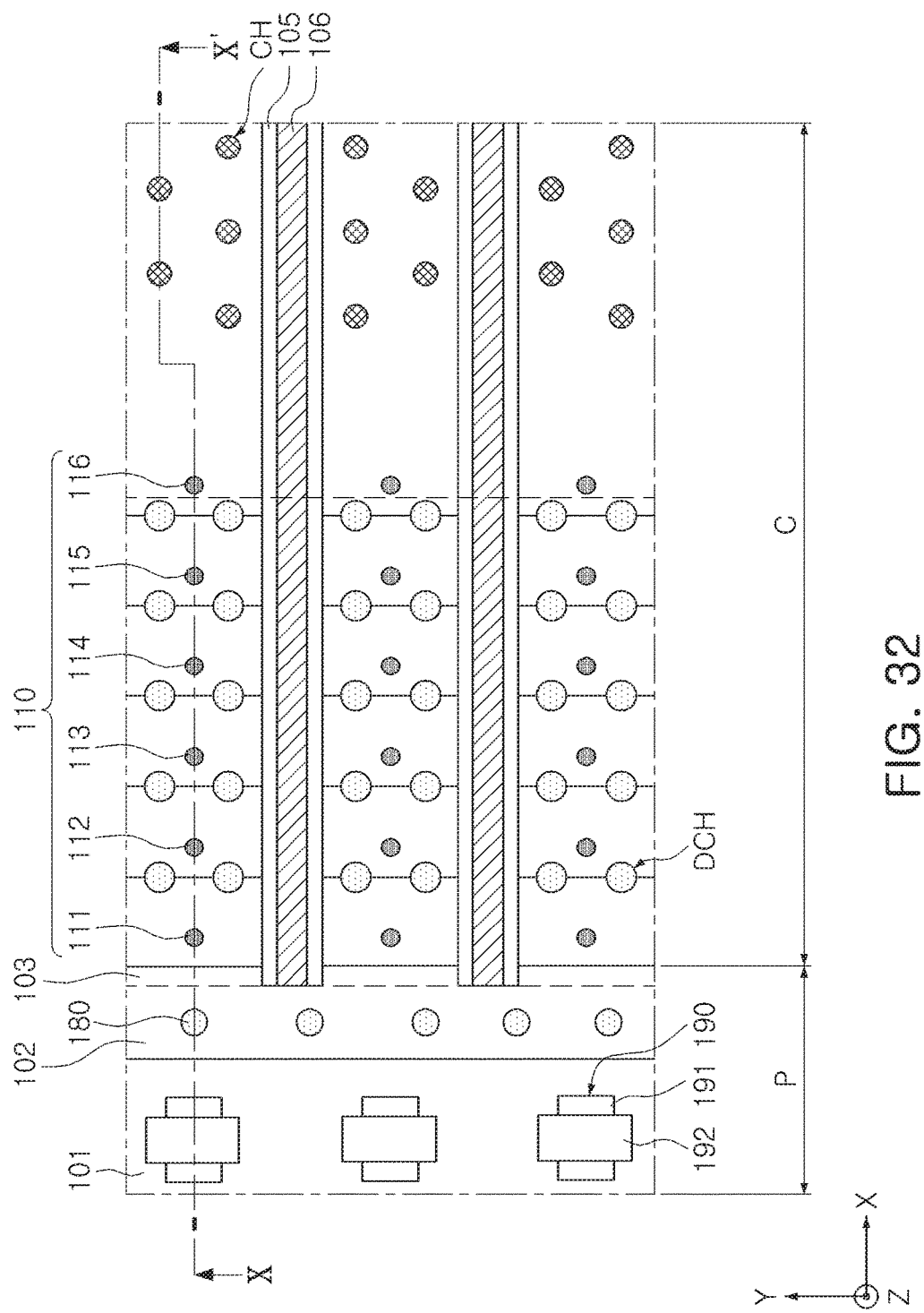
Figure 33:
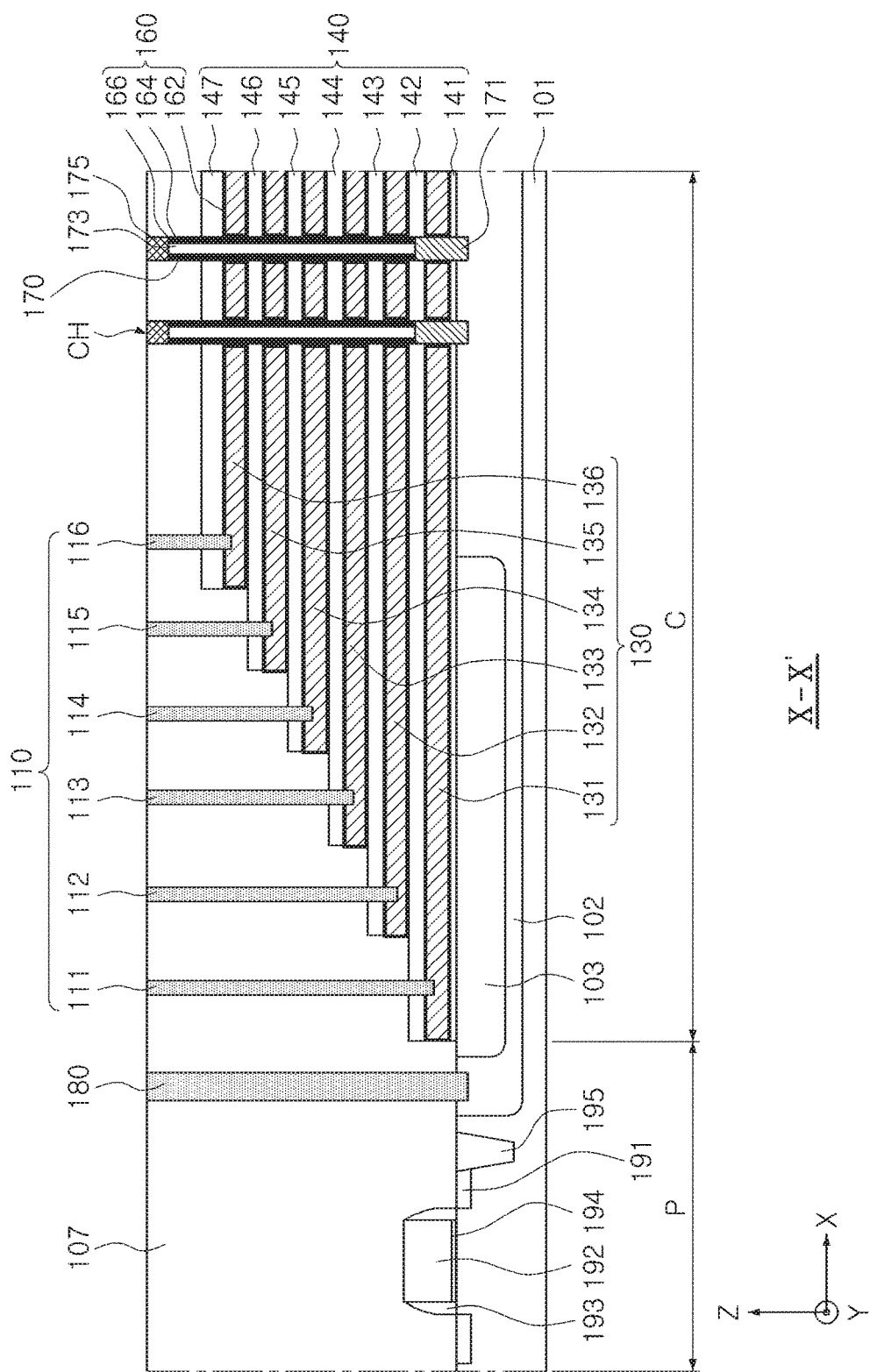

With reference to FIGS. 32 and 33, cross-section line X-X' is the same as in FIG. 7. Here, the plurality of contacts 110 (e.g., contacts 111 to 116) connected to the plurality of gate electrode layers 130, and the well contact 180 may be formed. The plurality of gate electrode layers 130 may extend by different lengths in a first direction (X-direction in FIGS. 32 and 33) to form the stepped structure, and may be connected to the plurality of contacts 110 in a region in which the stepped structure is formed. Meanwhile, with reference to FIG. 33, each of the plurality of contacts 110 passes through one of the plurality of insulating layers 140, the interlayer insulating layer 107, and the blocking layer 162 to be connected to the gate electrode layer 130. However, when the gate electrode layer 130 is located above the insulating layer 140 in the region in which the stepped structure is formed, the plurality of contacts 110 passes through the interlayer insulating layer 107 and the blocking layer 162 to be connected to the gate electrode layer 130.

The well contact 180 may be electrically connected to the first region 102 formed on the substrate 101, and may be formed in a process the same as or different from that of the plurality of contacts 110. The well contact 180 may include a conductive material, for example, tungsten (W), or the like in a manner the same as or similar to the plurality of contacts 110, and may be formed to allow the first region 102 of the substrate 101 to be engraved to a desired (or, alternatively predetermined) depth.

Figure 34:
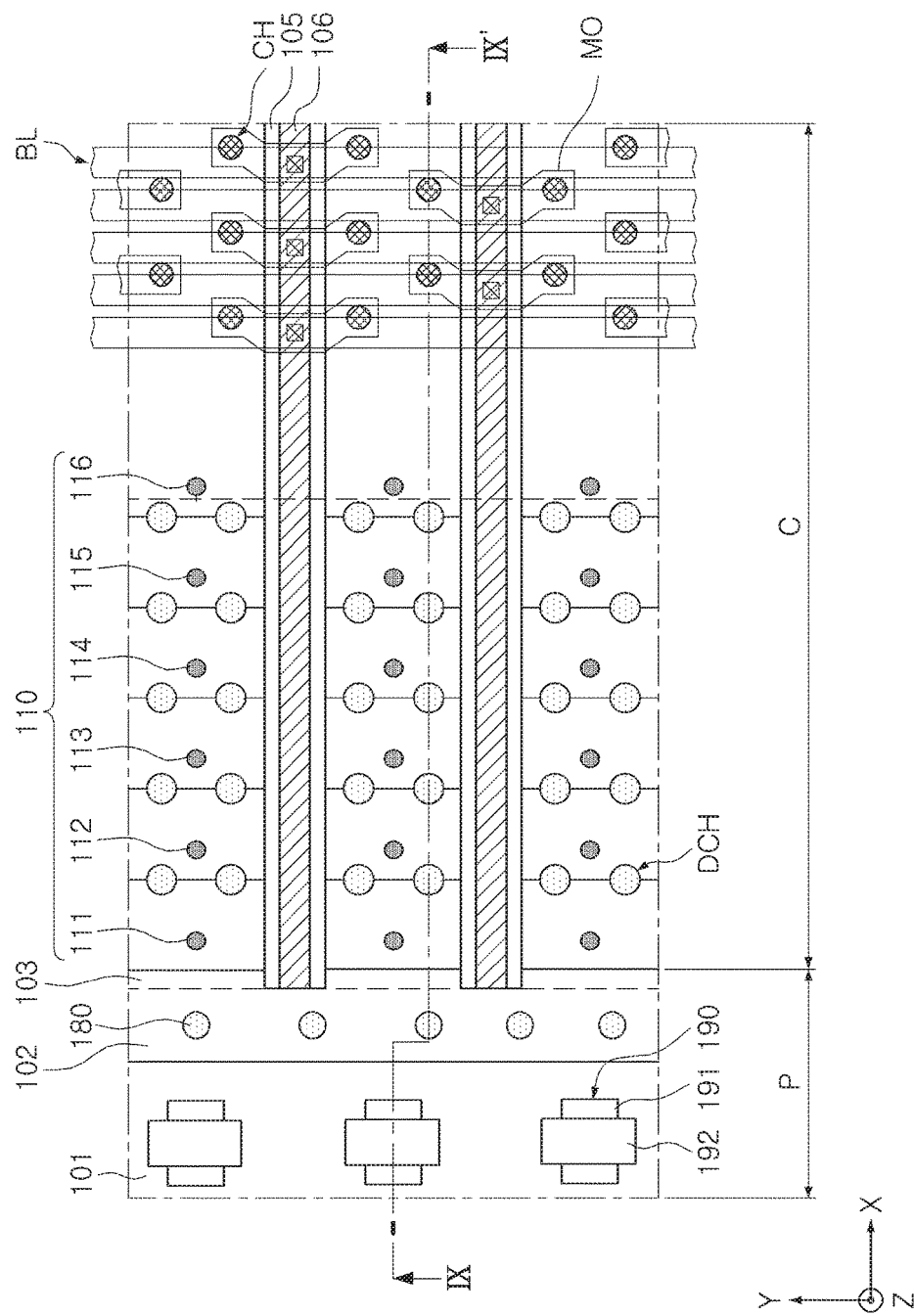
Figure 35:
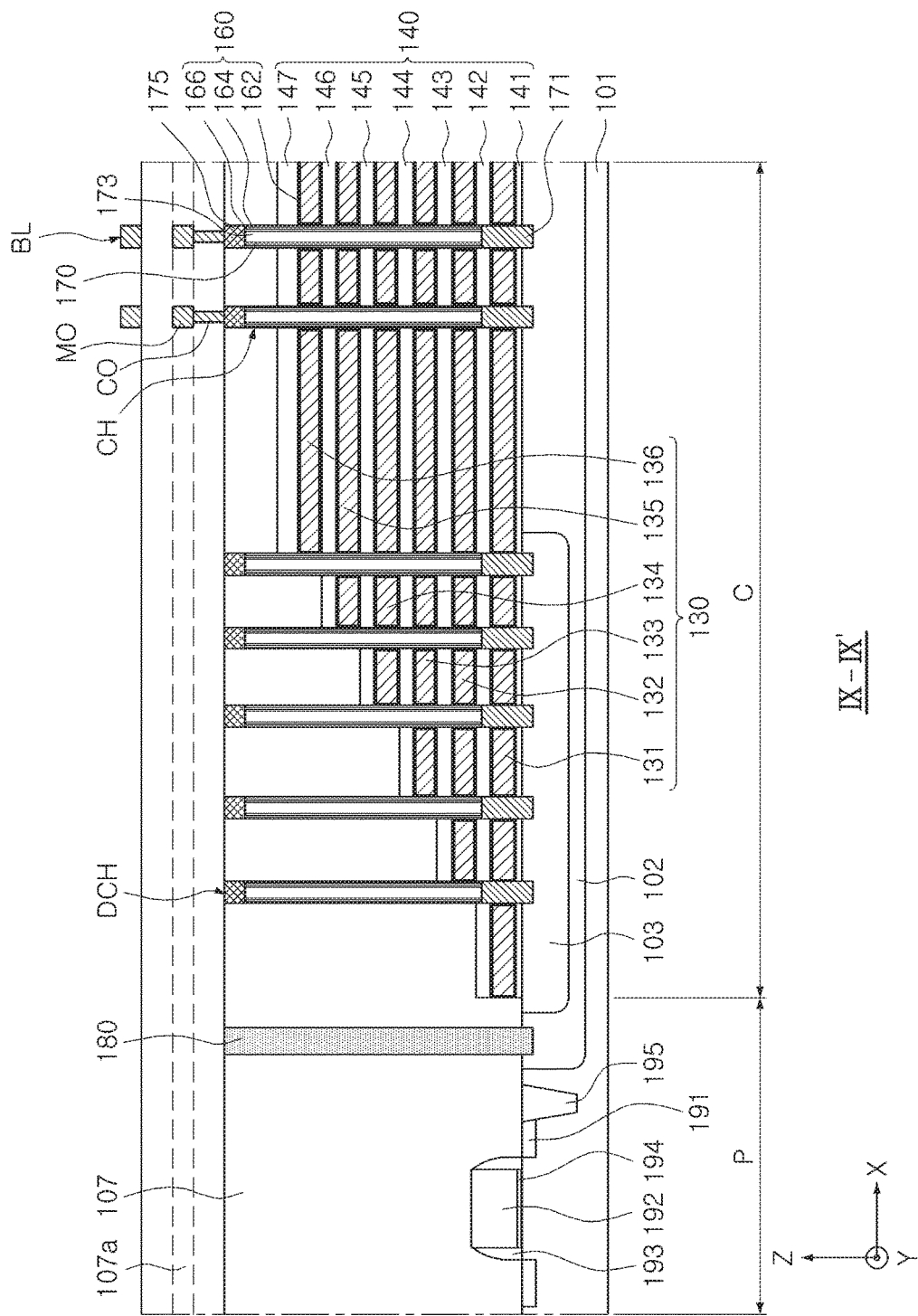

Next, with reference to FIGS. 34 and 35, the bit line BL may be formed on the channel structure CH. The bit line BL may be electrically connected to the drain region 175 of the channel structure CH by the conductive line MO and the contact C0 formed inside of an upper insulating layer 107a. The conductive line MO and the contact C0 may be embedded in the upper insulating layer 107a. In an example embodiment, two channel structures CH symmetrically disposed with the separation insulating layer 105 and the vertical conductive layer 106 interposed there between may be commonly connected to one conductive line MO to be connected to one bit line BL. In addition, as illustrated in FIG. 35, the dummy channel structure DCH may be electrically separated from the bit line BL.

As the dummy channel structure DCH is separated from the bit line BL, writing operations of writing data may only be executed in a memory cell provided by the channel structure CH. On the other hand, as erasing operations of erasing data are executed by an erase voltage VERA applied through the well contact 180, the erasing operations may be executed even in a memory cell provided by the dummy channel structure DCH. Thus, as the memory device 100 may repeatedly perform writing and erasing operations and the like, only erasing operations are executed in the dummy channel structure DCH, whereby without second region 103 holes may be gradually accumulated and trapped in the charge storage layer 164 included in the dummy channel structure DCH and characteristics degradation of the dummy channel structure DCH may be caused.

In an example embodiment, the second region 103 having an impurity characteristic different from the first region 102 is disposed below the dummy channel structure DCH to solve a problem described above. The second region 103 may include an impurity in a concentration lower than the first region 102, or may include an impurity having a conductivity opposite to a conductivity of the first region 102. Thus, when the erase voltage VERA is applied through the well contact 180, an amount of holes trapped in the charge storage layer 164 included in the dummy channel structure DCH may be significantly reduced, and thus, a problem such as characteristics degradation, or the like may be solved.

As described with reference to FIG. 18, program operations of a single pulse are executed for each constant period, or whenever a number of executing erasing operations reaches a desired (or, alternatively a predetermined) threshold level, to solve a problem such as characteristics degradation of the dummy channel structure DCH. The program operations of a single pulse may be executed under conditions of a bias voltage described in Table 4. By the program operations of a single pulse, an equivalent effect may be obtained, as data may even be written to a memory cell provided by the dummy channel structure DCH. Thus, the effect may offset that only erasing operations are repeatedly performed in a memory cell provided by the dummy channel structure DCH.

FIGS. 36 to 47 are views illustrating main processes of a method of manufacturing the memory device illustrated in FIGS. 11 to 14.

Figure 36:
FIGS. 36 to 47 are views provided to illustrate main processes of a method of manufacturing a memory device illustrated in FIGS. 11 to 14.
Figure 37:
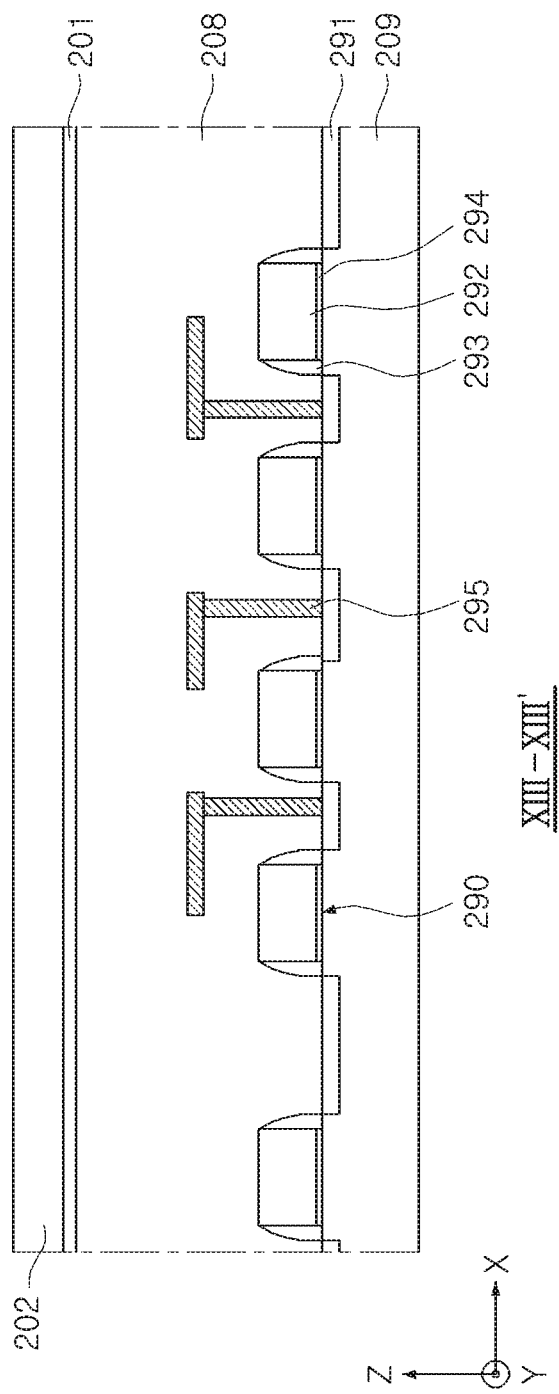

FIG. 37 is a cross-sectional view illustrating a cross section taken along line XIII-XIII' in FIG. 36, where line XIII-XIII' is the same as in FIG. 11. With reference to FIGS. 36 and 37, the first substrate 201 may be formed to form the cell region C on the peripheral circuit region P. The peripheral circuit region P may include the second substrate 209, the plurality of peripheral circuit devices 290 formed on the second substrate 209, the second interlayer insulating layer 208, and the like, and the first substrate 201 may be formed on the second interlayer insulating layer 208.

The first substrate 201 may include the first region 202 doped with an impurity. In an example embodiment, the first region 202 may include a P-type impurity, and may be provided as a pocket P-well region. During erasing operations of the memory device, data stored in the memory cell may be erased by an erase voltage VERA applied to the first region 202.

Figure 38:
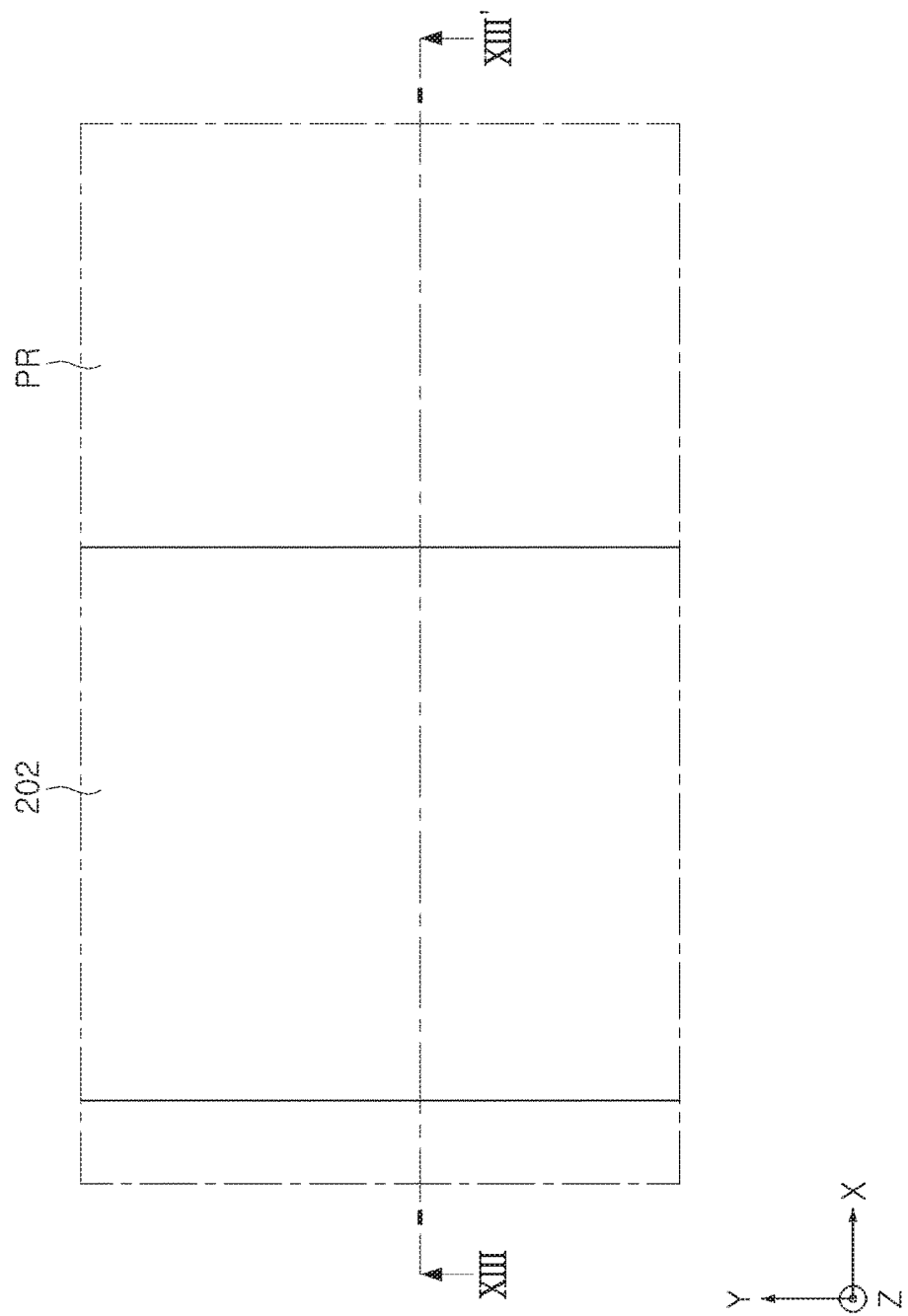
Figure 39:
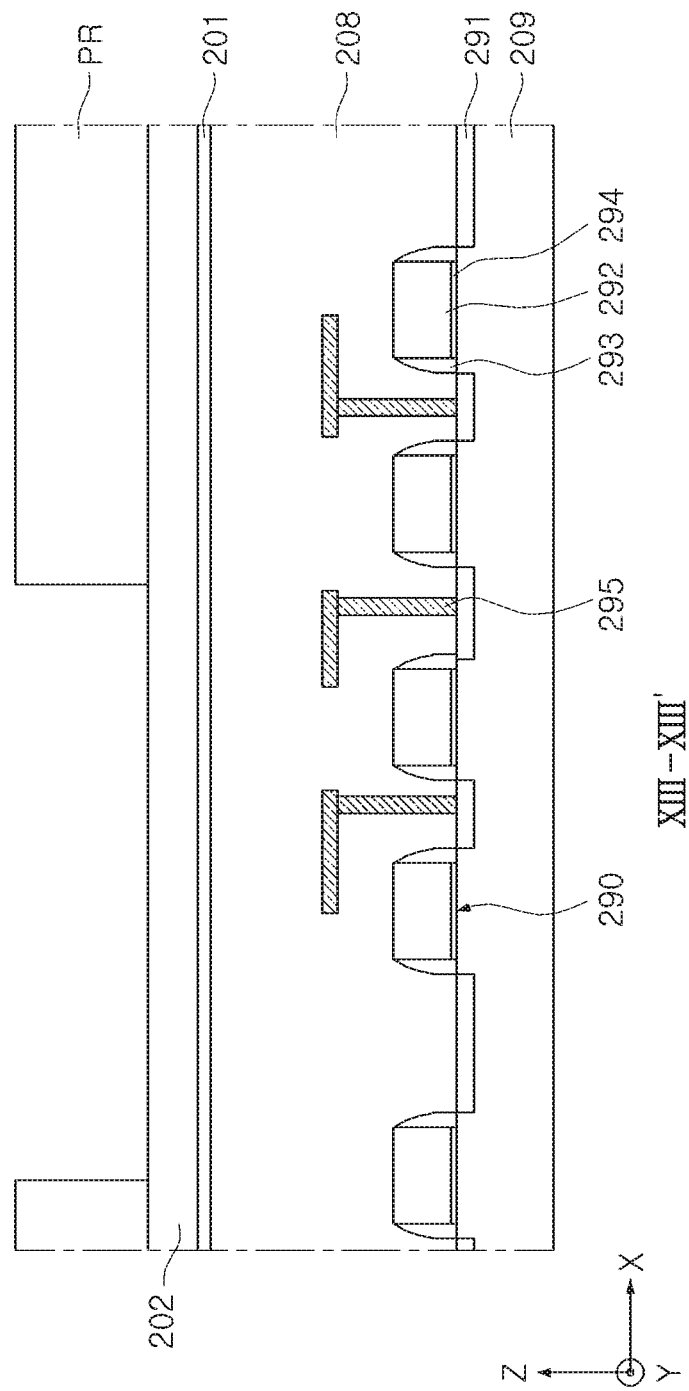
Figure 40:
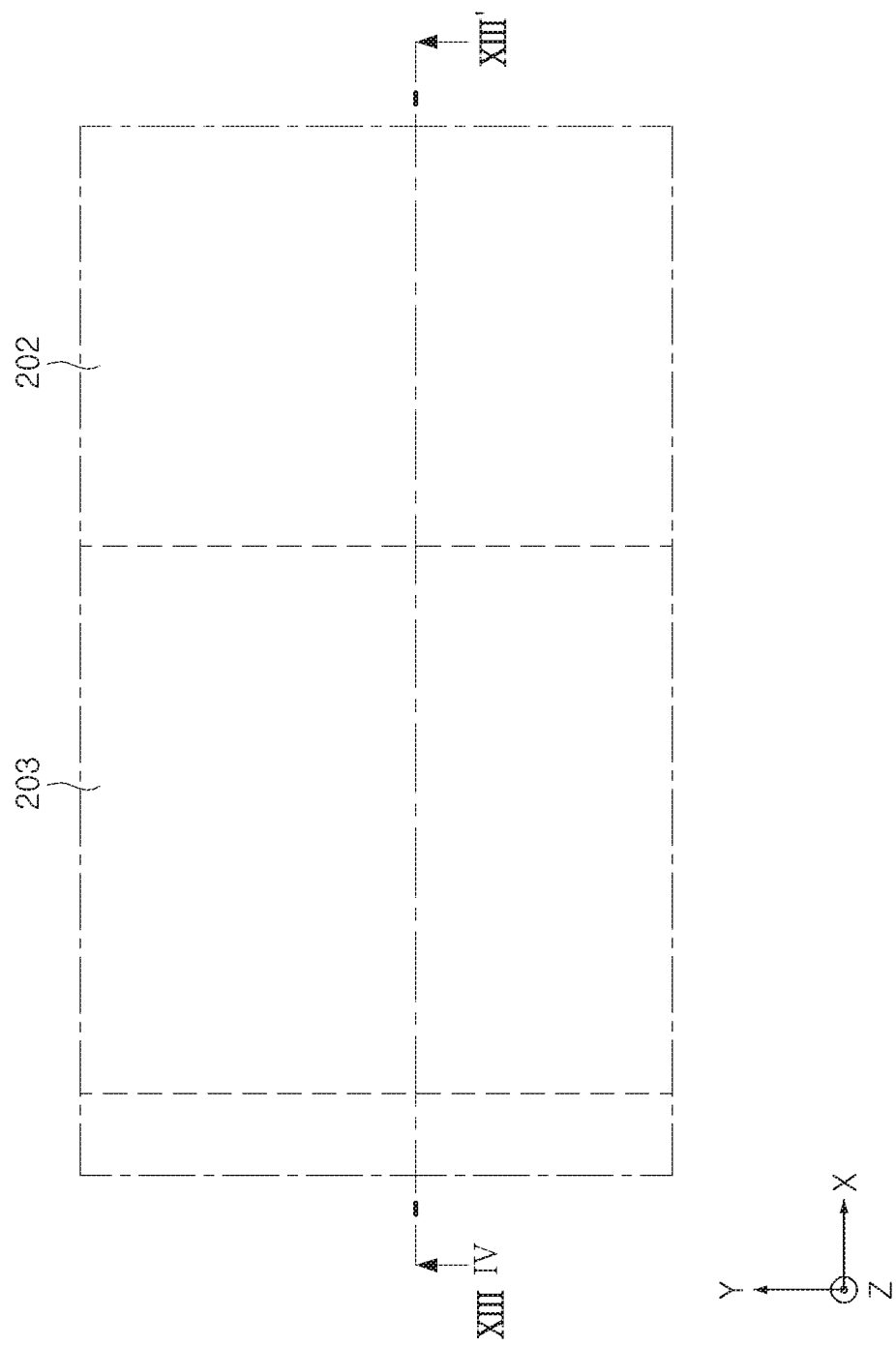
Figure 41:
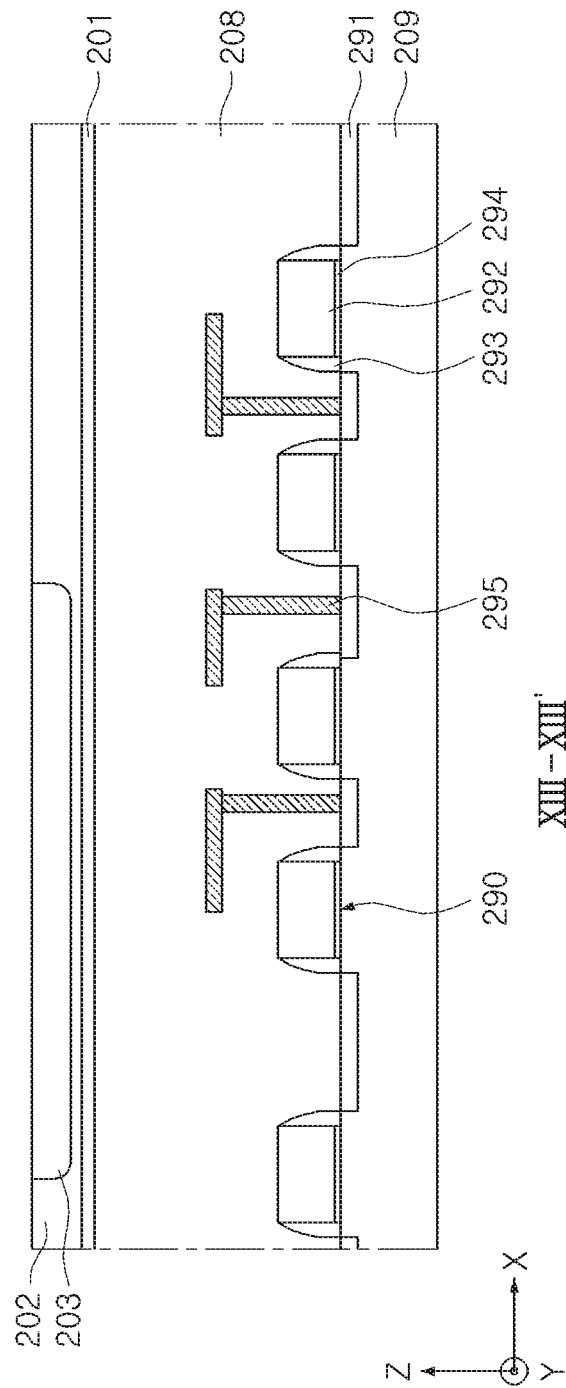

With reference to FIGS. 38 and 39, the mask PR, allowing only a portion of the first region 202 to be exposed, may be formed on the first substrate 201. Next, with reference to FIGS. 40 and 41, an impurity is injected into a partial area of the first region 202, exposed by the mask PR to form the second region 203. Through a series of processes described above, the second region 203 may have an impurity characteristic different from the first region 202. The second region 203 may include an N-type impurity, or may include a P-type impurity in a concentration lower than that of the first region 202.

Figure 42:
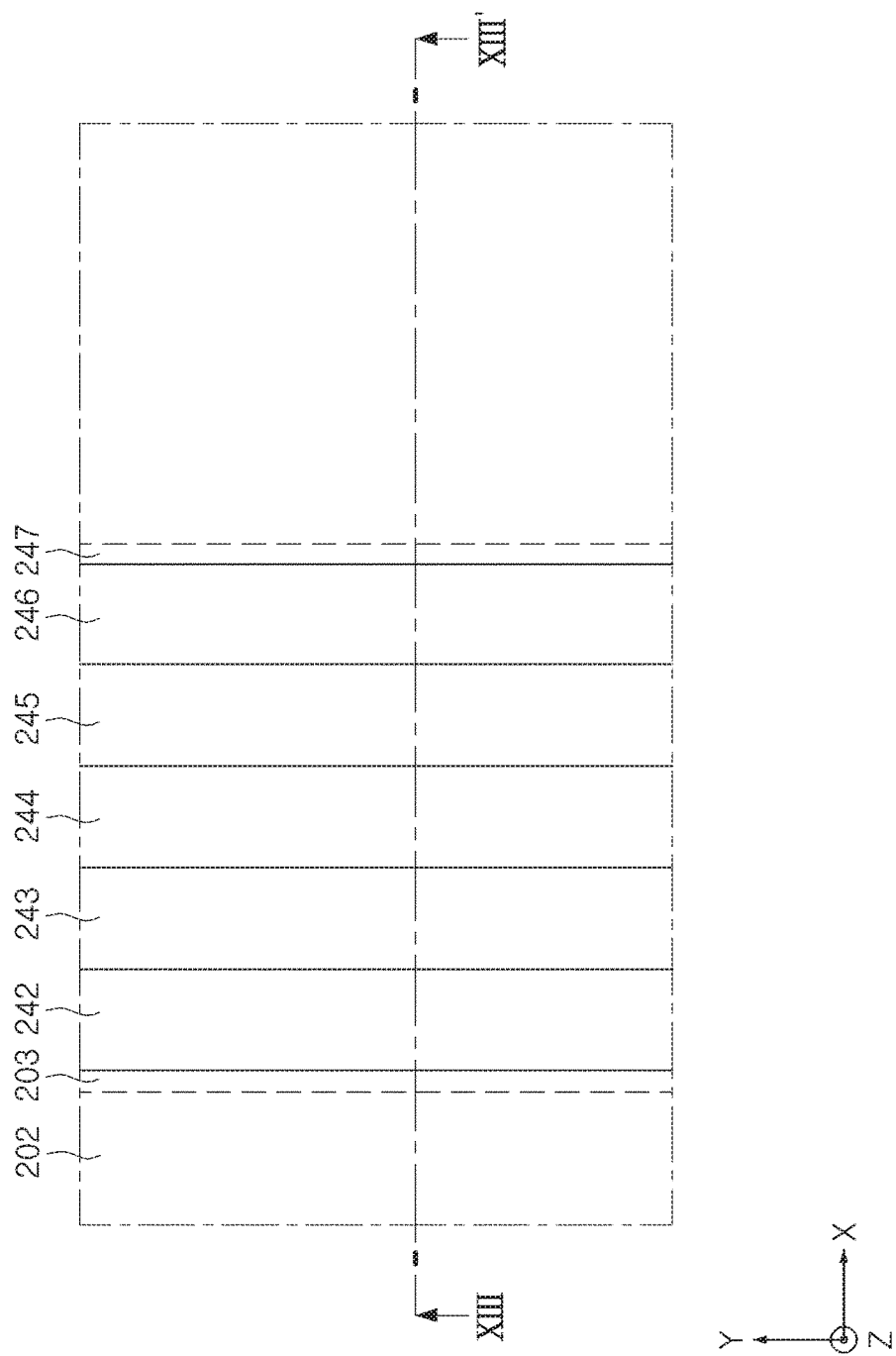
Figure 43:
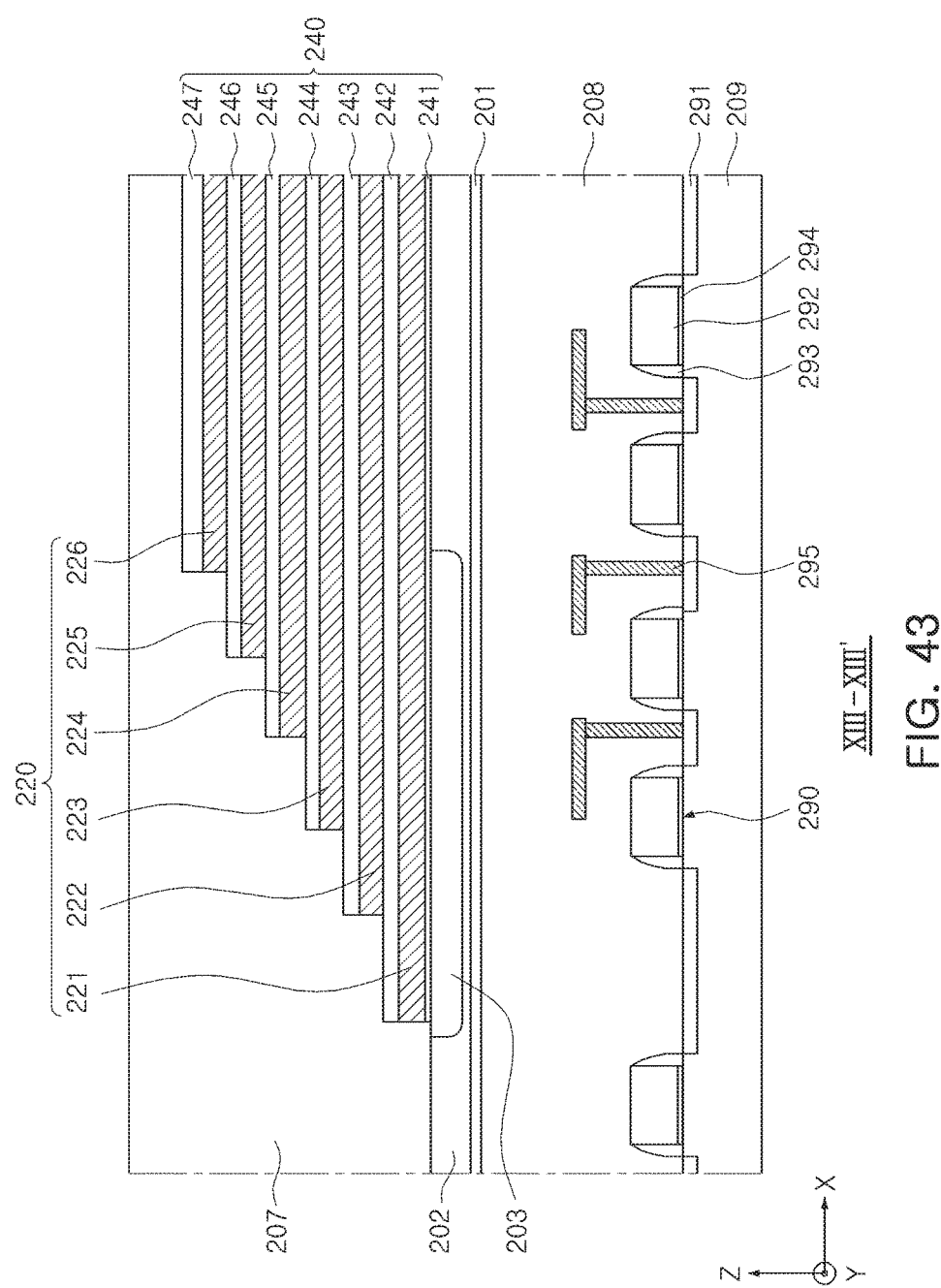

With reference to FIGS. 42 and 43, a plurality of sacrificial layers 220 (e.g., sacrificial layers 221 to 226), a plurality of insulating layers 240 (e.g., insulating layers 241 to 247), a first interlayer insulating layer 207, and the like may be formed. The plurality of sacrificial layers 220, the plurality of insulating layers 240, and the first interlayer insulating layer 207 may be formed using a process the same as or similar to that described with reference to FIGS. 25 and 26.

Figure 44:
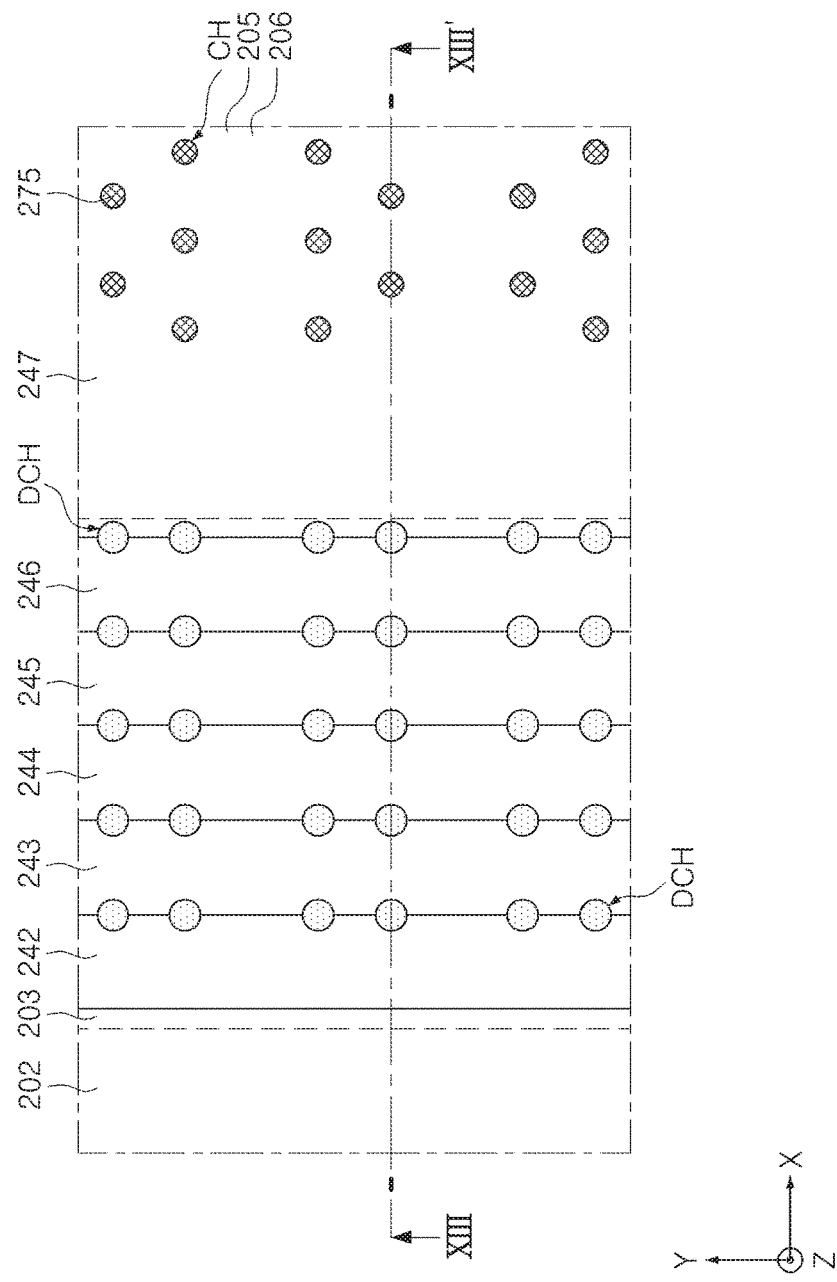
Figure 45:
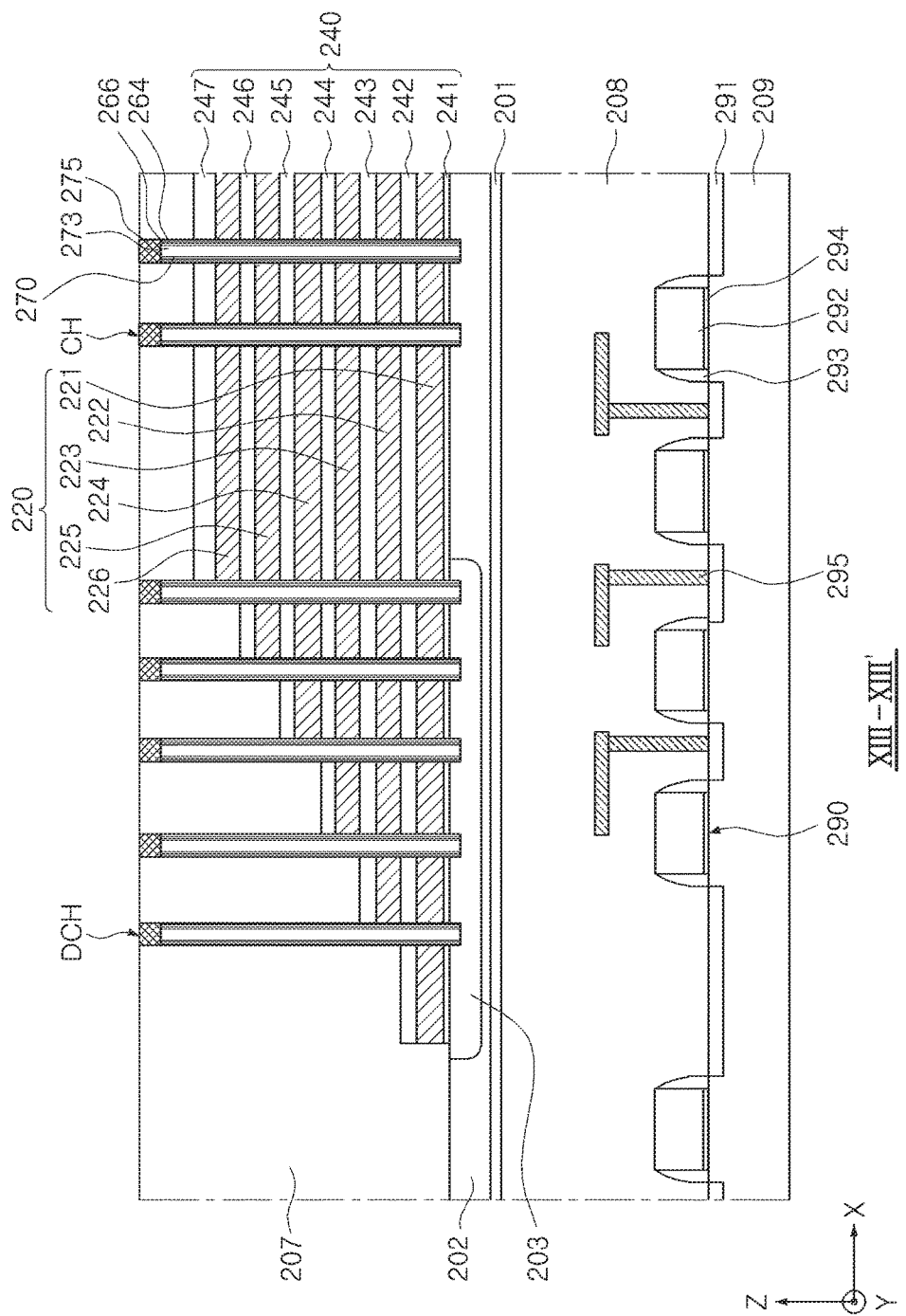

Next, with reference to FIGS. 44 and 45, the dummy channel structure DCH and the channel structure CH may be formed. The dummy channel structure DCH and the channel structure CH may pass through the first interlayer insulating layer 207, the plurality of sacrificial layers 220, and the plurality of insulating layers 240, and may be formed to allow the first substrate 201 to be etched. The dummy channel structure DCH and the channel structure CH may be formed by a process the same as or similar to that described with reference to FIGS. 27 and 28. However, in an example embodiment illustrated in FIGS. 44 and 45, a selective epitaxy process for formation of the epitaxial layer 171 may be omitted.

Figure 46:
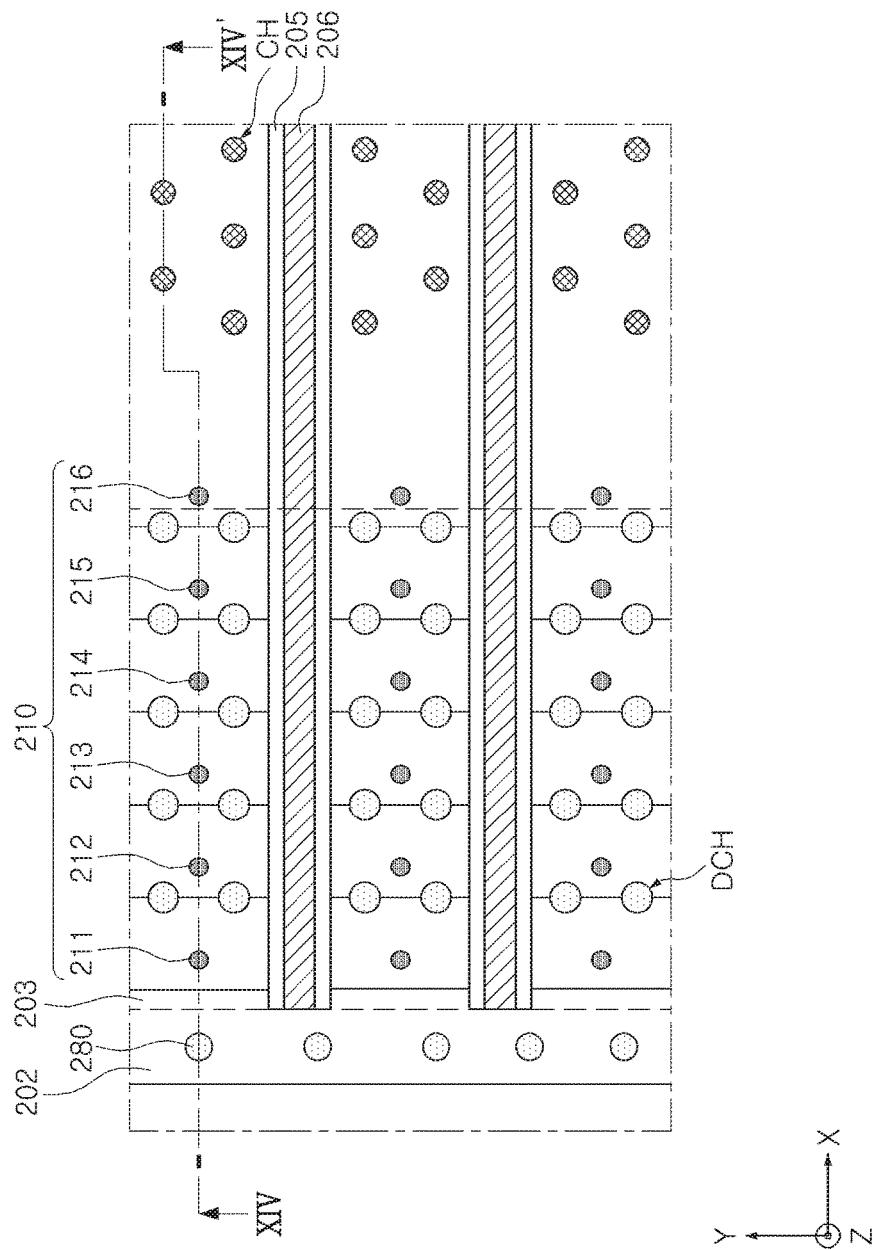
Figure 47:
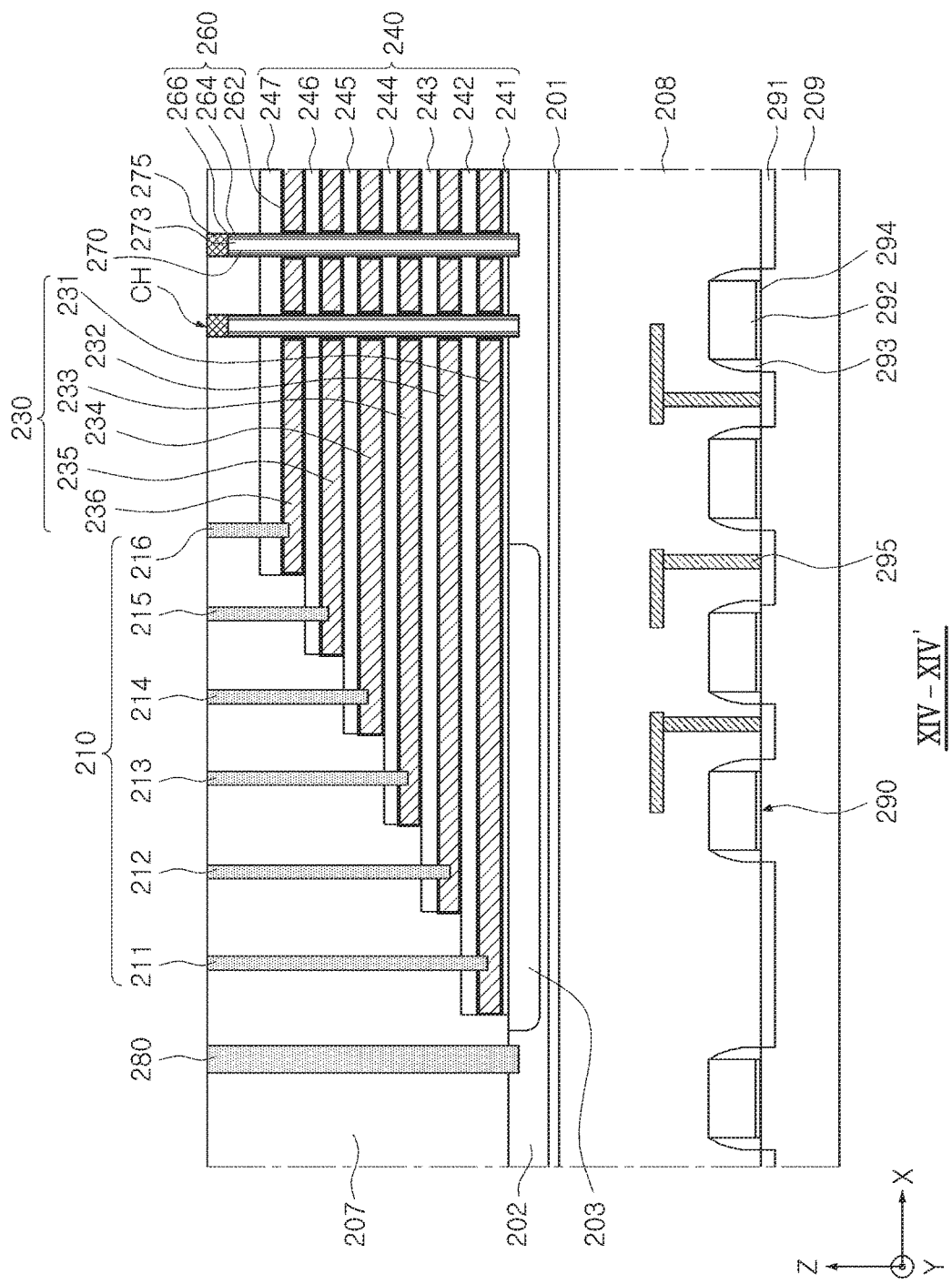

Next, with reference to FIGS. 46 and 47, a blocking layer 262, a plurality of gate electrode layers 230 (e.g., gate electrode layers 231 to 236), the separation insulating layer 205, the vertical conductive layer 206, a plurality of contacts 210 (e.g., contacts 211 to 216), and the like may be formed. The blocking layer 262, the plurality of gate electrode layers 230, the separation insulating layer 205, the vertical conductive layer 206, and the plurality of contacts 210 may be formed by a process the same as or similar to that previously described in FIGS. 29 to 35.

FIGS. 48 to 59 are views provided to illustrate main processes of a method of manufacturing the memory device illustrated in FIGS. 15 to 17. Line XVI-XVI' is the same as in FIG. 15.

Figure 48:
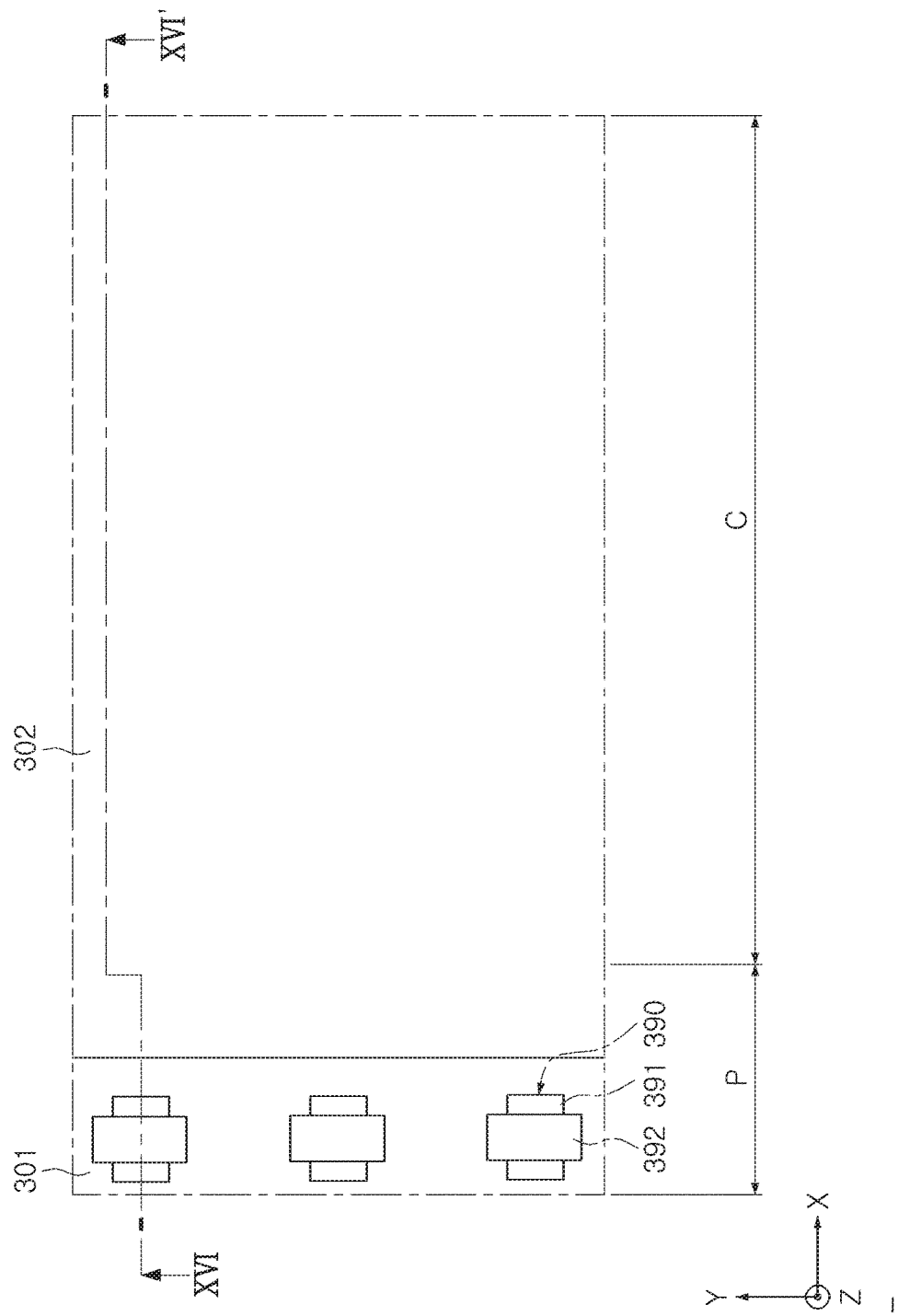
FIGS. 48 to 59 are views provided to illustrate main processes of a method of manufacturing a memory device illustrated in FIGS. 15 to 17.
Figure 49:
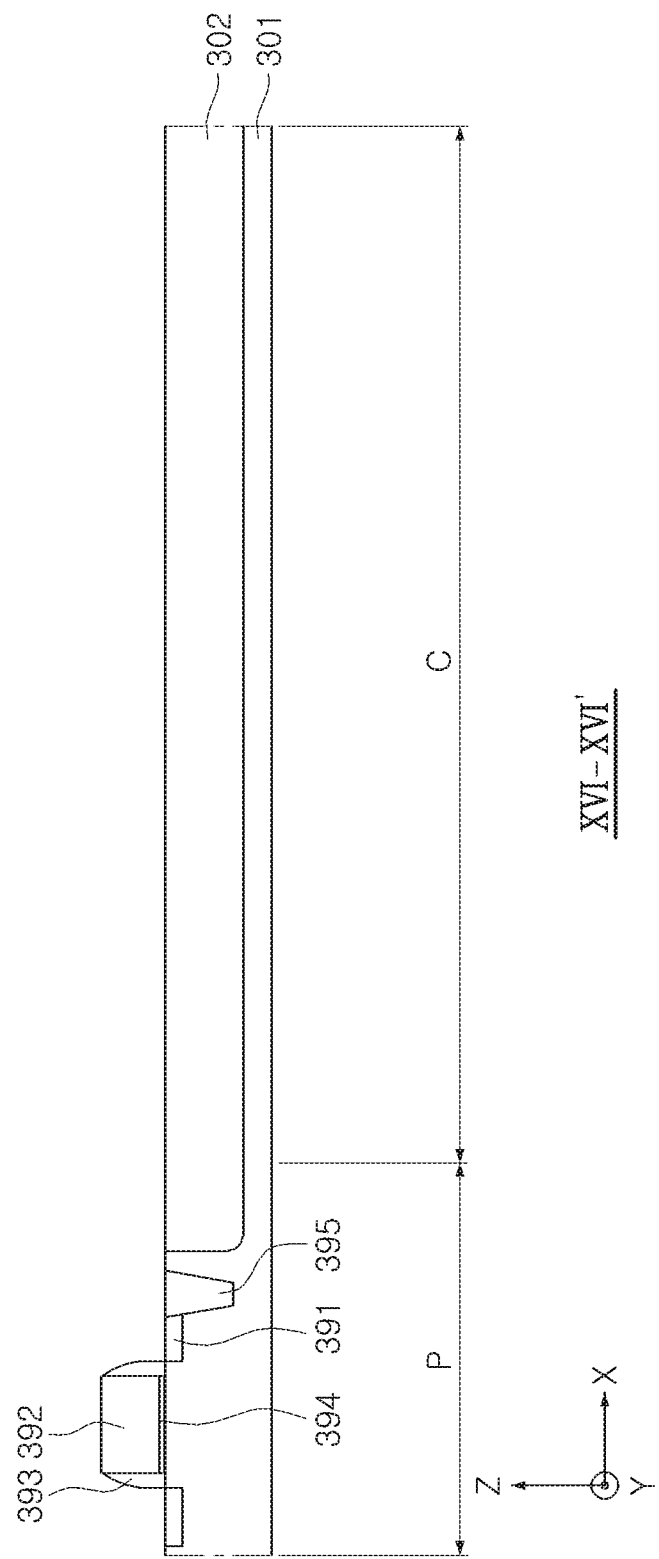

With reference to FIGS. 48 and 49, a plurality of peripheral circuit devices 390 may be formed on the substrate 301. A peripheral circuit device 390 may include a source/drain region 391, a horizontal gate electrode layer 392, a horizontal gate spacer 393, a horizontal gate insulating layer 394, and the like, and a device isolation layer 395 may be formed between the plurality of peripheral circuit devices 390. The peripheral circuit device 390 may be disposed in the peripheral circuit region P.

The substrate 301 may include the first region 302. The first region 302 may be a region formed over the cell region C and the peripheral circuit region P, or a region formed in the cell region C. The first region 302 may be a region doped with a P-type impurity, and may be provided as a pocket P-well region required for operations of the memory device.

Figure 50:
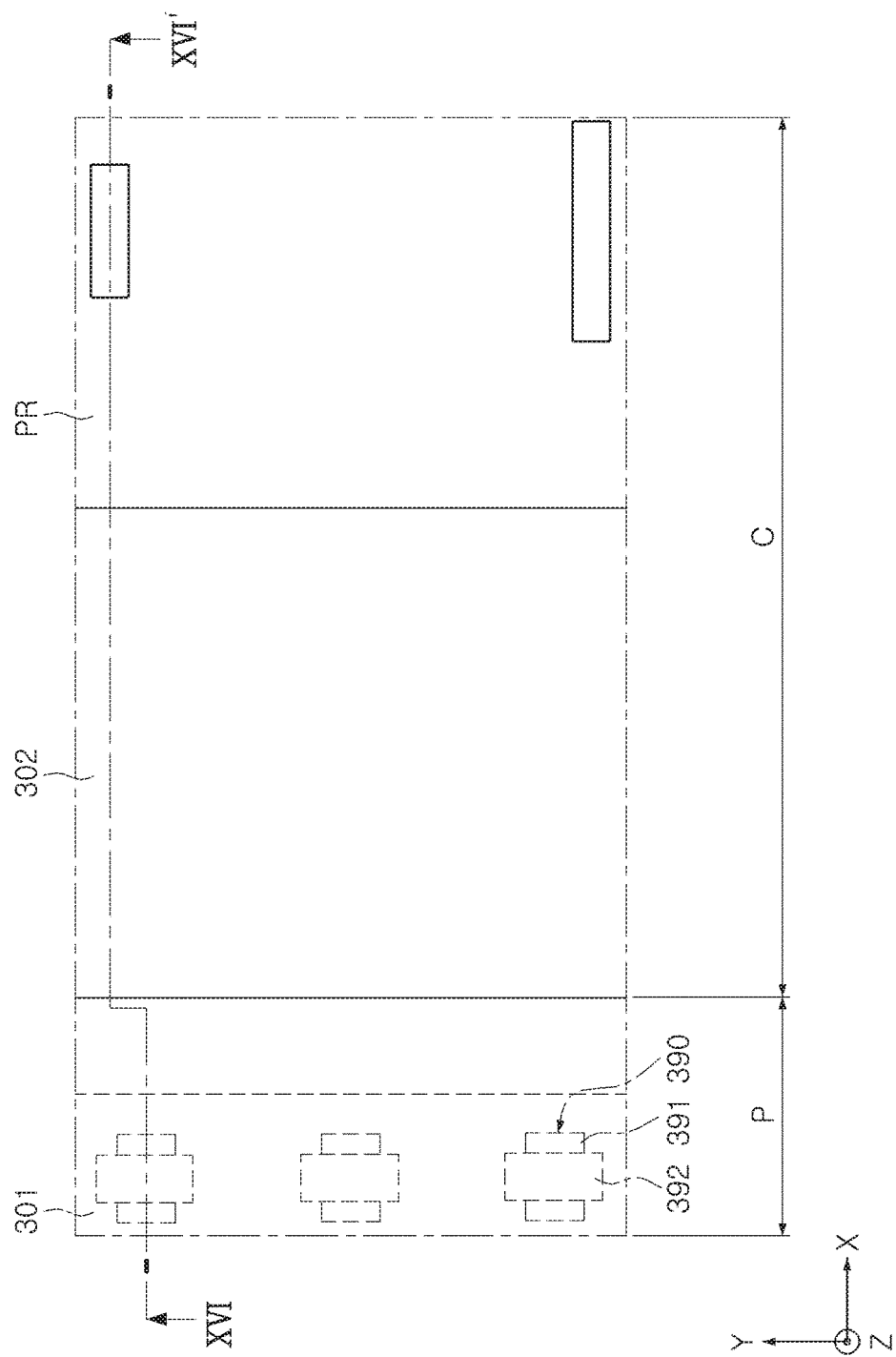
Figure 51:
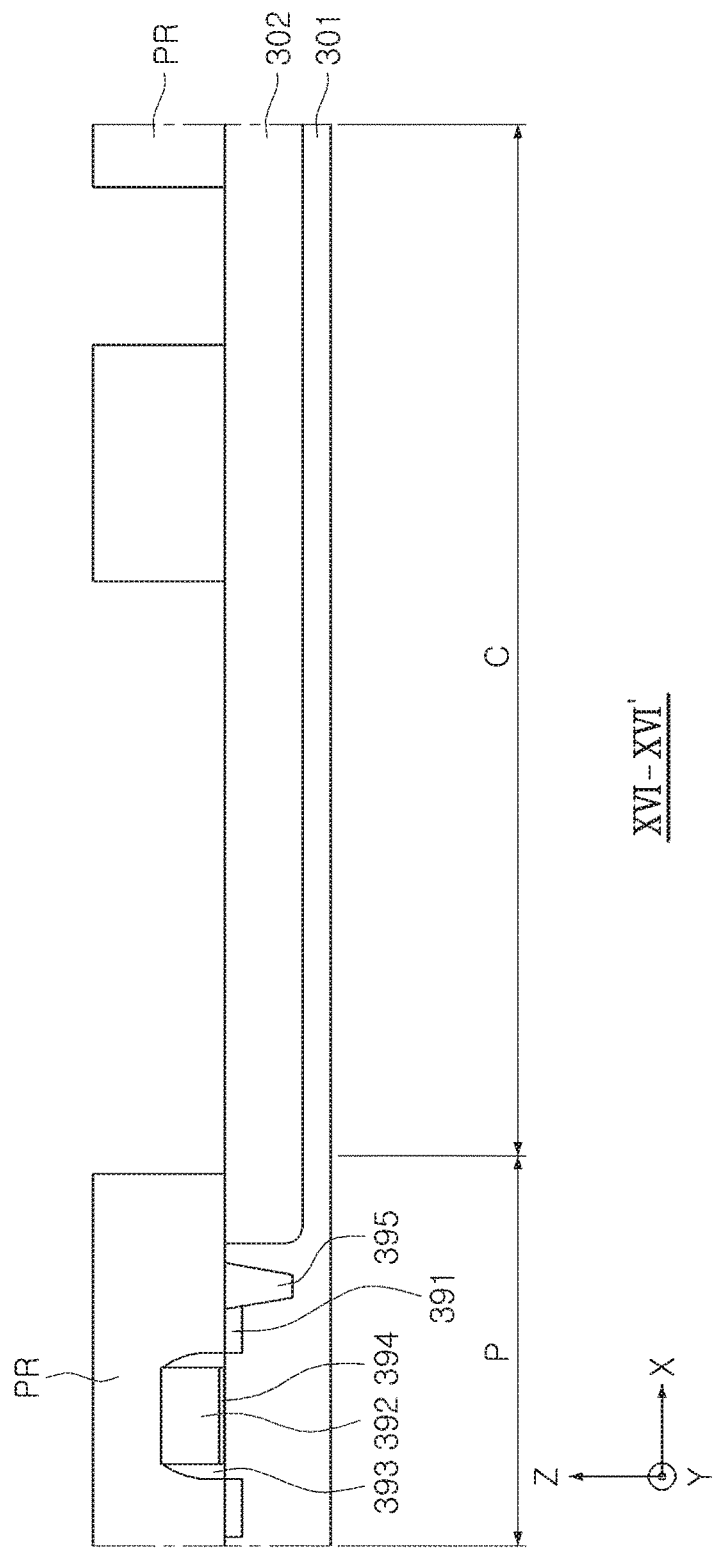
Figure 52:
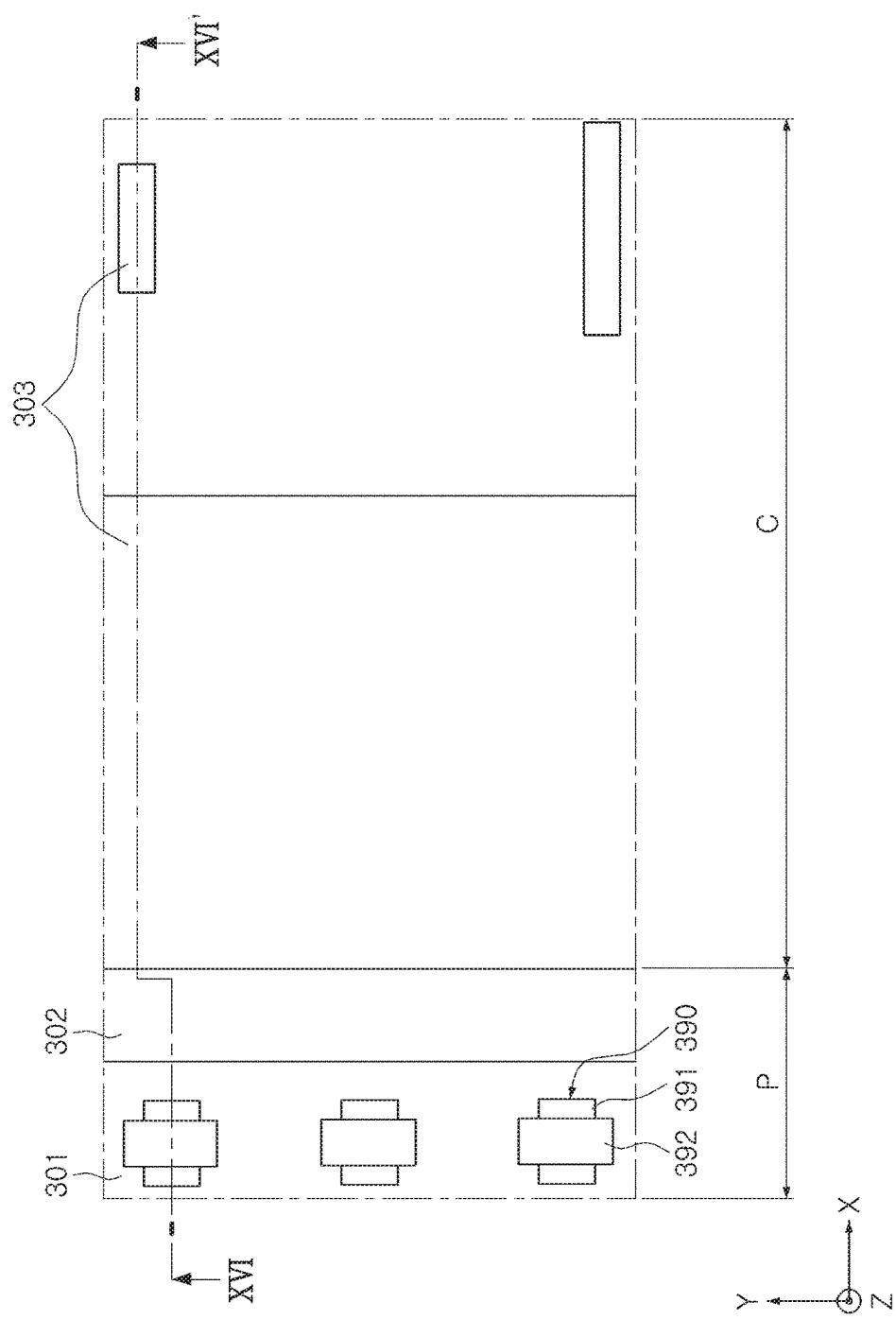
Figure 53:
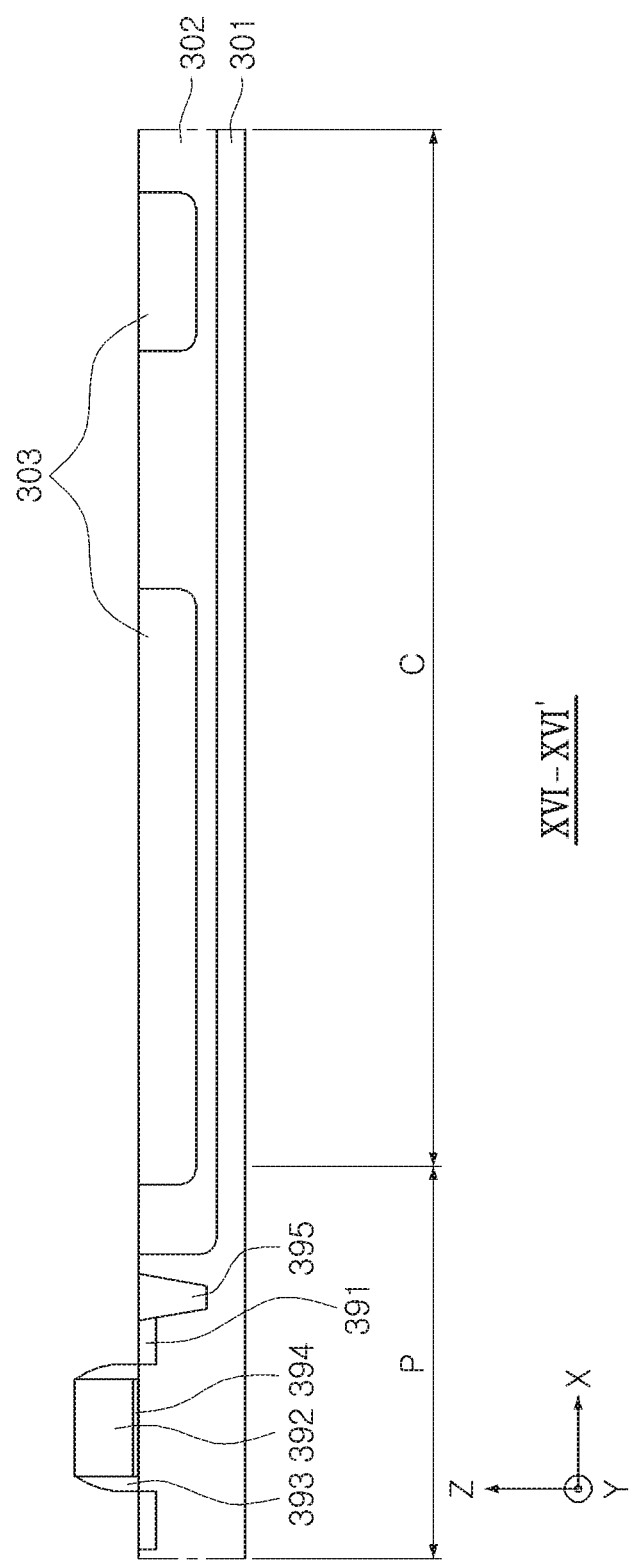

Next, with reference to FIGS. 50 and 51, the mask PR may be formed on the substrate 301. The mask PR may allow the first region 302 to be exposed in a plurality of regions. A portion of the first region 302, exposed by the mask PR, may be a region on which the dummy channel structure DCH is to be formed in a subsequent process. With reference to FIGS. 52 and 53, an impurity may be injected into the portion of the first region 302, exposed by the mask PR to form the second region 303.

The second region 303 may have an impurity characteristic different from the first region 302. For example, when the first region 302 includes a P-type impurity, an N-type impurity may be injected into the portion of the first region 302, exposed by the mask PR to form the second region 303. When a concentration of the N-type impurity to be injected is greater than a concentration of the P-type impurity already included in the first region 302, the second region 303 may include the N-type impurity. On the other hand, when a concentration of the N-type impurity to be injected is less than a concentration of the P-type impurity already included in the first region 302, the second region 303 may include the P-type impurity in a concentration lower than the first region 302. In an example embodiment illustrated in FIGS. 52 and 53, the second region 303 may include a plurality of regions separated from each other.

Figure 54:
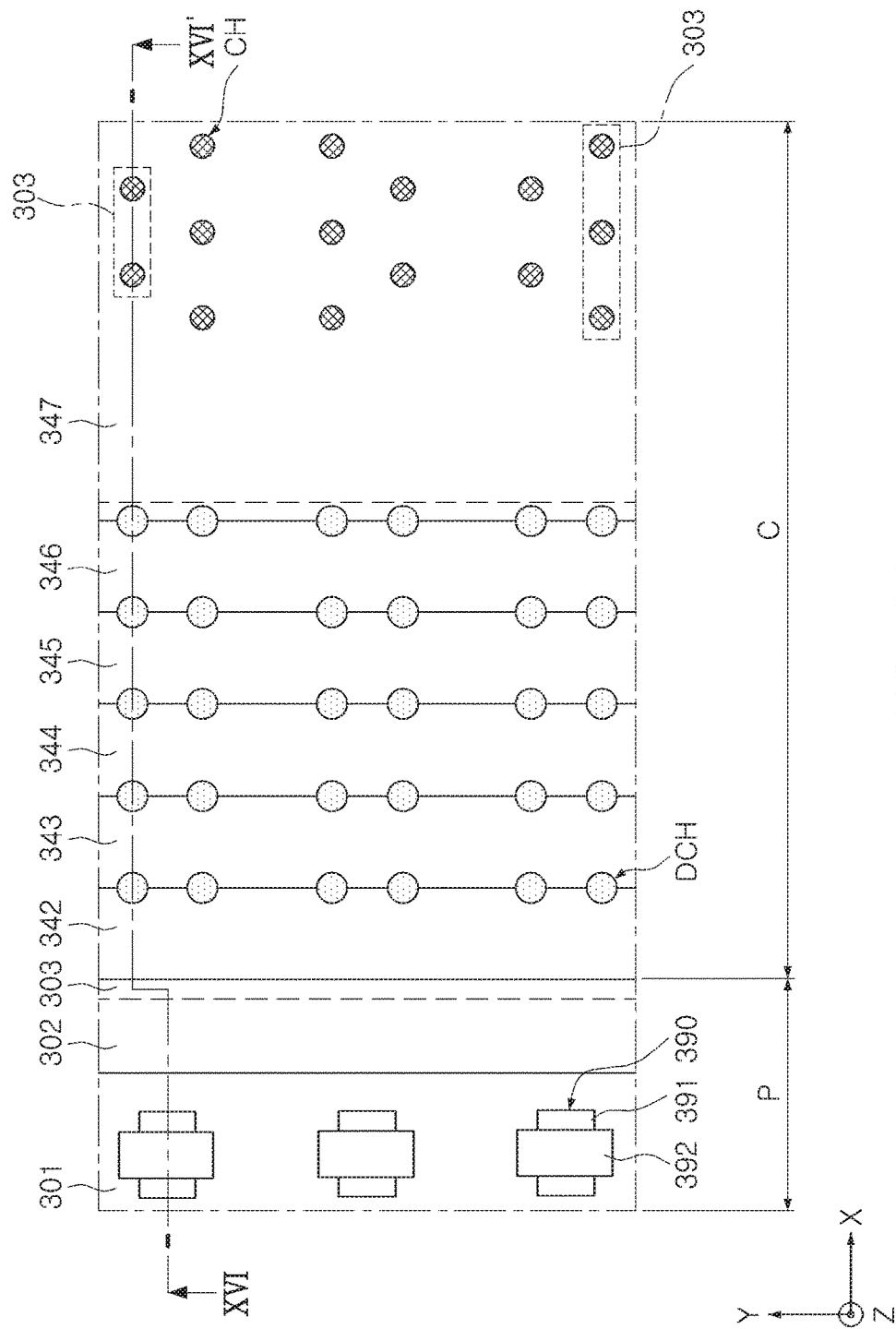
Figure 55:
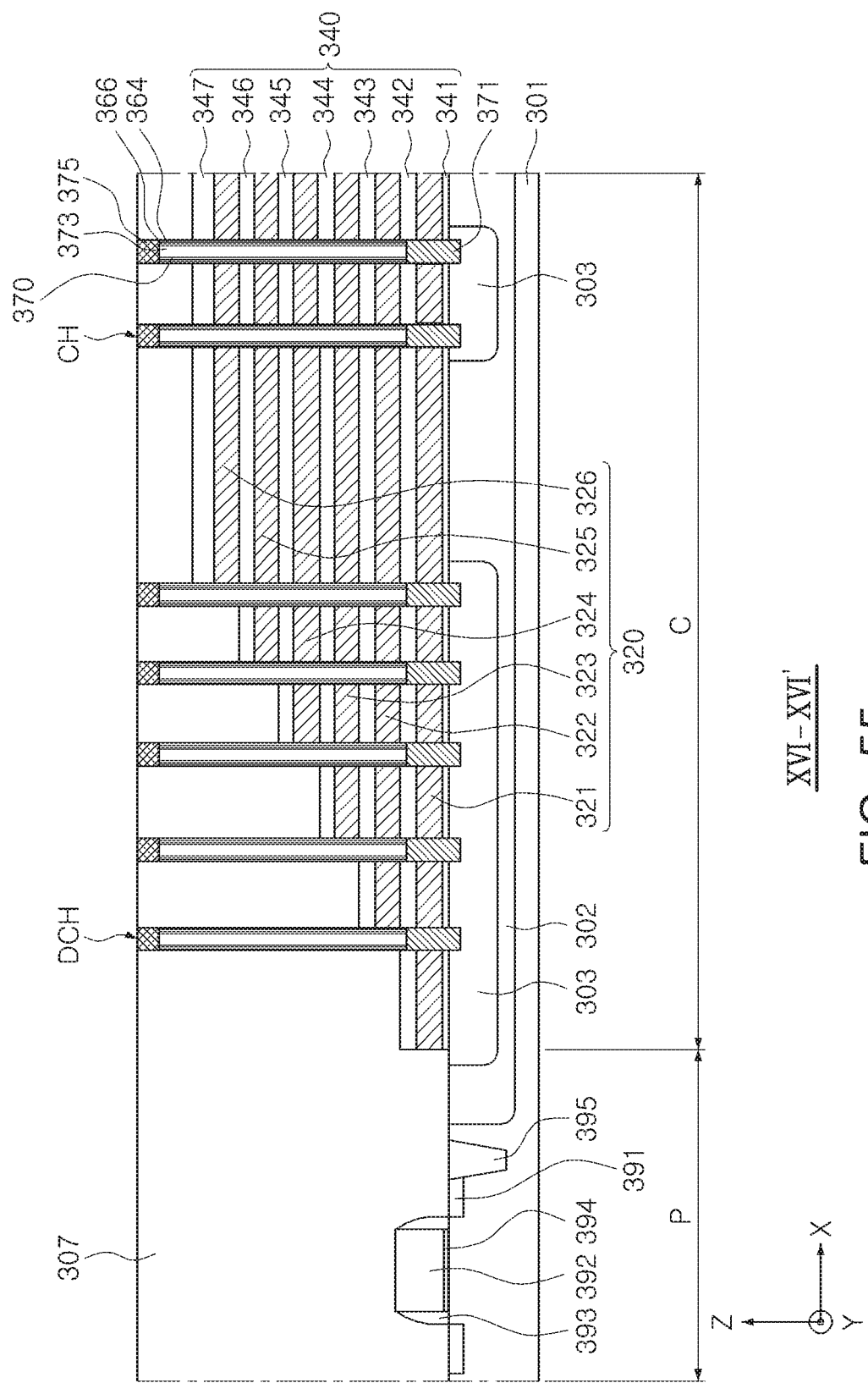

With reference to FIGS. 54 and 55, a plurality of sacrificial layers 320 (sacrificial layers 321 to 326), a plurality of insulating layers 340 (insulating layers 341 to 347), the interlayer insulating layer 307, and the like may be formed on the substrate 301. Meanwhile, the channel structure CH may be disposed to be in contact with the first region 302, and the dummy channel structure DCH may be disposed to be in contact with the second region 303. The channel structure CH and the dummy channel structure DCH may have structures similar to each other.

Figure 56:
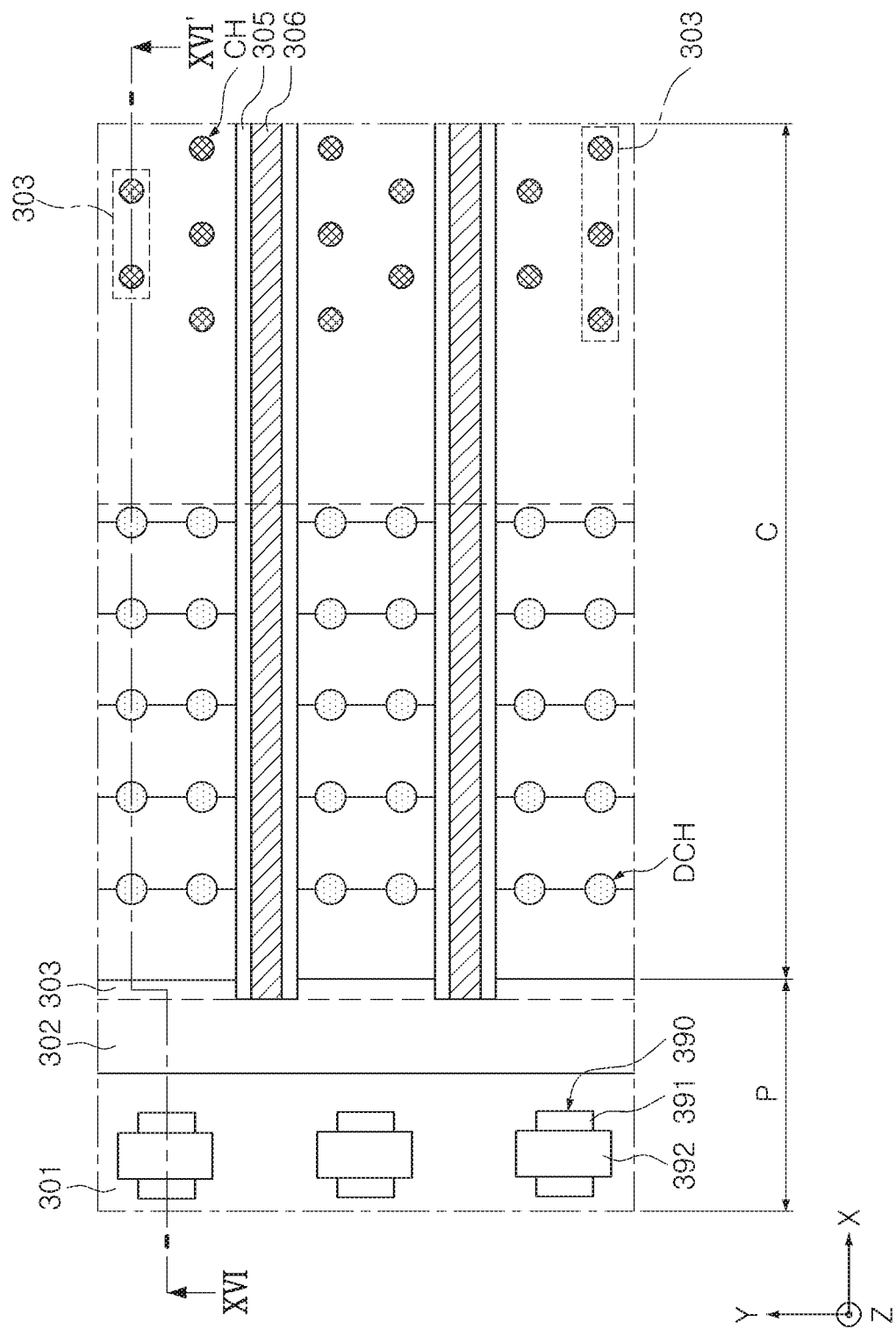
Figure 57:
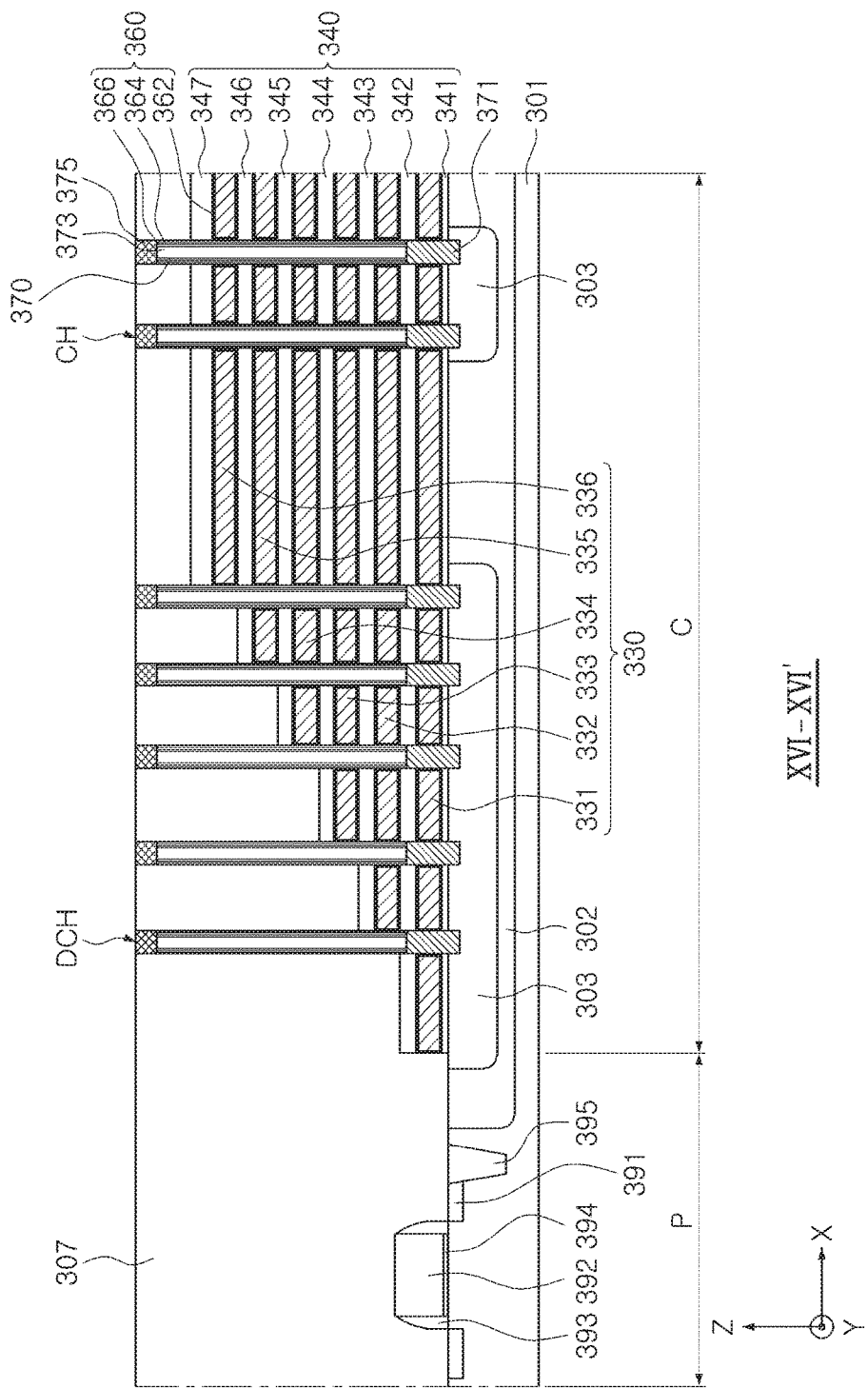

With reference to FIGS. 56 and 57, a plurality of gate electrode layers 330 (gate electrode layers 331 to 336), a blocking layer 362, a separation insulating layer 305, a vertical conductive layer 306, and the like may be formed. The vertical conductive layer 306 may be connected to the common source line CSL formed on the substrate 301 there below. The common source line CSL may be formed by injecting an N-type impurity into the substrate 301. In an example embodiment, the common source line CSL and the second region 303 may include an impurity having a conductivity the same as each other.

Figure 58:
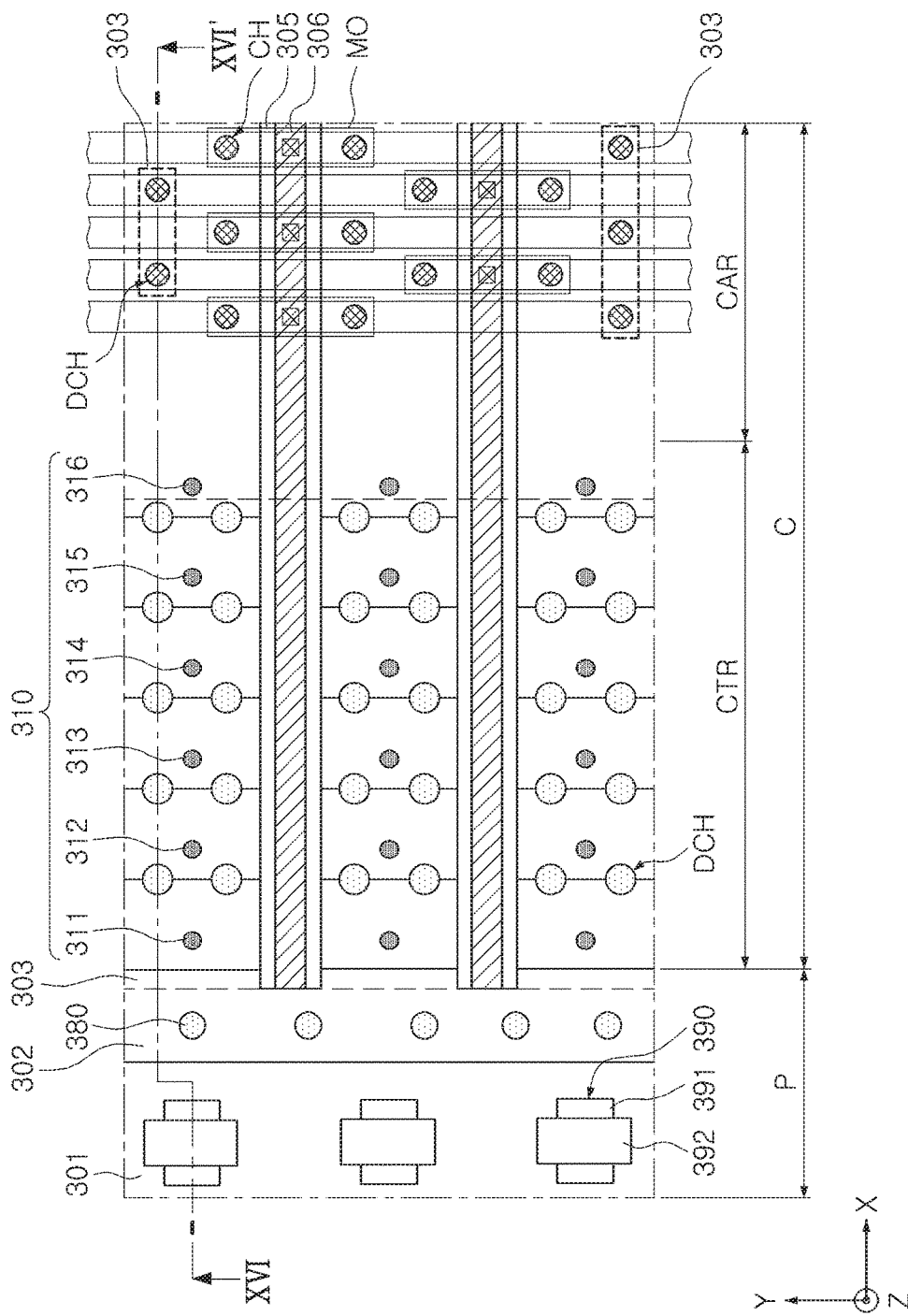
Figure 59:
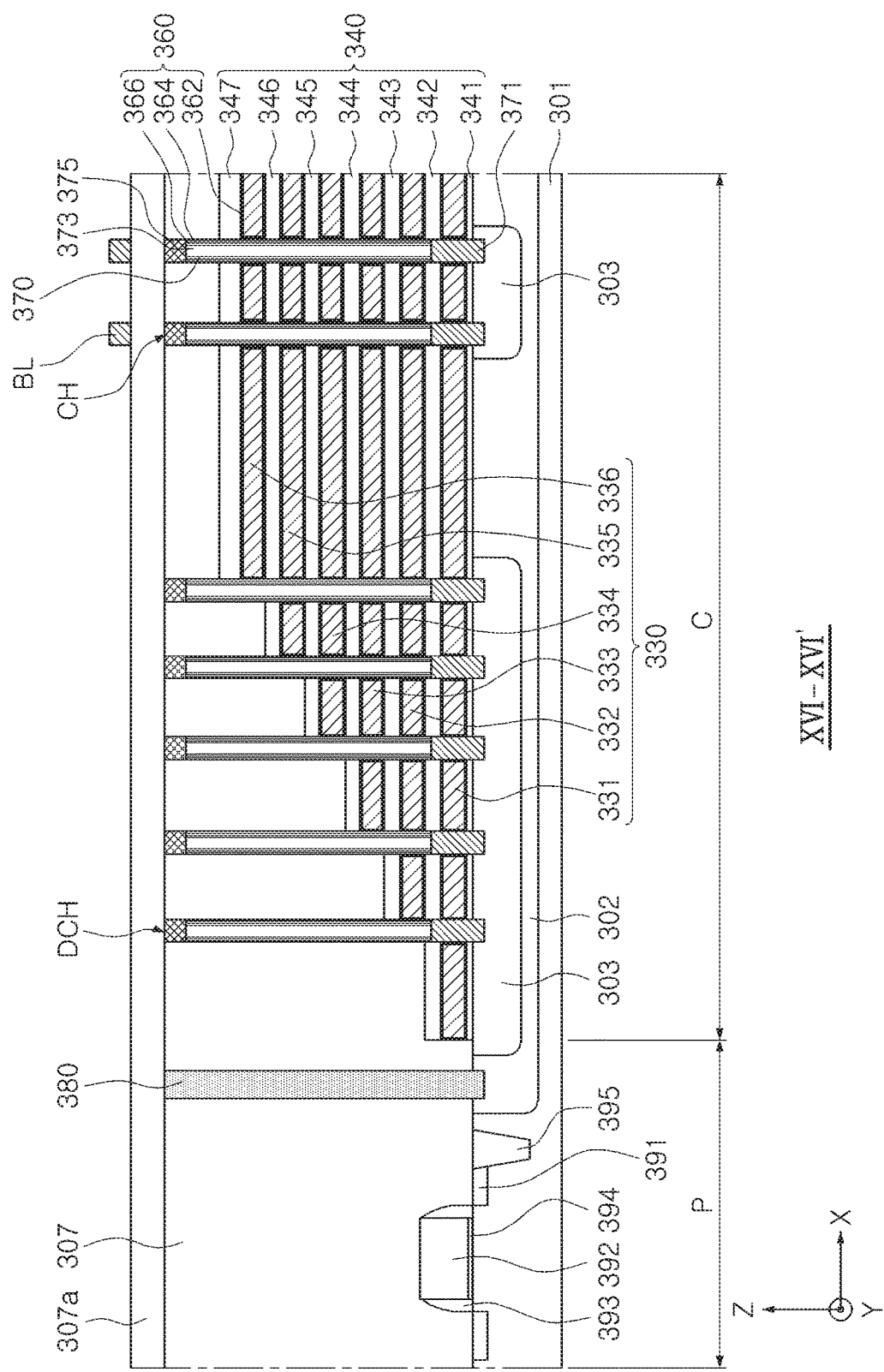

With reference to FIGS. 58 and 59, a plurality of contacts 310 (contacts 311 to 316) and a well contact 380 may be formed. Also, the bit line BL may be formed to be connected to the channel structure CH and to be separated from the dummy channel structure DCH. The bit line BL may be connected to one or more channel structures CH. In an example embodiment, two channel structures CH disposed in positions symmetrical to each other with the separation insulating layer 305 disposed there between may be connected to a single bit line BL. On the other hand, as illustrated in FIG. 59, the bit line BL may be separated from the dummy channel structure DCH by the upper insulating layer 307a.

The above-described embodiments form the stack of alternating gate electrode layers and interlayer insulating layers by a process involving forming and removing sacrificial layers. As an alternative, instead of this process, a stack of conductive layers and interlayer insulating layers may be formed. The conductive layers may be formed of polysilicon and undergo a heat treatment process to silicide the polysilicon layers; and thus form the gate electrode layers. In this alternative, no sacrificial layers are formed and no removal process is performed.

Figure 60:
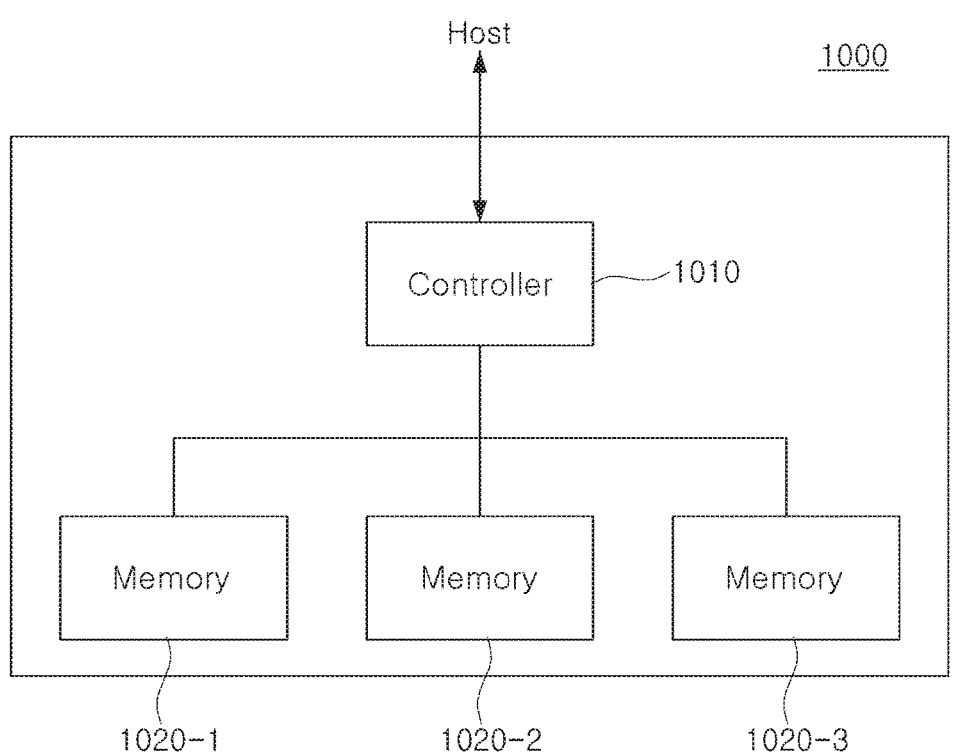
FIG. 60 is a block diagram illustrating an electronic device including a memory device according to an example embodiment of the inventive concepts.

FIG. 60 is a block diagram illustrating an electronic device including a memory device according to an example embodiment.

With reference to FIG. 60, a storage device 1000 according to an example embodiment may include a controller 1010 communicating with a host, and memories 1020-1, 1020-2, and 1020-3, storing data. Each of the memories 1020-1, 1020-2, and 1020-3 may include the memory devices 100, 200, and 300 according to various example embodiments described previously.

The host communicating with the controller 1010 may be provided as various electronic devices in which the storage device 1000 is mounted and for example, a smartphone, a digital camera, a desktop computer, a laptop computer, a media player, or the like. The controller 1010 may store data on the memories 1020-1, 1020-2, and 1020-3, or may generate a command CMD for retrieving data from the memories 1020-1, 1020-2, and 1020-3, by receiving a data writing or reading request transmitted from the host.

As illustrated in FIG. 60, one or more memories 1020-1, 1020-2, and 1020-3 may be connected to the controller 1010 in parallel to each other inside the storage device 1000. As a plurality of memories 1020-1, 1020-2, and 1020-3 are connected to the controller 1010 in parallel, the storage device 1000 having a large capacity such as a solid state drive (SSD) may be implemented.

While example embodiments have been shown and described above, it will be apparent to those skilled in the art that modifications and variations could be made without departing from the scope of the present inventive concept as defined by the appended claims.

What is claimed is:

1. A semiconductor device, comprising:
    a substrate including an impurity well, the impurity well having an impurity region therein, the substrate and the impurity region having a different impurity characteristic;
    a stack of alternating first interlayer insulating layers and gate electrode layers on the substrate;
    at least one second interlayer insulating layer formed on the stack;
    a plurality of bit lines formed on the second interlayer insulating layer;
    a first plurality of channel structures formed through the stack on the substrate, the first plurality of channel structures electrically connected to respective ones of the plurality of bit lines; and
    a second plurality of channel structures formed through the stack on the impurity region, the second plurality of channel structures electrically insulated from the plurality of bit lines.

2. The semiconductor device of claim 1, wherein the substrate is a P-type substrate, and the impurity region is a P-type impurity region with a lower concentration of P-type impurity than the P-type substrate.

3. The semiconductor device of claim 1, wherein the substrate is a P-type substrate, and the impurity region is a N-type impurity region.

4. The semiconductor device of claim 1, wherein the substrate is a P-type substrate, the impurity well is P-type impurity well, and the impurity region is a P-type impurity region with a lower concentration of P-type impurity than the P-type substrate and the P-type well.

5. The semiconductor device of claim 1, wherein the substrate is a P-type substrate, the impurity well is P-type impurity well, and the impurity region is a N-type impurity region.

6. The semiconductor device of claim 1, wherein the first plurality of channel structures penetrates through the stack and into the substrate.

7. The semiconductor device of claim 1, wherein each of the first and second plurality of channel structures includes an epitaxial layer in contact with the substrate.

8. The semiconductor device of claim 7, wherein the impurity region has a different impurity characteristic from the epitaxial layers.

9. The semiconductor device of claim 8, wherein the epitaxial layers are P-type epitaxial layers, and the impurity region is a P-type impurity region with a lower concentration of P-type impurity than the P-type epitaxial layers.

10. The semiconductor device of claim 8, wherein the epitaxial layers are P-type epitaxial layers, and the impurity region is a N-type impurity region.

11. The semiconductor device of claim 8, wherein the epitaxial layers include carbon, and the impurity region does not include carbon.

12. The semiconductor device of claim 1, wherein
    the substrate has a cell array region, a contact region and a peripheral region;
    the impurity region formed in the contact region;
    the peripheral region including at least one peripheral transistor, the peripheral transistor having source and drain regions; and
    a depth of the impurity region is same as a depth of the source and drain regions.

13. A semiconductor device, comprising:
    a substrate including an impurity well, the impurity well having an impurity region therein;
    a stack of alternating first interlayer insulating layers and gate electrode layers on the substrate;
    at least one second interlayer insulating layer formed on the stack;
    a plurality of bit lines formed on the second interlayer insulating layer; and
    a plurality of vertical channel structures penetrating through the stack and into the substrate, the plurality of vertical channel structures each including an epitaxial layer in contact with the substrate, and the impurity region having a different impurity characteristic from the epitaxial layers,
    wherein at least a portion of the plurality of vertical channel structures are electrically insulated from the plurality of bit lines, and includes the epitaxial layer in contact with the impurity region.

14. The semiconductor device of claim 13, wherein the epitaxial layers are P-type epitaxial layers, and the impurity region is a P-type impurity region with a lower concentration of P-type impurity than the P-type epitaxial layers.

15. The semiconductor device of claim 13, wherein the epitaxial layers are P-type epitaxial layers, and the impurity region is a N-type impurity region.

16. A semiconductor device, comprising:
    a substrate having a first region and a second region, the first region surrounding the second region, the first region and the second region being different from each other in terms of at least one of concentration values and conductivity types of impurities;
    a plurality of gate electrode layers stacked on the substrate;

a first plurality of channel structures penetrating through the plurality of gate electrode layers and in contact with the first region; and a second plurality of channel structures penetrating through at least a portion of the plurality of gate electrode layers and in contact with the second region under the plurality of gate electrode layers.

17. The semiconductor device of claim 16, wherein a conductivity type of first impurities in the first region is same with a conductivity type of second impurities in the second region, and a concentration value of the first impurities in the first region is greater than a concentration value of the second impurities in the second region.

18. The semiconductor device of claim 16, wherein a conductivity type of first impurities in the first region is P-type.

19. The semiconductor device of claim 16, wherein a conductivity type of first impurities in the first region is different from a conductivity type of second impurities in the second region.

20. The semiconductor device of claim 16, further comprising:

an impurity well in the substrate, the impurity well including the first region and the second region.

* * * * *